(12) United States Patent
In

(10) Patent No.: US 11,308,857 B2
(45) Date of Patent: Apr. 19, 2022

(54) GATE DRIVER AND DISPLAY DEVICE INCLUDING THE SAME

(71) Applicant: SAMSUNG DISPLAY CO., LTD., Yongin-si (KR)

(72) Inventor: Hai Jung In, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/202,960

(22) Filed: Mar. 16, 2021

(65) Prior Publication Data
US 2022/0028323 A1 Jan. 27, 2022

(30) Foreign Application Priority Data
Jul. 24, 2020 (KR) .................. 10-2020-0092561

(51) Int. Cl.
*G09G 3/3266* (2016.01)
*G09G 3/20* (2006.01)

(52) U.S. Cl.
CPC ... *G09G 3/2092* (2013.01); *G09G 2310/0278* (2013.01); *G09G 2330/028* (2013.01)

(58) Field of Classification Search
CPC ......... G09G 3/2092; G09G 2310/0278; G09G 2330/028
See application file for complete search history.

(56) References Cited

U.S. PATENT DOCUMENTS

| | | | |
|---|---|---|---|
| 10,453,386 B2 | 10/2019 | Jang | |
| 2014/0267214 A1* | 9/2014 | Hwang | G09G 3/2092 345/212 |
| 2018/0144711 A1* | 5/2018 | Noh | G09G 3/3696 |
| 2019/0130866 A1* | 5/2019 | Lee | G11C 19/28 |
| 2019/0206303 A1* | 7/2019 | Hwang | G09G 3/3266 |
| 2021/0118347 A1* | 4/2021 | Wang | G09G 3/3266 |
| 2021/0118374 A1* | 4/2021 | Jeong | G09G 3/3266 |
| 2021/0174731 A1* | 6/2021 | Wang | G09G 3/3266 |
| 2021/0201748 A1* | 7/2021 | Wang | G11C 19/28 |

* cited by examiner

*Primary Examiner* — Jose R Soto Lopez
(74) *Attorney, Agent, or Firm* — Cantor Colburn LLP

(57) ABSTRACT

A gate driver includes first and second stages. Each of the first and second stages includes an output circuit which outputs a scan signal, a carry signal and an inverted carry signal based on voltages of first and second nodes, a first input terminal, a second input terminal, a third input terminal, a first output terminal, and a second output terminal. The first stage further includes a first input circuit which controls the voltages of the first and second nodes thereof based on a start pulse and a signal supplied to the second input terminal. The second stage further includes a second input circuit which controls the voltages of the first and second nodes thereof based on a first carry signal and a first inverted carry signal, and a signal supplied to the second input terminal. The second stage is dependently connected to the first stage.

20 Claims, 34 Drawing Sheets

GATE DRIVER AND DISPLAY DEVICE INCLUDING THE SAME

This application claims priority to Korean Patent Application No. 10-2020-0092561, filed on, Jul. 24, 2020, and all the benefits accruing therefrom under 35 U.S.C. § 119, the content of which in its entirety is herein incorporated by reference.

BACKGROUND

1. Field

The disclosure relates to a display device, and more particularly, to a gate driver and a display device including the gate driver.

2. Description of the Related Art

A display device typically includes a data driver for supplying data signals to data lines, a scan driver for supplying scan signals to scan lines, an emission driver for supplying emission control signals to emission control lines, and pixels connected to the data lines, the scan lines and the emission control lines.

The scan driver and the emission driver may include a stage that generates the scan signal and the emission control signal. The stage may include a plurality of transistors and capacitors, and may generate an output signal in which an input signal is shifted based on a plurality of clock signals.

SUMMARY

In a sage of the scan driver and the emission driver of a display device, when the generation of the output signal is stopped, for example, when the output signal (the gate signal, the scan signal, or the emission control signal) is output at a low level, a capacitor inside the stage may be repeatedly charged/discharged by the clock signal supplied to the stage, and thus current generated by the capacitor may affect a transition time and a waveform of the clock signal.

An embodiment of the disclosure is to provide a gate driver including a first stage outputting an inverted carry signal using a start pulse and a second stage outputting a gate signal based on a carry signal and the inverted carry signal.

Another embodiment of the disclosure is to provide a display device including the gate driver.

In an embodiment of the disclosure, a gate driver includes a first stage and a second stage. In such an embodiment, each of the first stage and the second stage includes an output circuit which outputs a scan signal, a carry signal and an inverted carry signal based on a voltage of a first node and a voltage of a second node, a first input terminal, a second input terminal, a third input terminal, a first output terminal, from which the scan signal and the carry signal are output, and a second output terminal, from which the inverted carry signal is output. In such an embodiment, the first stage further includes a first input circuit which controls the voltage of the first node thereof and the voltage of the second node thereof based on a start pulse and a signal supplied to the second input terminal of the first stage. In such an embodiment, the second stage further includes a second input circuit which controls the voltage of the first node thereof and the voltage of the second node thereof based on a first carry signal and a first inverted carry signal supplied from the output circuit of the first stage, and a signal supplied to the second input terminal of the second stage. In such an embodiment, the second stage is dependently connected to the first stage.

According to an embodiment, the first input circuit may include a first input transistor connected between the first input terminal of the first stage, to which the start pulse is supplied and the first node of the first stage, and including a gate electrode connected to the second input terminal of the first stage, a second input transistor connected between the second input terminal of the first stage and the second node of the first stage, and having a gate electrode connected to the first node of the first stage, and a third input transistor connected between first power and the second node of the first stage, and including a gate electrode connected to the second input terminal of the first stage.

According to an embodiment, the second input circuit may include a first transistor connected between the first input terminal of the second stage to which the first carry signal is supplied and the first node of the second stage, and including a gate electrode connected to the second input terminal of the second stage, and a second transistor connected between an additional input terminal of the second stage to which the first inverted carry signal is supplied and the second node of the second stage, and including a gate electrode connected to the second input terminal of the second stage.

According to an embodiment, each of the first stage and the second stage may include a control circuit which controls a low level voltage of a third node based on a signal supplied to the third input terminal, and a stabilizing circuit electrically connected between the first or second input circuit and the output circuit including the third node and a fourth node, where the stabilizing circuit may limit a voltage drop amount of the first node and a voltage drop amount of the second node.

According to an embodiment, each of the output circuits may include a fourth transistor connected between first power and the first output terminal, and including a gate electrode connected to the third node, a fifth transistor connected between second power and the first output terminal, and including a gate electrode connected to the fourth node, a sixth transistor connected between the fourth node and a fifth node, and including a gate electrode connected to the third input terminal, a seventh transistor connected to the fifth node and the third input terminal, and including a gate electrode connected to a sixth node, an eighth transistor connected between the second power and the fourth node, and including a gate electrode connected to the first node, a first capacitor connected between the fifth node and the sixth node, and a second capacitor connected between the second power and the fourth node.

According to an embodiment, the second output terminal may be connected to the fifth node.

According to an embodiment, the second output terminal may be connected to the fourth node.

According to an embodiment, the stabilizing circuit may include a tenth transistor connected between the first node and the third node, and including a gate electrode which receives a voltage of the first power, and an eleventh transistor connected between the second node and the sixth node, and including a gate electrode which receives the voltage of the first power.

According to an embodiment, the control circuit may include a ninth transistor including a first electrode connected to the third input terminal and a gate electrode connected to the third node, and a third capacitor connected between a second electrode of the ninth transistor and the gate electrode of the ninth transistor.

According to an embodiment, each of the first stage and the second stage may further include an initialization circuit which supplies a voltage of second power to the first node during an initialization period.

According to an embodiment, the initialization circuit may include a twelfth transistor connected between the second power and the first node, and including a gate electrode which receives a reset signal.

According to an embodiment, the initialization circuit of the second stage may include a thirteenth transistor connected between the fourth node and a fourth input terminal to which the reset signal is supplied, and including a gate electrode connected to the fourth input terminal or first power.

According to an embodiment, the initialization circuit of the first stage may include a twelfth transistor connected between the second power and the first node, and including a gate electrode which receives a reset signal.

According to an embodiment, the initialization circuit of the first stage may include a thirteenth transistor connected between the twelfth transistor and the second power, and including a gate electrode connected to the third input terminal.

According to an embodiment, the initialization circuit of the second stage may include a twelfth transistor and a thirteenth transistor connected in series between the second power and the first node, and a fourteenth transistor and a fifteenth transistor connected in series between first power and the fourth node. In such an embodiment, a gate electrode of the twelfth transistor may be connected to one of the second input terminal and the third input terminal, and a gate electrode of the thirteenth transistor may be connected to the other of the second input terminal and the third input terminal. In such an embodiment, a gate electrode of the fourteenth transistor may be connected to one of ones of the second input terminal and the third input terminal, and a gate electrode of the fifteenth transistor may be connected to the other of the second input terminal and the third input terminal.

According to an embodiment, the first stage and the second stage may simultaneously output the scan signal having a high level during the initialization period, the second input terminal of the first stage and the third input terminal of the second stage may receive a first clock signal, and the third input terminal of the first stage and the second input terminal of the second stage may receive a second clock signal.

According to an embodiment, the control circuit may further include a sixteenth transistor connected between second power and the second electrode of the ninth transistor, and including a gate electrode connected to the second node.

According to an embodiment, the control circuit may include a sixteenth transistor and a seventeenth transistor connected in series between the first input terminal and the gate electrode of the ninth transistor, and an eighteenth transistor connected between the gate electrode of the ninth transistor and the third node, and including a gate electrode connected to the gate electrode of the ninth transistor.

According to an embodiment, the control circuit may further include a nineteenth transistor connected between second power and the second electrode of the ninth transistor, and including a gate electrode connected to the second node.

In an embodiment of the disclosure, a display device includes pixels, a gate driver including a first stage and a second stage, and a data driver which supplies a data signal to the pixels through data lines. In such an embodiment, each of the first stage and the second stage includes an output circuit which outputs a scan signal, a carry signal and an inverted carry signal based on a voltage of a first node and a voltage of a second node, a first input terminal, a second input terminal, a third input terminal, a first output terminal, from which the scan signal and the carry signal are output, and a second output terminal, from which the inverted carry signal is output. In such an embodiment, the first stage further includes a first input circuit which controls the voltage of the first node thereof and the voltage of the second node thereof based on a start pulse and a signal supplied to the second input terminal of the first stage. In such an embodiment, the second stage further includes a second input circuit which controls the voltage of the first node thereof and the voltage of the second node thereof based on a first carry signal and a first inverted carry signal supplied from the output circuit of the first stage, and a signal supplied to the second input terminal of the second stage. In such an embodiment, the second stage may be dependently connected to the first stage.

Embodiments of the gate driver and the display device including the gate deriver may include the first stage that outputs the carry signal and the inverted carry signal based on the start pulse, and the second stage that outputs the scan signal (and/or an emission control signal) based on the carry signal and the inverted carry signal. In such embodiments, the remaining stages dependently connected from the second stage and sequentially outputting the scan signal (and/or the emission control signal) may have the same structure as the second stage.

Therefore, in such embodiments, when outputting a low level of a corresponding output signal (the carry signal and the scan signal) of each of second to n-th (where n is an integer greater than 2) stages, a voltage of the second node may be stably maintained at a high level.

Therefore, undesired charge/discharge operations of the first capacitor may be effectively prevented during a period in which the output signal is output at a low level, and thus power consumption for cancelling the charge/discharge operations may be reduced. In such embodiments, a change of an equivalent impedance due to the charge/discharge of the capacitor may be prevented or minimized. Therefore, rising/falling speeds of the first clock signal, the second clock signal, and the output signal may be improved, and a voltage ripple may be reduced.

Accordingly, in such embodiments, the gate driver (a scan driver and/or an emission driver) may be stably applied to high speed driving, and image quality of the display device may be improved.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
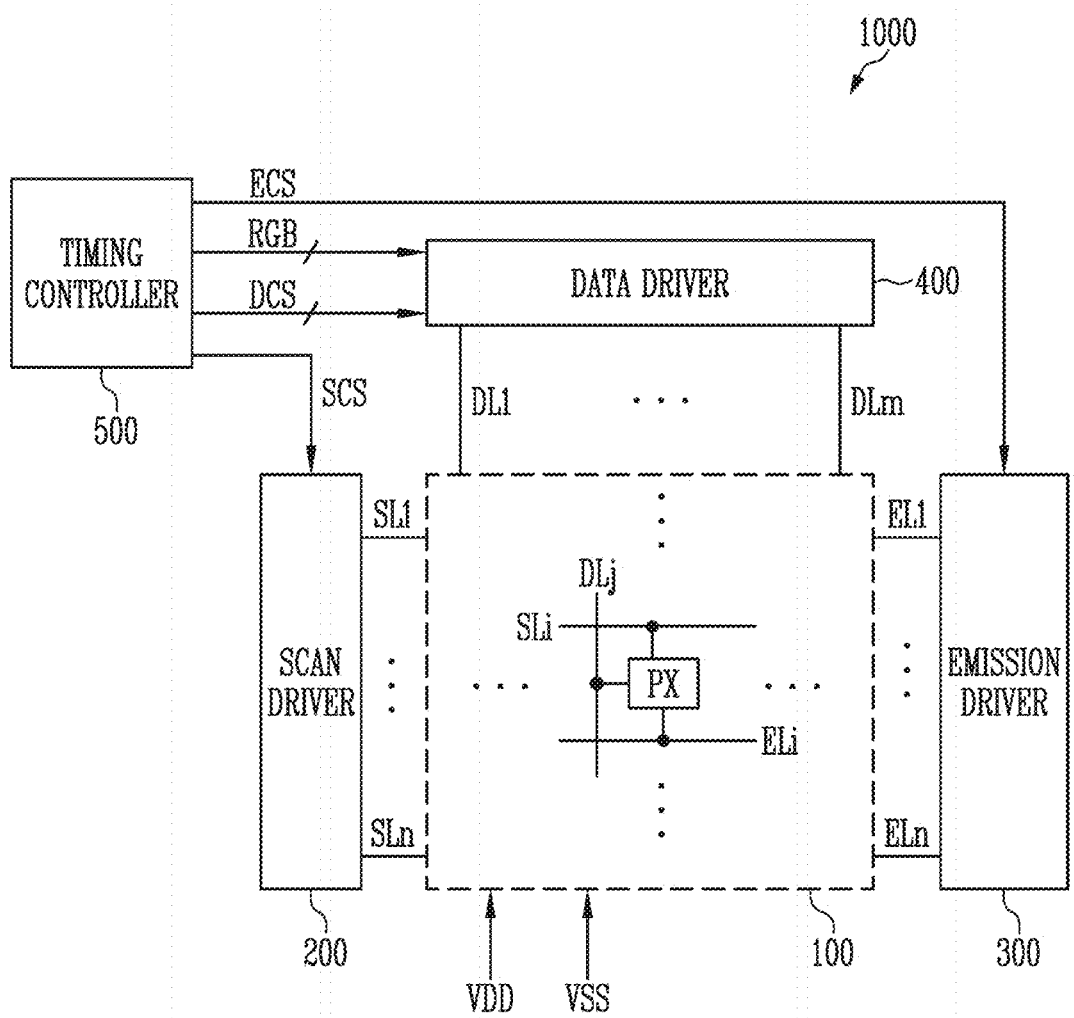
FIG. 1 is a block diagram illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the disclosure will be described in detail with reference to the accompanying drawings. The same reference numerals are used to indicate the same components in the drawings, and any repetitive description of the same components will be omitted or simplified.

FIG. 1 is a block diagram illustrating a display device according to an embodiment.

Referring to FIG. 1, an embodiment of the display device 1000 may include a pixel unit 100, a scan driver 200 (or a first gate driver), an emission driver 300 (or a second gate driver), a data driver 400, and a timing controller 500.

In an embodiment, the scan driver 200 and the emission driver 300 may be defined by portions of a single gate driver. Hereinafter, for convenience of description, embodiments where the scan driver 200 and the emission driver 300 collectively define (or are collectively referred to as) a gate driver will be described in detail.

The display device 1000 may display an image at various driving frequencies (image refresh rates, or screen refresh rates) according to a driving condition. The driving frequency is a frequency at which a data signal is substantially written to a driving transistor of a pixel PX. The driving frequency is also referred to as a screen scan rate or a screen refresh frequency, for example, and represents a frequency at which a display screen is refreshed for one second. The display device 1000 may display an image in correspondence with various driving frequencies.

The pixel unit 100 displays an image. The pixel unit 100 may include pixels PX connected to data lines DL1 to DLm, scan lines SLU to SLn, and emission control lines ELI to ELn. The pixels PX may receive voltages of first driving power VDD, second driving power VSS, and initialization power from the outside.

In such an embodiment, the pixels PX may be connected to at least one scan line SLi, at least one data line DLj, and at least one emission control line EU in correspondence with a pixel circuit structure. The pixel PX may include a driving transistor, a plurality of switching transistors implemented by at least one of an n-type transistor and a p-type transistor, and a light emitting element.

The timing controller 500 may receive an input control signal and an input image signal from an image source such as an external graphic device. The timing controller 500 generates image data RGB suitable for an operation condition of the pixel unit 100 based on the input image signal and provides the image data RGB to the data driver 400. The timing controller 500 may generate a first control signal SCS for controlling a driving timing of the scan driver 200, a second control signal ECS for controlling a driving timing of the emission driver 300, and a third control signal DCS for controlling a driving timing of the data driver 400, based on the input control signal, and may provide the first control signal SCS, the second control signal ECS, and the third control signal DCS to the scan driver 200, the emission driver 300, and the data driver 400, respectively.

The scan driver 200 may receive the first control signal SCS from the timing controller 500. The scan driver 200 may supply a scan signal to the scan lines SL1 to SLn in response to the first control signal SCS. The first control signal SCS may include a start pulse and a plurality of clock signals for the scan signal.

The emission driver 300 may receive the second control signal ECS from the timing controller 500. The emission driver 300 may supply an emission control signal to the emission control lines ELI to ELn in response to the second control signal ECS. The second control signal ECS may include a start pulse and a plurality of clock signals for the emission control signal.

The data driver 400 may receive the third control signal DCS from the timing controller 500. The data driver 400 may convert the image data RGB into an analog data signal (data voltage) in response to the third control signal DCS and supply the data signal to the data lines DL1 to DLm.

In an embodiment, as shown in FIG. 1, each of the scan driver 200 and the emission driver 300 may be a single configuration, but the disclosure is not limited thereto. Alternatively, the scan driver 200 may include a plurality of scan drivers respectively supplying at least one of scan signals of different waveforms. In an embodiment, at least a portion of the scan driver 200 and the emission driver 300 may be integrated into one driving circuit, module, or the like.

In an embodiment, the display device 1000 may further include a power supply. The power supply may supply the voltage of the first driving power VDD and the voltage of the second driving power VSS for driving the pixel PX to the pixel unit 100.

Figure 2A:
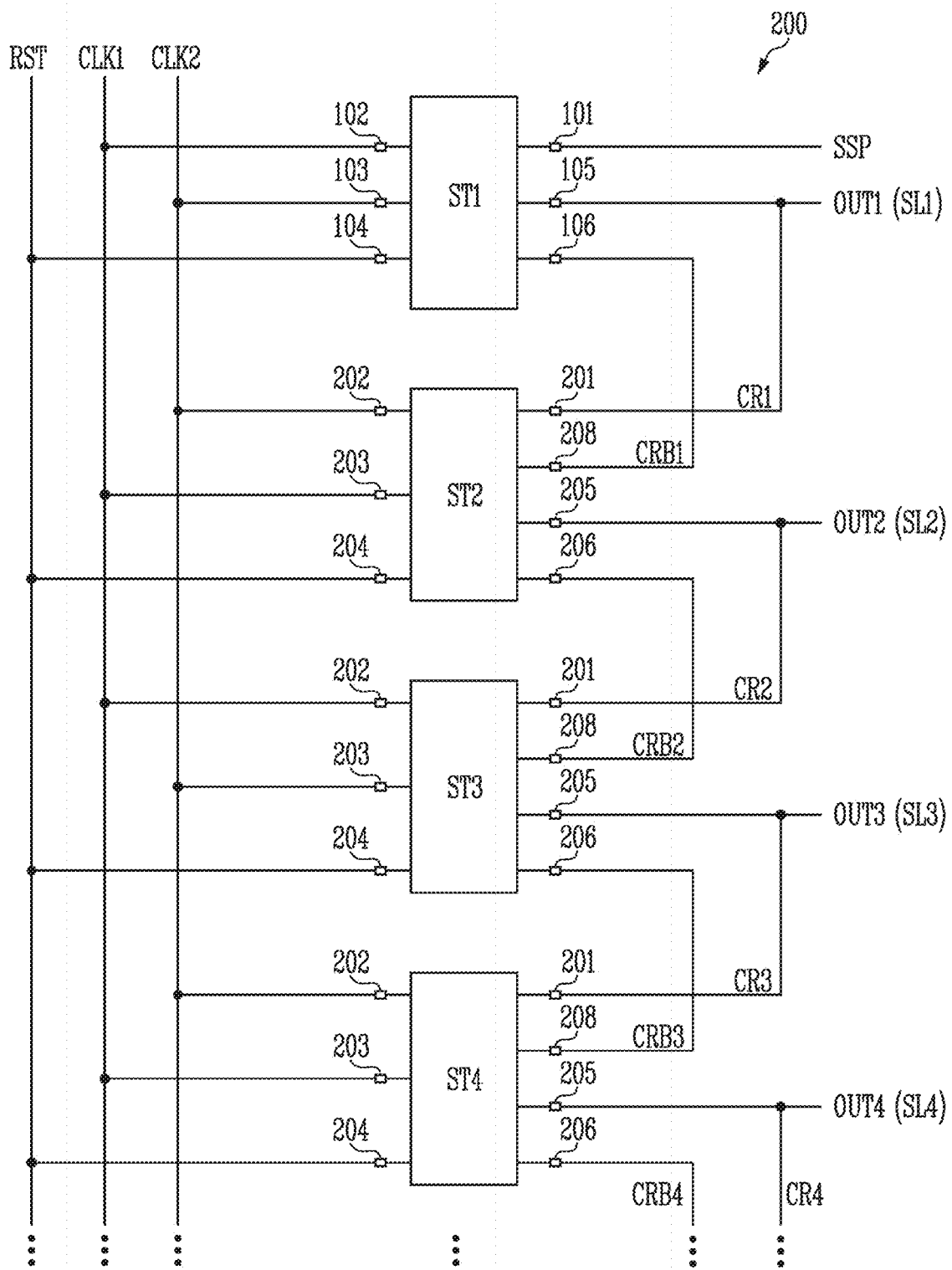
FIG. 2A is a block diagram illustrating a scan driver (gate driver) according to an embodiment of the disclosure.

FIG. 2A is a block diagram illustrating the scan driver (gate driver) according to an embodiment of the disclosure.

In FIG. 2A, for convenience of illustration and description, four stages and scan signals output therefrom are shown.

In FIG. 2A, the scan driver 200 of the gate driver is shown, but the emission driver 300 of the gate driver may have substantially the same structure as that of the scan driver 200 shown in FIG. 2A.

Referring to FIG. 2A, an embodiment of the scan driver 200 may include a plurality of stages ST1 to ST4. The stages ST1 to ST4 may be connected to corresponding scan lines SL1 to SL4, respectively, and may output the scan signal based on clock signals CLK1 and CLK2.

The first stage ST1 and the second stage ST2 may have different circuit configurations from each other. The second stage ST2 may be dependently connected to the first stage ST1. The third stage ST3 may be dependently connected to the second stage ST2, and the fourth stage ST4 may be dependently connected to the third stage ST3. In such an embodiment, the first to fourth stages ST1 to ST4 may be cascadedly connected to each other. The second to fourth stages ST2 to ST4 may have substantially a same configuration as each other.

In an embodiment, the structure of the scan driver 200 may also be applied to the emission driver 300 described with reference to FIG. 1. In such an embodiment, the scan lines SL1 to SL4 may be replaced with the emission control lines.

Each of the stages ST1 to ST4 may include first input terminals 101 and 201, second input terminals 102 and 202, third input terminals 103 and 203, fourth input terminals 104 and 204, first output terminals 105 and 205, and second output terminals 106 and 206. In an embodiment, the second to fourth stages ST2 to ST4 may further include a fifth input terminal 208 (or an additional input terminal).

The first input terminal 101 of the first stage ST1 may receive a start pulse SSP. The first input terminal 201 of the second to fourth stages ST2 to ST4 may receive carry signals CR1 to CR3 of a previous stage.

The second input terminal 102 of the first stage ST1 may receive the first clock signal CLK1, and the third input terminal 103 may receive the second clock signal CLK2.

In an embodiment, the second input terminal 202 of a 2k-th stage (where k is an integer greater than 1) may receive the second clock signal CLK2, and the third input terminal 203 may receive the first clock signal (CLK1). In such an embodiment, the second input terminal 202 of a (2k+1)-th stage may receive the first clock signal CLK1, and the third input terminal 203 of the (2k+1)-th stage may receive the second clock signal CLK2.

During normal driving in which an image is displayed, the first clock signal CLK1 and the second clock signal CLK2 have a same period and phases that do not overlap with each other. In one embodiment, for example, the second clock signal CLK2 may be set as a signal shifted by about half period from the first clock signal CLK1.

The fourth input terminal 104 may receive a reset signal RST. The reset signal RST may be a global or common signal and may be commonly supplied to all stages ST1 to ST4.

Output signals OUT1 to OUT4 and carry signals CR1 to CR4 may be output to the first output terminals 105 and 205. The output signals OUT1 to OUT4 and the carry signals CR1 to CR4 may be substantially the same as each other, respectively. In an embodiment, the output signals OUT1 to OUT4 may be provided to the first to fourth scan lines SLU to SL4 as the scan signals.

In an embodiment, the first carry signal CR1 generated in the first stage ST1 may be supplied to the first input terminal 201 of the second stage ST2. In such an embodiment, the second carry signal CR2 generated in the second stage ST2 may be supplied to the first input terminal 201 of the third stage ST3.

Inverted carry signals CRB1 to CRB4 may be output to the second output terminals 106 and 206. The inverted carry signals CRB1 to CRB4 may have waveforms different from those of the carry signals CR1 to CR2, respectively. In an embodiment, the first inverted carry signal CRB1 may be supplied to the fifth input terminal 208 of the second stage ST2. In such an embodiment, the second inverted carry signal CRB2 may be supplied to the fifth input terminal 208 of the third stage ST3.

Figure 3:
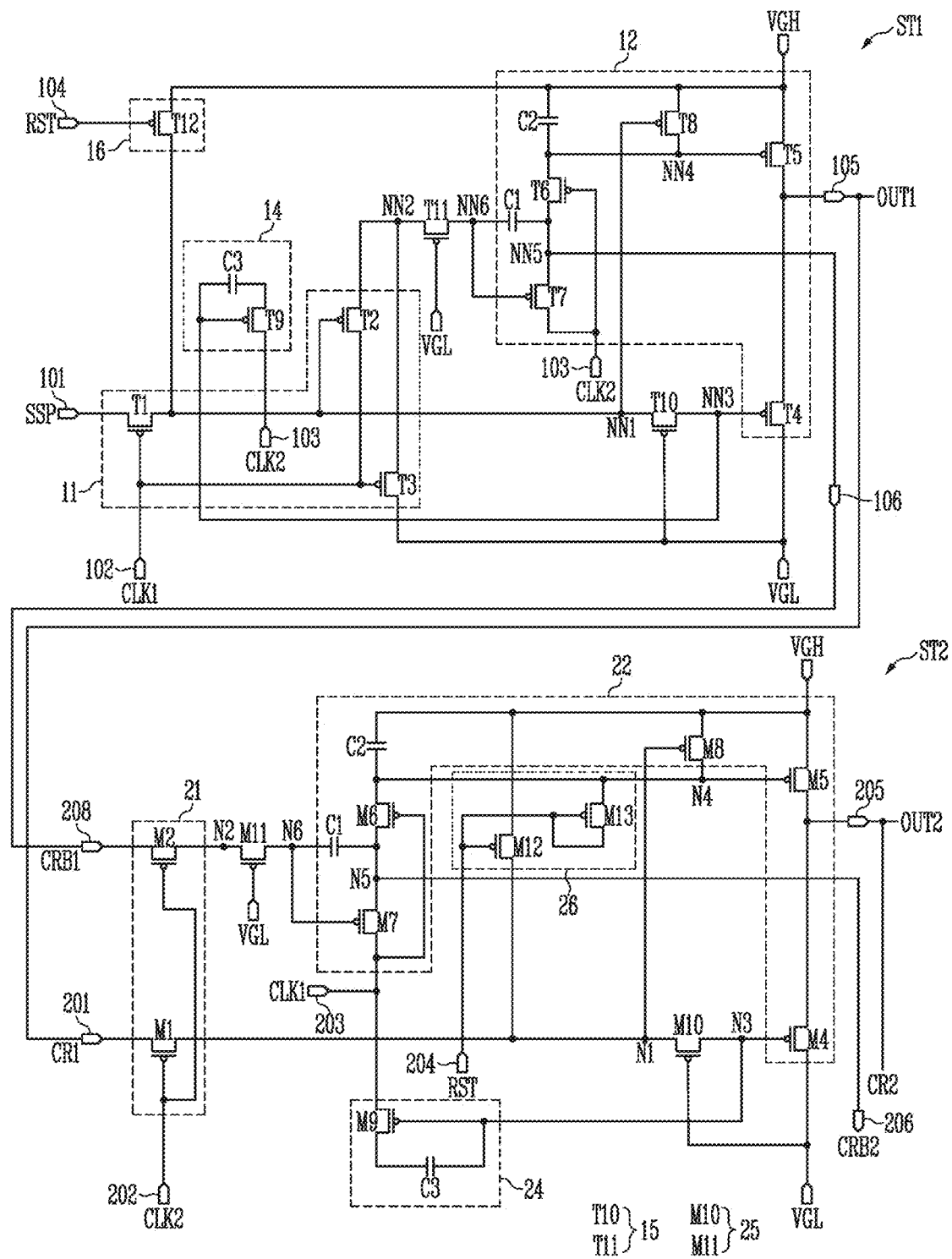
FIG. 3 is a circuit diagram illustrating an embodiment of a first stage and a second stage included in the scan driver of FIG. 2A.

In an embodiment, the stages ST1 to ST4 receive the voltage of the first power (VGL of FIG. 3) and the voltage of the second power (VGH of FIG. 3). The voltage of the first power and the voltage of the second power may have a direct current ("DC") voltage level. The voltage of the second power may be set to be greater than the voltage of the first power.

In such an embodiment, the first stage ST1 may be an initial stage that receives the start pulse SSP, and the second stage ST2 may be any one of stages other than the first stage ST1.

Figure 2B:
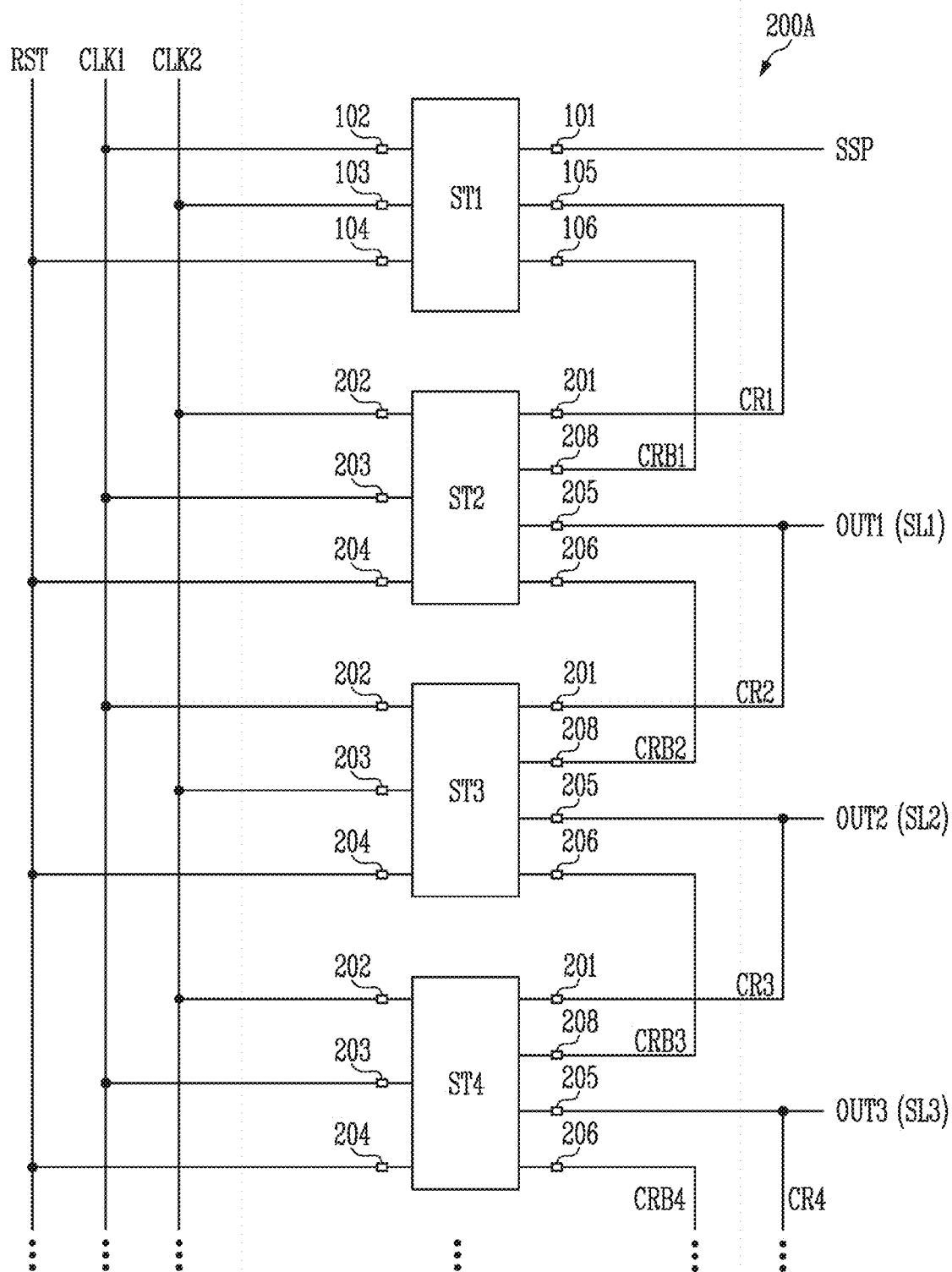
FIG. 2B is a block diagram illustrating an embodiment of the scan driver of FIG. 2A.

FIG. 2B is a block diagram illustrating an embodiment of the scan driver of FIG. 2A.

In FIG. 2B, the same reference numerals are used for the same components as those described with reference to FIG. 2A, and any repetitive detailed description of such components will be omitted. In an embodiment, the scan driver 200A of FIG. 2B may have a configuration substantially the same as or similar to that of the scan driver 200 of FIG. 2A except for a configuration in which the first stage ST1 is not connected to the scan line.

Referring to FIG. 2B, the scan driver 200A may include the plurality of stages ST1 to ST4.

The first stage ST1 and the second stage ST2 may have different circuit configurations from each other. The second to fourth stages ST2 to ST4 may have substantially the same circuit configuration as each other.

The first output terminal 105 of the first stage ST1 may be electrically connected to the first input terminal 201 of the second stage ST2. The first stage ST1 may not output a gate signal (for example, the scan signal), and the second stage ST2 may be connected to the first scan line SL1 and may output a first scan signal (or the output signal OUT1). In such an embodiment, the first stage ST1 may only perform a function of generating the first carry signal CR1 and the first inverted carry signal CRB1 supplied to the second stage ST2 based on the start pulse SSP.

In such an embodiment, the scan signals may be output from stages having the same structure, and waveforms of the scan signals supplied to the scan lines may be uniform.

FIG. 3 is a circuit diagram illustrating an embodiment of the first stage and the second stage included in the scan driver of FIG. 2A.

Referring to FIGS. 2A and 3, an embodiment of the first stage ST1 and the second stage ST2 may include input circuits 11 and 21, output circuits 12 and 22, control circuits 14 and 24, stabilizing circuits 15 and 25, and initialization circuits 16 and 26, respectively.

In such an embodiment, a k-th stage (where k is an integer greater than 2) may have a same configuration as the second stage ST2, and any repetitive detailed description thereof will be omitted.

The first clock signal CLK1 may be supplied to the second input terminal 102 of the first stage ST1, and the second clock signal CLK2 may be supplied to the second input terminal 202 of the second stage ST2.

First, the first stage ST1 will be described in detail. The first stage ST1 may include the first input circuit 11, the first output circuit 12, the first control circuit 14, the first stabilizing circuit 15, and the first initialization circuit 16.

The first input circuit 11 may control a voltage of a first node NN1 and a voltage of a second node NN2 based on the start pulse SSP supplied to the first input terminal 101 and the first clock signal CLK1 supplied to the second input terminal 102. The first input circuit 11 may include a first transistor T1 (or a first input transistor), a second transistor T2 (or a second input transistor), and a third transistor T3 (or a third input transistor.

The first transistor T1 may be connected between the first input terminal 101 and the first node NN1. The first transistor T1 may include a gate electrode connected to the second input terminal 102. The first transistor T1 may be turned on when the first clock signal CLK has a gate-on level (for example, a low level) to electrically connect the first input terminal 101 and the first node NN1 to each other.

The second transistor T2 may be connected between the second input terminal 102 and the second node NN2. The second transistor T2 may include a gate electrode connected to the first node NN1. The second transistor T2 may be turned on or turned off based on the voltage of the first node NN1.

In an embodiment, the second transistor T2 may include a plurality of sub transistors connected in series with each other. Each of the sub transistors may include a gate electrode commonly connected to the first node NN1 (for example, a transistor having the sub transistors will be referred to as a transistor having a dual gate structure). Accordingly, in such an embodiment, a current leakage due to the second transistor T2 may be minimized. However, this is merely exemplary, and at least one of the remaining transistors as well as the second transistor T2 may have the dual gate structure.

The third transistor T3 may be connected between the first power VGL and the second node NN2. A gate electrode of the third transistor T3 may be connected to the second input terminal 102. The third transistor T3 may be turned on when the first clock signal CLK1 is supplied to the second input terminal 102 to supply the voltage of the first power VGL to the second node NN2.

The first output circuit 12 may output the first output signal OUT1, the first carry signal CR1, and the first inverted carry signal CRB1 based on the voltage of the first node NN1 and the voltage of the second node NN2. The voltage of the first power VGL may correspond to a low level of the output signals OUT1 and OUT2, and the voltage of the second power VGH may correspond to a high level of the output signals OUT1 and OUT2. The output signals OUT1 and OUT2 may be output as the emission control signal or the scan signal in the display device (for example, 1000 of FIG. 1).

In an embodiment, the first output circuit 12 may include a fourth transistor T4, a fifth transistor T5, a sixth transistor T6, a seventh transistor T7, and an eighth transistor T8. The first output circuit 12 may further include a first capacitor C1 and a second capacitor C2.

The fourth transistor T4 may be connected between the first power VGL and the first output terminal 105. A gate electrode of the fourth transistor T4 may be connected to a third node NN3. The fourth transistor T4 may be turned on or turned off in response to a voltage of the third node NN3 electrically connected to the first node NN1. When the fourth transistor T4 is turned on, the first output signal OUT1 and the first carry signal CR1 supplied to the first output terminal 105 may have a low level (for example, a gate-off voltage of an n-type transistor).

The fifth transistor T5 may be connected between the second power VGH and the first output terminal 105. A gate electrode of the fifth transistor T5 may be connected to a fourth node NN4. The fifth transistor T5 may be turned on or turned off in response to a voltage of the fourth node NN4 electrically connected to a sixth node NN6. Here, when the fifth transistor T5 is turned on, the first output signal OUT1 supplied to the first output terminal 105 may have a high level (for example, a gate-on voltage of an n-type transistor).

The first capacitor C1 may be connected between a fifth node NN5 and the sixth node NN6.

The sixth transistor T6 may be connected between the fifth node NN5 and the fourth node NN4. A gate electrode of the sixth transistor T6 may be connected to the third input terminal 103. The sixth transistor T6 may be turned on in response to a gate-on level (for example, a low level) of the second clock signal CLK2 supplied to the third input terminal 103.

The seventh transistor T7 may be connected between the fifth node NN5 and the third input terminal 103. A gate electrode of the seventh transistor T7 may be connected to the sixth node NN6. The seventh transistor T7 may be turned on or turned off in response to a voltage of the sixth node NN6.

The eighth transistor T8 may be connected between the second power VGH and the fourth node NN4. A gate electrode of the eighth transistor T8 may be connected to the first node NN1. The eighth transistor T8 may be turned on or turned off in response to the voltage of the first node NN1.

The second capacitor C2 may be connected between the second power VGH and the fourth node NN4. The second capacitor C2 may charge a voltage applied to the fourth node NN4 and stably maintain the voltage of the fourth node NN4.

The sixth to eighth transistors T6 to T8, the first capacitor C1, and the second capacitor C2 may control the voltage of the fourth node NN4. The eighth transistor T8 may supply the voltage of the second power VGH to the fourth node NN4 based on the voltage of the first node NN1. The sixth and seventh transistors T6 and T7 may transfer a voltage supplied to the second node NN2 through the fifth node NN5 based on the second clock signal CLK2 supplied to the third input terminal 103, to the fourth node NN4.

When the voltage of the second node NN2 has a high level, for example, the voltage of the fourth node NN4 may stably have a gate-off level (or a high level), and thus the fifth transistor T5 may be completely turned off.

In an embodiment, the second output terminal 106 may be connected to the fifth node NN5. Therefore, a voltage of the fifth node NN5 may be supplied to the second stage ST2 as the first inverted carry signal CRB1.

The first control circuit 14 may control the voltage of the low level of the third node NN3 based on a signal supplied to the third input terminal 103. In an embodiment, the first control circuit 14 may include a ninth transistor T9 and a third capacitor C3.

The ninth transistor T9 may include a first electrode connected to the third input terminal 103 and a gate electrode connected to the third node NN3.

The third capacitor C3 may be connected between a second electrode of the ninth transistor T9 and the gate electrode of the ninth transistor T9.

When the voltage of the third node NN3 has a low level (that is, when the first output signal OUT1 has a low level), the first control circuit 14 may periodically decrease the voltage of the third node NN3 by using coupling of the third capacitor C3 according to a change of the second clock signal CLK2.

The first stabilizing circuit 15 may be electrically connected between the first input circuit 11 and the first output circuit 12. The first stabilizing circuit 15 may limit a voltage drop amount of the first node NN1 and a voltage drop amount of the second node NN2.

Figure 4:
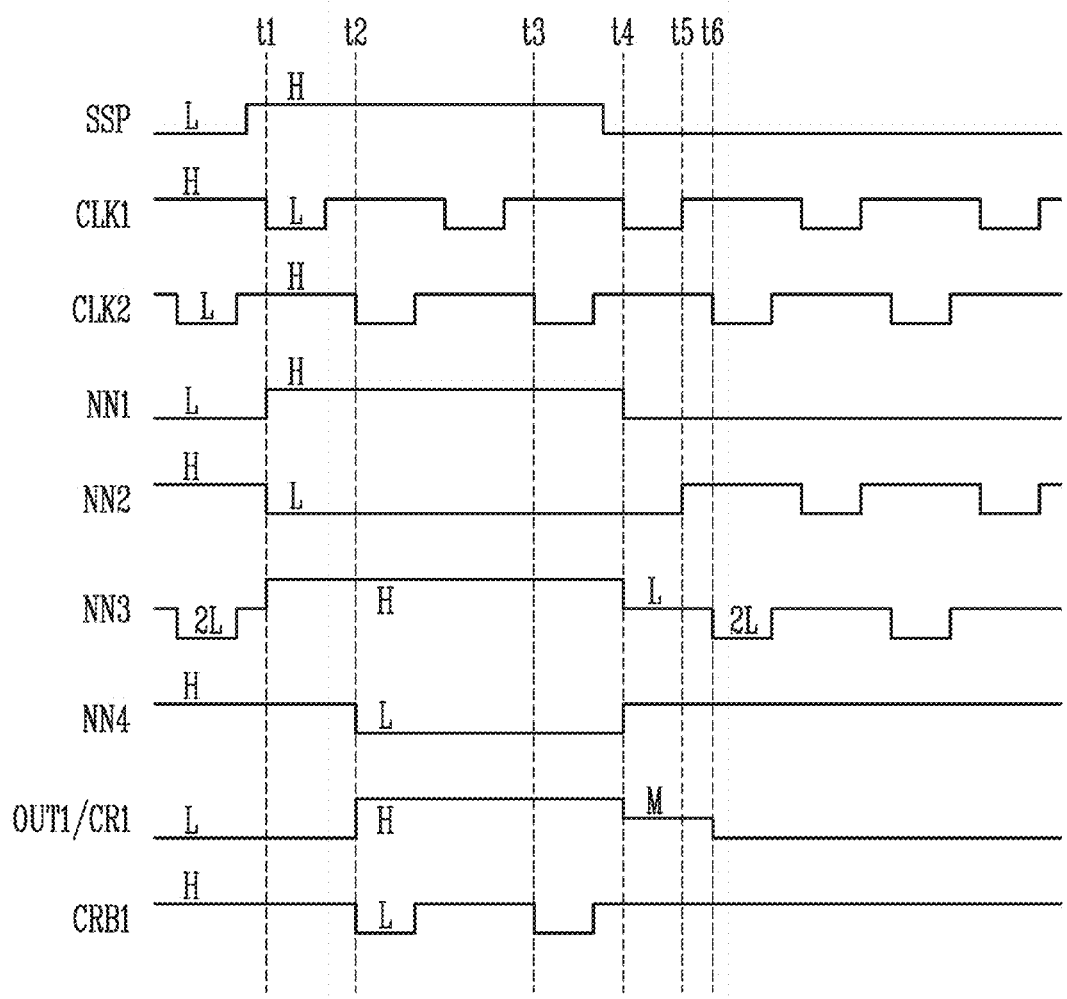
FIG. 4 is a signal timing diagram illustrating an embodiment of signals for driving the first stage of FIG. 3.

In an embodiment, the first stabilizing circuit 15 may serve as a resistor when the voltage drop amount of the third node NN3 is large (see 2L of FIG. 4). Therefore, even though a voltage change of the third node NN3 is large, a magnitude of a drain-source voltage of the first transistor T1 may be effectively prevented from suddenly increasing, and the first transistor T1 connected to the first node NN1 may be protected.

In an embodiment, the first stabilizing circuit 15 may serve as a resistor when the voltage of the sixth node NN6 is largely dropped due to coupling of the first capacitor C1. Accordingly, the second transistor T2 and the third transistor T3 connected to the second node NN2 may be protected.

In an embodiment, the first stabilizing circuit 15 may include a tenth transistor T10 and an eleventh transistor T11.

The tenth transistor T10 may be connected between the first node NN1 and the third node NN3. A gate electrode of the tenth transistor T10 may be connected to the first power VGL. Therefore, the tenth transistor T10 may be in a turn-on state. Thus, since the voltage of the first node NN1 is not lower than the voltage of the first power VGL, a bias stress that may be applied to the first transistor T1 may be alleviated. In one embodiment, for example, the voltage of the first node NN1 may be equal to or greater than an addition of an absolute value of the voltage of the first power VGL and a threshold voltage of the tenth transistor T10.

The eleventh transistor T11 may be connected between the second node NN2 and the sixth node NN6. A gate electrode of the eleventh transistor T11 may be connected to the first power VGL. Accordingly, the eleventh transistor T11 may be in a turn-on state. Therefore, since the voltage of the second node NN2 is not lower than the voltage of the first power VGL, a bias stress that may be applied to the second transistor T2 and the third transistor T3 may be alleviated. Accordingly, the second transistor T2 and the third transistor T3 may be protected from a voltage fluctuation at the sixth node NN6. In one embodiment, For example, the voltage of the second node NN2 may be equal to or greater than an addition of an absolute value of the voltage of the first power VGL and a threshold voltage of the eleventh transistor T11.

The first initialization circuit 16 may supply the voltage of the second power VGH to the first node NN1 during an initialization period. In an embodiment, the first initialization circuit 16 may include a twelfth transistor T12.

The twelfth transistor T12 may be connected between the second power VGH and the first node NN1. A gate electrode of the twelfth transistor T12 may be connected to the fourth input terminal 104 that receives the reset signal RST. When the twelfth transistor T12 is turned on, the voltage of the first node NN1 may be initialized to the voltage of the second power VGH.

Hereinafter, a configuration of the second stage ST2 will be described in detail.

The second stage ST2 may include the second input circuit 21, the second output circuit 22, the second control circuit 24, the second stabilizing circuit 25, and the second initialization circuit 26.

The second input circuit 21 may control a voltage of a first node N1 and a voltage of the second node N2 based on the first carry signal CR1 supplied from the output circuit 12 of the first stage ST1, the first inverted carry signal CRB1, and the second input terminal 202 supplied to the second input terminal 202. The second input circuit 21 may include a first transistor M1 and a second transistor M2.

The first transistor M1 may be connected between the first input terminal 201 and the first node N1. A gate electrode of the first transistor M1 may be connected to the second input terminal 202. A function of the first transistor M1 may be substantially the same as that of the first transistor T1 of the first input circuit 11.

The second transistor M2 may be connected between the fifth input terminal 208 and the second node N2. A gate electrode of the second transistor M2 may be connected to the second input terminal 202. That is, differently from the second node NN2 of the first stage ST1, the voltage of the second node N2 may correspond to the first inverted carry signal CRB1.

The second output circuit 22 may output the second output signal OUT2, the second carry signal CR2, and the second inverted carry signal CRB2, based on the voltage of the first node N1 and the voltage of the second node N2.

In an embodiment, the second output terminal 206 may be connected to a fifth node N5. Therefore, a voltage of the fifth node N5 may be supplied to the third stage ST3 as the second inverted carry signal CRB2.

Since a configuration and a function of the second output circuit 22 are substantially the same as those of the first output circuit 12, any repetitive detailed description thereof will be omitted. In an embodiment, the second output circuit 22 may include a fourth transistor M4, a fifth transistor M5, a sixth transistor M6, a seventh transistor M7, and an eighth transistor M8. The second output circuit 22 may further include a first capacitor C1 and a second capacitor C2.

The second control circuit 24 may control a voltage of a low level of a third node N3 based on the first clock signal CLK1 supplied to the third input terminal 203. In an embodiment, the second control circuit 24 may include a ninth transistor M9 and a third capacitor C3. Since a configuration and a function of the second control circuit 24 is substantially the same as those of the first control circuit 14, any repetitive detailed description thereof will be omitted.

The second stabilizing circuit 25 may be electrically connected between the second input circuit 21 and the second output circuit 22. The second stabilizing circuit 25 may limit a voltage drop amount of the first node N1 and a voltage drop amount of the second node N2.

Since a configuration and a function of the second stabilizing circuit 25 is substantially the same as those of the first stabilizing circuit 15, any repetitive detailed description thereof will be omitted. In an embodiment, the second stabilizing circuit 25 may include a tenth transistor M10 and an eleventh transistor M11.

Operations and functions of the stages ST1 and ST2 will hereinafter be described in detail with reference to FIGS. 4 and 5.

FIG. 4 is a signal timing diagram illustrating an embodiment of signals for driving the first stage of FIG. 3.

Referring to FIGS. 1, 3, and 4, the first clock signal CLK1 and the second clock signal CLK2 are supplied at different timings from each other. In one embodiment, for example, the second clock signal CLK2 is set as a signal delayed or shifted by a half period (for example, one horizontal period) from the first clock signal CLK1.

A high level H (or a high voltage) of the start pulse SSP may correspond to the voltage of the second power VGH, and a low level L (or a low voltage) of the start pulse SSP may corresponds to the voltage of the first power VGL. In one embodiment, for example, the voltage of the first power VGL may be about −8 volts (V), and the voltage of the second power VGH may be about 10 V. However, this is merely exemplary, and a voltage level of the start pulse is not limited thereto. In such an embodiment, the voltage of the first power VGL and the voltage of the second power VGH may be set according to a type of a transistor, a use environment of the display device, and the like, for example.

In an embodiment, the low level L of the third node NN3 may be similar to a value obtained by adding an absolute value of a threshold voltage of the tenth transistor T10 to the voltage of the first power VGL. However, since the threshold voltage of the tenth transistor T10 is very small compared to the voltage of the first power VGL, it is assumed that the low level L of the third node NN3, the voltage of the first power VGL, the low level L of the start pulse SSP, and the low level L of the gate signal are substantially the same as or similar to each other.

In addition, 2-low level 2L may be a voltage level similar to two times to the voltage of the first power VGL, that is, 2×VGL.

In an embodiment, the start pulse SSP may have a waveform for an output of the emission control signal or a waveform for an output of the scan signal. That is, during one frame period, the start pulse SSP and the first output signal OUT1 may overlap a plurality of gate-on periods and gate-off periods of the clock signals CLK1 and CLK2.

In such an embodiment, when the clock signals CLK1 and CLK2 are supplied, the voltage (a voltage of a low level L, or a gate-on voltage) of the first power VGL is supplied to each of the second input terminal 102 and the third input terminal 103, and when the clock signals CLK1 and CLK2 are not supplied, the voltage (a voltage of a high level H, or a gate-off voltage) of the second power VGH is supplied to each of the second input terminal 102 and the third input terminal 103.

At a first time point t, a second time point t2, and a third time point t3, the start pulse SSP has the high level H. At a fourth time point t3, a fifth time point t5, and a sixth time point t6, the start pulse SSP has the low level L.

The first clock signal CLK1 may be supplied to the second input terminal 102 at the first time point t. The first transistor T1 and the third transistor T3 may be turned on in response to the first clock signal CLK1.

When the first transistor T1 is turned on, the high level H of the start pulse SSP may be supplied to the first node NN1. Accordingly, the voltage of the first node NN1 and the voltage of the third node NN3 may be changed to the high level H. Therefore, the eighth transistor T8 and the ninth transistor T9 may be turned off by the voltage of the third node NN3 of the high level H.

When the third transistor T3 is turned on, the voltage of the first power VGL may be supplied to the second node NN2 and may be supplied to the sixth node NN6 through the eleventh transistor T11. At the first time point t1, the seventh transistor T7 may be turned on by the voltage of the low level (for example, L) of the sixth node NN6, and the high level H of the second clock signal CLK2 may be supplied to one terminal of the first capacitor C1 (that is, the fifth node NN5).

At this time, since the sixth transistor T6 is in a turn-off state, the voltage of the fourth node NN4 may maintain the voltage (that is, the high level H) of the second power VGH.

At the second time point t2, the second clock signal CLK2 may be supplied to the third input terminal 103. The sixth transistor T6 may be turned on in response to the second clock signal CLK2. Since the voltage of the fifth node NN5 may be decreased by the second clock signal CLK2 at the second time point t2, the voltage of the sixth node NN6 may be decreased to the 2-low level 2L by the coupling of the first capacitor C1, and a current path may be formed through the seventh transistor T7 and the sixth transistor T6. Accordingly, the voltage of the fourth node NN4 may be decreased, and the fifth transistor T5 may be turned on by the voltage of the fourth node NN4.

When the fifth transistor T5 is turned on, the voltage of the second power VGH may be supplied to the first output terminal 105. Therefore, the first output signal OUT1 and the first carry signal CR1 may be output at the high level H.

In such an embodiment, since the voltage of the fifth node NN5 is decreased by the second clock signal CLK2, the voltage of the low level L may be supplied to the second output terminal 106. Therefore, the first inverted carry signal CRB1 may be output at the low level L at the second time point t2.

Thereafter, when supply of the second clock signal CLK2 is stopped, the voltage of the fifth node NN5 may be changed to the high level by the seventh transistor T7, which is in a turn-on state by the voltage of the sixth node NN6. Therefore, the first inverted carry signal CRB1 may be output at the high level L. In FIG. 4, a waveform of the first inverted carry signal CRB1 may be substantially the same as a voltage change of the fifth node NN5.

In such an embodiment, when the second clock signal CLK2 is supplied to the third input terminal 103 again at the third time point t3, the sixth transistor T6 may be turned on. The voltage of the fifth node NN5 may be decreased again by the current path between the seventh transistor T7 and the sixth transistor T6, and the voltage of the low level L may be supplied to the second output terminal 106. Therefore, the first inverted carry signal CRB1 may be output at the low level L again at the third time point t3.

As described above, during a period in which the start pulse SSP is supplied at the high level H, the first inverted carry signal CRB1 may repeat the high level H and the low level L in synchronization with the waveform of the second clock signal CLK2 and may be output. In addition, the first stage ST1 may output the first output signal OUT1 and the first carry signal CR1 of the high level H in correspondence with the supply of the start pulse SSP (that is, the high level H). Thereafter, before the fourth time point t4, the start pulse SSP may change to the low level L again.

In such an embodiment, since the phases of the first clock signal CLK1 and the second clock signal CLK2 do not overlap (that is, the low level L of the first clock signal CLK1 and the low level L of the second clock signal CLK2 do not overlap), the voltage of the fifth node NN5 and the first inverted carry signal CRB1 may maintain the high level H after the fourth time point t4.

At the fourth time point t4, the first clock signal CLK1 may be supplied, and the first transistor T1 and the third transistor T3 may be turned on in response to the first clock signal CLK1.

When the first transistor T1 is turned on, the low level L of the start pulse SSP may be supplied to the first node NN1. The voltage of the third node NN3 may be changed to the low level L through the tenth transistor T10 in a turn-on state. Therefore, the fourth transistor T4 may be turned on by the voltage of the third node NN3 of the low level L at the fourth time point t4.

At this time, since the low level L of a magnitude similar to that of the voltage of the first power VGL is supplied to the gate electrode of the fourth transistor T4, the first output signal OUT1 output to the first output terminal 105 through the fourth transistor T4 may have an intermediate level M. The intermediate level M may be higher than the voltage of the first power VGL. In one embodiment, for example, the intermediate level M may be a voltage level of about VGL+2|Vth|, where Vth denotes the threshold voltage.

In addition, the voltage of the third node NN3 of the low level L may be supplied to the gate electrode of the ninth transistor T9 and one terminal of the third capacitor C3.

In such an embodiment, at the fourth time point t4, the eighth transistor T8 may be turned on by the voltage of the first node NN1 of the low level L. When the eighth transistor T8 is turned on, the voltage of the second power VGH may be supplied to the fourth node NN4 and the fifth transistor T5 may be turned off. Thereafter, the high level H of the fourth node NN4 may be maintained until the second time point t2 of a next frame returns again.

At the fifth time point t5, the supply of the first clock signal CLK1 may be stopped. At this time, the second transistor T2 may have a turn-on state by the voltage of the first node NN1 of the low level L. Therefore, the high level of the first clock signal CLK1 may be supplied to the second node NN2 through the second transistor T2, and the voltage of the second node NN2 may be changed to the high level H.

In addition, thereafter, at the sixth time point t6, the second clock signal CLK2 may be supplied to the third input terminal 103 again. At the sixth time point t6, the second clock signal CLK2 may be supplied to a terminal between the third capacitor C3 and the ninth transistor T9 by the ninth transistor T9 of a turn-on state. Therefore, the voltage of the third node NN3 may be decreased to the 2-low level 2L due to the coupling of the third capacitor C3.

Therefore, since the 2-low level 2L is supplied to the gate electrode of the fourth transistor T4, the first output signal OUT1 and the first carry signal CR1 output to the first output terminal 105 may be changed to the low level L at the sixth time point t6.

Thereafter, during a period in which the first output signal OUT1 and the first carry signal CR1 have the low level L, the voltage of the second node NN2 may swing in correspondence with the first clock signal CLK1. That is, as shown in FIG. 4, in a period after the sixth time point t6, the voltage of the second node NN2 may periodically swing due to an influence of the second transistor T2 turned on by the voltage of the first node NN1 of the low level L.

In such an embodiment, as shown in FIG. 4, in the period after the sixth time point t6, the voltage of the third node NN3 may be periodically decreased to the 2-low level 2L due to an influence of the ninth transistor T9 turned on by the voltage of the third node NN3 of the low level L and the third capacitor C3 charged/discharged by the second clock signal CLK2.

Figure 5:
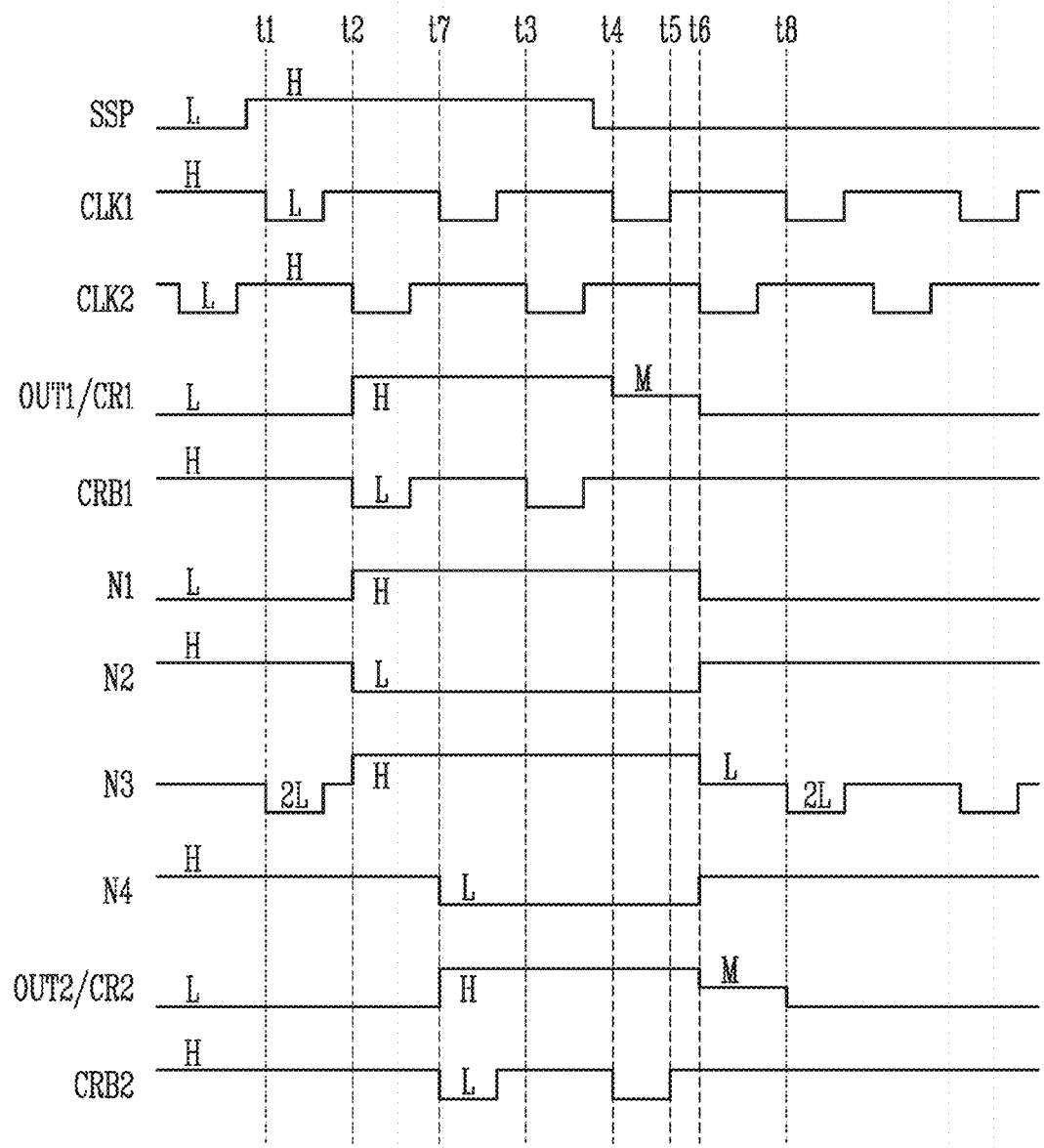
FIG. 5 is a signal timing diagram illustrating an embodiment of d signals for riving the second stage of FIG. 3.

FIG. 5 is a signal timing diagram illustrating an embodiment of signals for driving the second stage of FIG. 3.

In FIG. 5, the same reference numerals are used for the same components as those described with reference to FIG. 4, and any repetitive detailed description of such components will be omitted. For example, it may be understood that first to sixth time points t1 to t6 of FIG. 4 are the same time points as the first to sixth time points t1 to t6 of FIG. 5.

Referring to FIGS. 3 to 5, the second stage ST2 may operate based on the first carry signal CR1 and the first inverted carry signal BCR1. FIG. 5 shows an operation of the second stage ST2 and an output of the first stage ST1 according to the start pulse SSP.

At the first time point t1, the voltage of the third node N3 of the second stage ST2 may be decreased to the 2-low level 2L. That is, the voltage of the third node N3 may swing in correspondence with a change of the first clock signal CLK1 due to the influence (that is, an operation of the control circuit 24) of the ninth transistor M9 turned on by the voltage of the third node N3 of the low level L and the third capacitor C3 charged/discharged by the first clock signal CLK1.

At the second time point t2, the second clock signal CLK2 may be supplied to the second input terminal 202. The first transistor M1 and the second transistor T2 may be turned on in response to the second clock signal CLK2. Therefore, the high level H of the first carry signal CR1 may be supplied to the first node N1, and the low level L of the first inverted carry signal CRB1 may be supplied to the second node N2.

Before a seventh time point t7 between the second time point t2 and the third time point t3 supply of the second clock signal CLK2 is stopped. As described above, the first inverted carry signal CRB1 may have the same waveform as the second clock signal CLK2. Therefore, even though the first inverted carry signal CRB1 changes to the high level H before the seventh time point t7, the voltage of the second node N2 may be maintained at the low level L.

At the seventh time point t7, the first clock signal CLK1 may be supplied to the third input terminal 203. The sixth transistor M6 may be turned on in response to the first clock signal CLK1. Since the operation of the first output circuit 12 of the first stage ST1 and the operation of the second output circuit 22 of the second stage ST2 are substantially the same as each other, any repetitive detailed description thereof will be omitted.

The voltage of the fourth node N4 may be decreased by the sixth and seventh transistors M6 and M7 turned on at the seventh time point t7, and the fifth transistor M5 may be turned on by the voltage of the fourth node N4.

When the fifth transistor M5 is turned on, the voltage of the second power VGH may be supplied to the first output terminal 205. Therefore, the second output signal OUT2 and the second carry signal CR2 may be output at the high level H.

In such an embodiment, since the voltage of the fifth node N5 is decreased by the first clock signal CLK1, the voltage of the low level L may be supplied to the second output terminal 206. Therefore, the second inverted carry signal CRB2 may be output at the low level L. In a period in which the voltage of the second node N2 has the low level L, which includes the third time point t3, the fourth time point t4, and the fifth time point t5, a waveform of the second inverted carry signal CRB2 may be substantially the same as a voltage change of the fifth node N5.

At the sixth time point t6, the second clock signal CLK2 may be supplied to the second input terminal 202 again, and the first transistor M1 and the second transistor M2 may be turned on in response to the first clock signal CLK1.

When the first transistor M1 is turned on, the low level L of the first carry signal CR1 may be supplied to the first node N1. The voltage of the third node N3 may be changed to the low level L through the tenth transistor M10 of the turn-on state. Therefore, the fourth transistor M4 may be turned on by the voltage of the third node N3 of the low level L. At this time, since the low level L of a magnitude similar to that of the voltage of the first power VGL is supplied to the gate electrode of the fourth transistor M4, the second output signal OUT2 output to the first output terminal 205 may have an intermediate level M. In addition, the voltage of the third node N3 of the low level L may be supplied to the gate electrode of the ninth transistor M9 and one terminal of the third capacitor C3.

In such an embodiment, at the sixth time point t6, the eighth transistor M8 may be turned on by the voltage of the first node N1 of the low level L. When the eighth transistor M8 is turned on, the voltage of the second power VGH may be supplied to the fourth node N4 and the fifth transistor M5 may be turned off.

Thereafter, at an eighth time point t8, the first clock signal CLK1 may be supplied to the third input terminal 203 again. At the eighth time point t8, the first clock signal CLK1 may be supplied to a terminal between the third capacitor C3 and the ninth transistor M9 by the ninth transistor M9 of the turn-on state. Therefore, the voltage of the third node N3 may be decreased to the 2-low level 2L due to the coupling of the third capacitor C3.

Therefore, since the 2-low level 2L is supplied to the gate electrode of the fourth transistor M4, the second output signal OUT2 and the second carry signal CR2 output to the first output terminal 205 may be changed to the low level L.

Thereafter, the voltage of the third node N3 may be periodically decreased to the 2-low level 2L in the period after the sixth time point t6, due to an influence of the ninth transistor M9 turned on by the voltage of the third node N3 of the low level L and the third capacitor C3 charged/discharged by the second clock signal CLK2.

In such an embodiment, as described above, the second stage ST2 may output the second output signal OUT2 in which the first output signal OUT1 is shifted and the second inverted carry signal CRB2 in which the first inverted carry signal CRB1 is shifted.

IN such an embodiment, the first inverted carry signal CRB1 supplied to the fifth input terminal 208 maintains the high level H after the fourth time point t4. Therefore, even though the second transistor M2 is periodically turned on in response to the second clock signal CLK2 after the sixth time point t6, only the voltage of the high level H may be supplied to the second node N2.

Accordingly, differently from a voltage change of the second node NN2 of the first stage, the voltage of the second node N2 may be maintained at the high level (H) in the period after the sixth time point t6, the voltage of the second node N2 and the voltage of the sixth node N6 may be maintained at relatively constant values, respectively.

When the remaining stages having the same configuration as the second stage ST2 output the low level L of a corresponding output signal, the voltage of the second node N2 may be stably maintained at the high level H.

Therefore, undesired charge/discharge operations of the first capacitor C1 are effectively prevented during a period in which the second output signal OUT2 is output at the low level L, and thus power consumption for cancelling the charge/discharge operations may be reduced. In such an embodiment, by preventing or minimizing a change of an equivalent impedance due to the charge/discharge of the first capacitor C1, rising/falling speeds of the first clock signal CLK1, the second clock signal CLK2, and the output signal (for example, OUT2 and CR2) may be improved and voltage ripple may be reduced.

Accordingly, the gate driver including the scan driver according to embodiments of the disclosure may be stably applied to high speed driving, and image quality may be improved.

Figure 6:
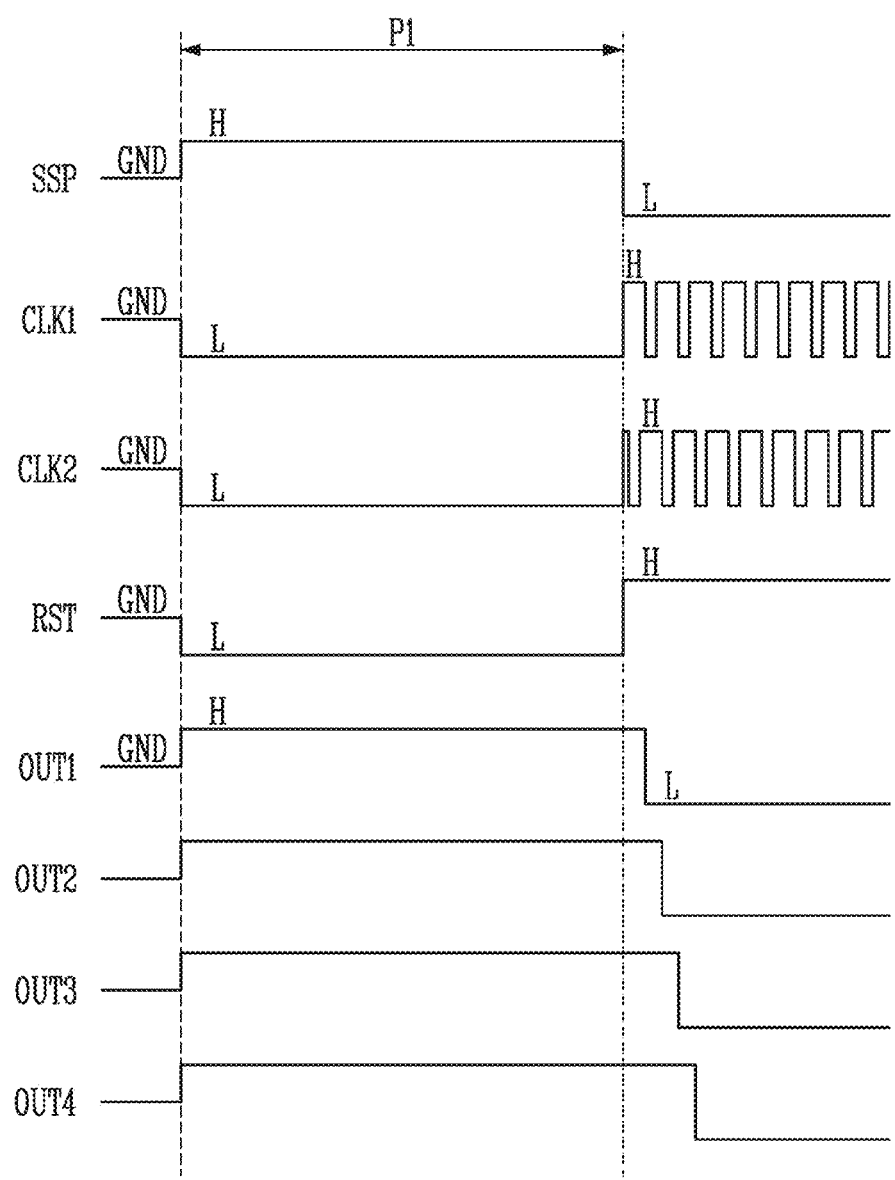
FIG. 6 is a signal timing diagram illustrating an embodiment of signals for driving the scan driver of FIG. 2A in an initialization period.
Figure 7:
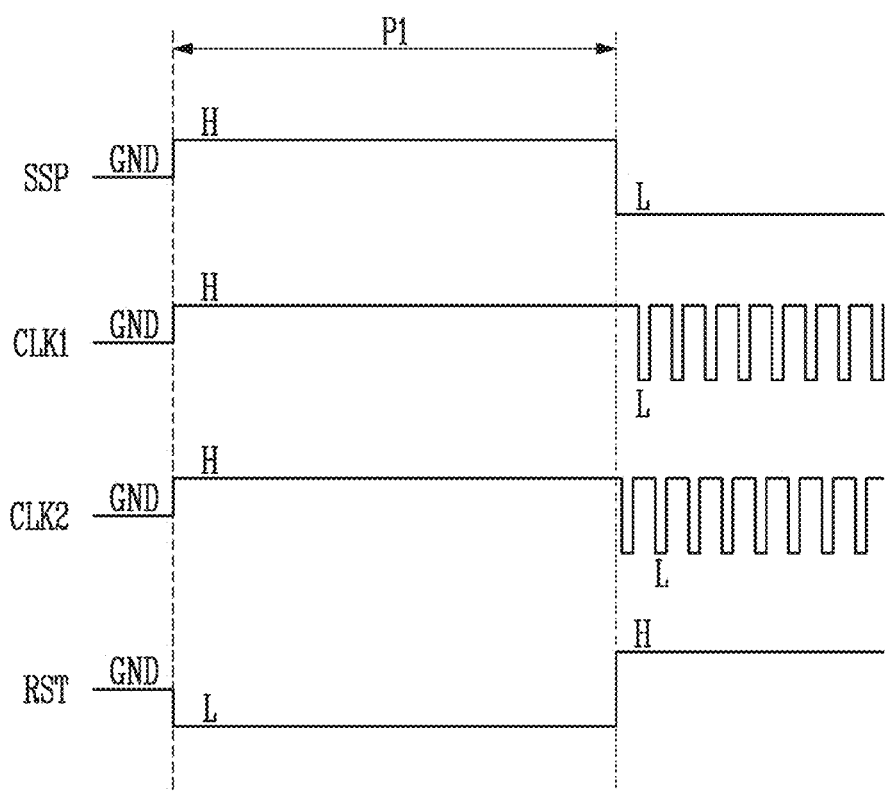
FIG. 7 is a signal timing diagram illustrating an alternative embodiment of signals for driving the scan driver of FIG. 2A in the initialization period.

FIG. 6 is a signal timing diagram illustrating an embodiment of signals for driving the scan driver of FIG. 2A in an initialization period, and FIG. 7 is a signal timing diagram illustrating another embodiment of signals for driving the scan driver of FIG. 2A in the initialization period.

Referring to FIGS. 2A, 3, 6, and 7, the output signals OUT1 to OUT4 may be output at the high level H during the initialization period P1.

In an embodiment, the initialization circuits 16 and 26 may supply the voltage of the second power VGH to the first nodes NN1 and N1 during the initialization period P1. The initialization period P1 may be a period in which the display device 1000 is initially driven, which is a period before the pixels PX are substantially driven. All signals before the initialization period P1 may have a ground level GND. During the initialization period P1, the start pulse SSP of the high level H may be supplied.

In an embodiment, as shown in FIG. 6, the first and second clock signals CLK1 and CLK2 of the low level L may be supplied during the initialization period P1. In one embodiment, for example, a length of the initialization period P1 in which both of the first clock signal CLK1 and the second clock signal CLK2 have the low level L may be set to be longer than that of a length in which the first clock signal CLK1 and/or the second clock signal CLK2 has the low level L (for example, a period between the fourth time point t4 and the fifth time point t5 of FIG. 4).

In such an embodiment, the reset signal RST of the low level L may be simultaneously supplied to the stages ST1 to ST4 through the fourth input terminals 104 and 204 in the initialization period P1.

The twelfth transistor T12 of the first stage ST1 and the twelfth and thirteenth transistors M12 and M13 of the second stage ST2 may be turned on by the reset signal RST of the low level L. Therefore, the voltage of the first nodes NN1 and N1 may be changed to the high level H. In the initialization period P1, the voltages of the first nodes NN1 and N1 may be initialized to the high level H, and the voltages of the second nodes NN2 and N2 may be initialized to the low level L. Therefore, in the initialization period P1, all the stages ST1 to ST4 included in the scan driver 200 may simultaneously output the scan signal of the high level H.

Thereafter, when the start pulse SSP transits to the low level L, the output signals OUT1 to OUT4 output to the scan lines SL1 to SL4 in synchronization with the first clock signal CLK1 or the second clock signal CLK2 may be sequentially changed to the low level L.

In FIG. 6, the output signals OUT1 to OUT4 are decreased from the high level H to the low level L at one time, but the disclosure is not limited thereto. In one embodiment, for example, the output signals OUT1 to OUT4 may be decreased in a step form as shown in FIG. 4.

In an embodiment, when an image is displayed, the initialization circuits 16 and 26 do not affect the operation of the stages ST1 and ST2, and driving as shown in FIGS. 4 and 5 may be performed.

In an embodiment, as shown in FIG. 3, the first output terminal 105 of the first stage ST1 may be connected to the first input terminal 201 of the second stage ST2, and the second output terminal 106 of the first stage ST1 may be connected to the fifth input terminal 208 of the second stage ST2. The first carry signal CR1 of the high level H may be supplied to the third node N3 through the first node N1 of the second stage ST2. Similarly, the second carry signal CR2 of the high level H may be supplied to the supplied third stage ST3.

The carry signal of the high level H may not be completely transferred to a last stage due to a resistive-capacitive ("RC") delay or the like at the initial stage of driving due to a dependent connection of the stages ST1 to ST4. In this case, the fourth transistor M4 and the fifth transistor M5 may be simultaneously turned on in a predetermined stage. Therefore, a voltage level of the output signal may be decreased, and an abnormal emission phenomenon such as flashing that the pixels PX emit light may occur.

In an embodiment of the disclosure, the initialization circuits 16 and 26 directly transfer the voltage of the second power VGH to the first nodes NN1 and N1 during the initialization period P1, and thus the voltage of the high level H may be immediately supplied to the first nodes NN1 and N1 and the third nodes NN3 and N3. Therefore, the fourth transistors T4 and M4 may be completely turned off during the initialization period P1, and flashing due to unintended emission of the pixels PX may be effectively prevented.

In an embodiment, as shown in FIG. 7, the first and second clock signals CLK1 and CLK2 of the high level H may be supplied during the initialization period P1.

In such an embodiment, all transistors except for the initialization circuits 16 and 26 are turned off, and thus an undesired operation of the stages ST1 to ST4 and unintended current inflow/current change may be effectively prevented. In such an embodiment, the first nodes NN1 and N1 may be initialized to the voltage of the high level H by the turn-on of the initialization circuits 16 and 26.

Figure 8:
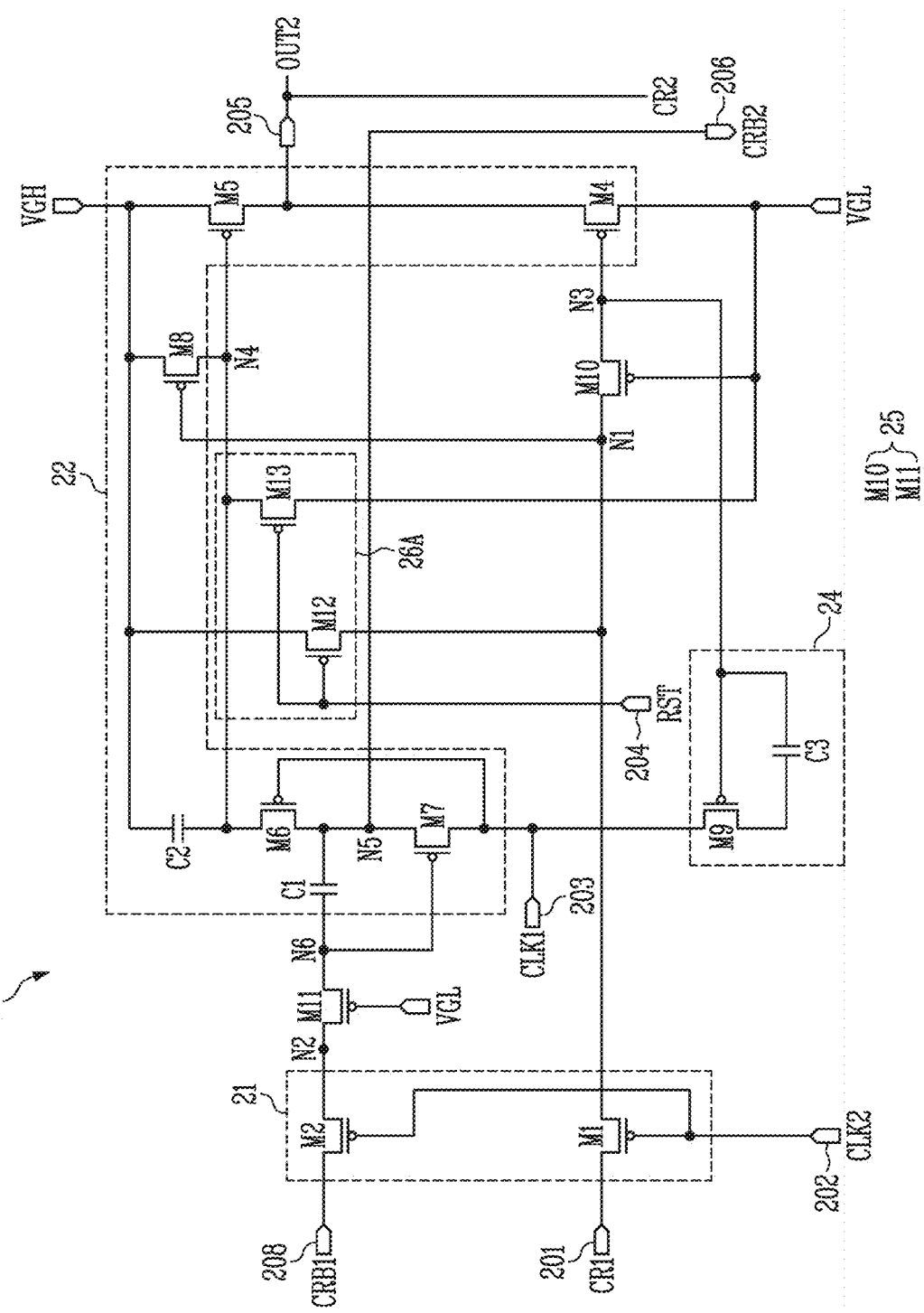
FIG. 8 is a circuit diagram illustrating an alternative embodiment of the second stage of FIG. 3.

FIG. 8 is a circuit diagram illustrating an alternative embodiment of signals for the second stage of FIG. 3.

In FIG. 8, the same reference numerals are used for same components as those described with reference to FIG. 3, and any repetitive detailed description of such components will be omitted. In addition, the second stage ST2_1 of FIG. 8 may have a configuration substantially the same as or similar to that of the second stage ST2 of FIG. 3 except for a configuration of the thirteenth transistor M13.

Referring to FIGS. 6 and 8, an embodiment of the second stage ST2_1 may include the input circuit 21, the output circuit 22, the control circuit 24, the stabilizing circuit 25, and an initialization circuit 26A.

The initialization circuit 26A may supply the voltage of the second power VGH to the first node N1 during the initialization period P1. The second initialization circuit 26A may include the twelfth transistor M12 and the thirteenth transistor M13.

The thirteenth transistor M13 may be connected between the fourth node N4 and the first power VGL. In the initialization period P1, the thirteenth transistor M13 may be turned on in response to the reset signal RST, and the voltage of the first power VGL may be supplied to the fourth node N4. Therefore, the fifth transistor M5 may be turned on, and thus the second output voltage OUT2 of the high level H may be supplied to the first output terminal 205.

The second stage ST2_1 may be driven substantially the same as the driving described with reference to FIG. 5.

Figure 9:
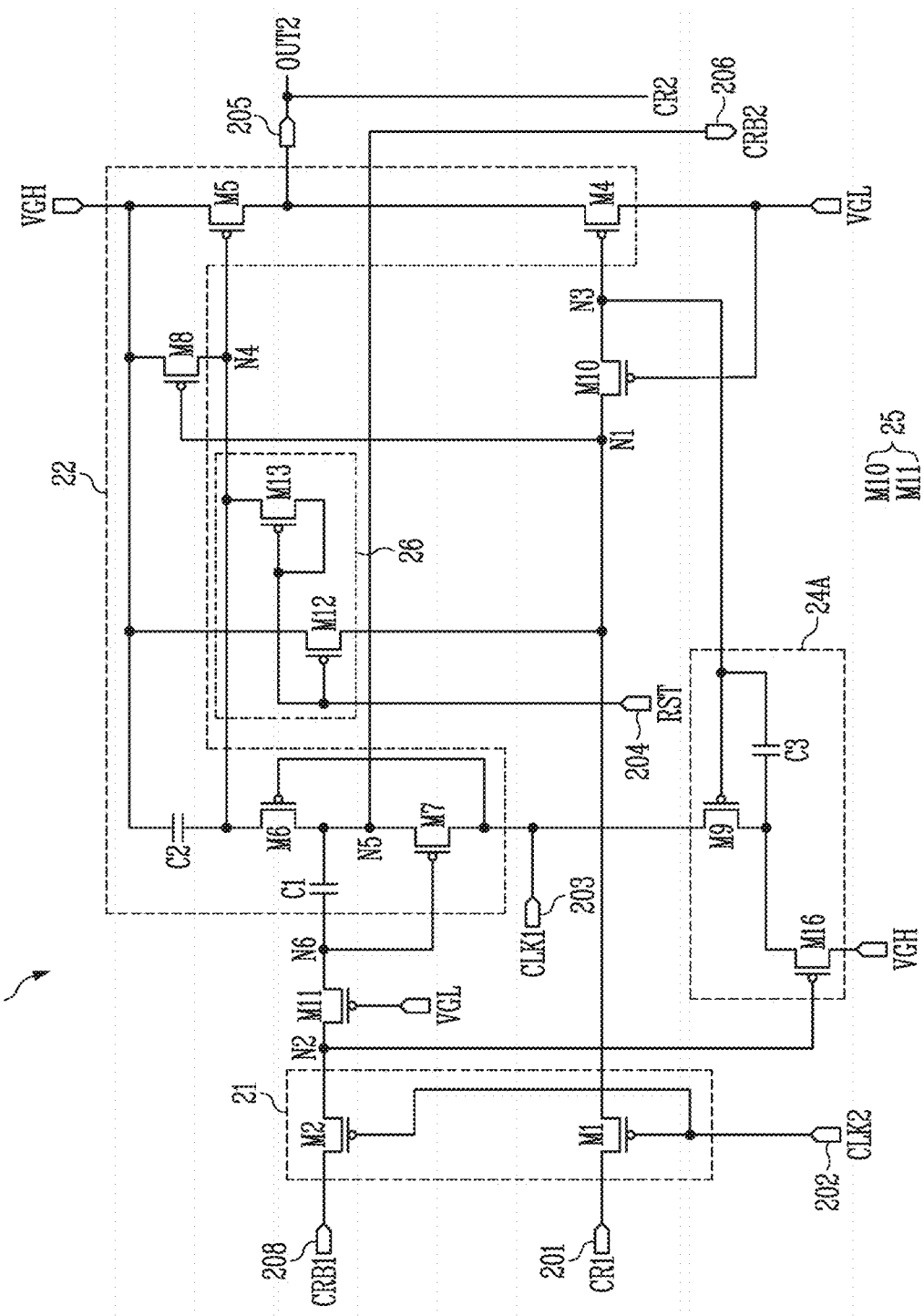
FIG. 9 is a circuit diagram illustrating another alternative embodiment of the second stage of FIG. 3.

FIG. 9 is a circuit diagram illustrating another alternative embodiment of signals for the second stage of FIG. 3.

In FIG. 9, the same reference numerals are used for the same components as those described with reference to FIG. 3, and any repetitive detailed description of such components will be omitted. In addition, the second stage ST2_2 of FIG. 9 may have a configuration substantially the same as or similar to that of the second stage ST2 of FIG. 3 except for a configuration of a sixteenth transistor M16.

Referring to FIGS. 5 and 9, an embodiment of the second stage ST2_2 may include the input circuit 21, the output circuit 22, the control circuit 24A, the stabilizing circuit 25, and the initialization circuit 26.

In an embodiment, the control circuit 24A may include the ninth transistor M9, the third capacitor C3, and the sixteenth transistor M16.

The sixteenth transistor M16 may be connected between a second electrode of the ninth transistor M9 and the second power VGH. A gate electrode of the sixteenth transistor M16 may be connected to the second node N2.

When the sixteenth transistor M16 is turned on, the voltage of the second power VGH may be supplied to the second electrode of the ninth transistor M9.

That is, when the second stage ST2_2 starts up (for example, the initialization period P1 of FIG. 6) and/or when the second output signal OUT2 of the high level H is output, the sixteenth transistor M16 may stably supply the voltage of the second power VGH to the second electrode of the ninth transistor M9 and one terminal of the third capacitor C3. Therefore, when outputting the second output signal OUT2 of the high level H, the voltage of the third node N3 may be stably maintained at the high level H, and the fourth transistor M4 may have a complete turn-off state.

The control circuit 24A may also be applied to the second stage ST2_1 of FIG. 9.

Figure 10:
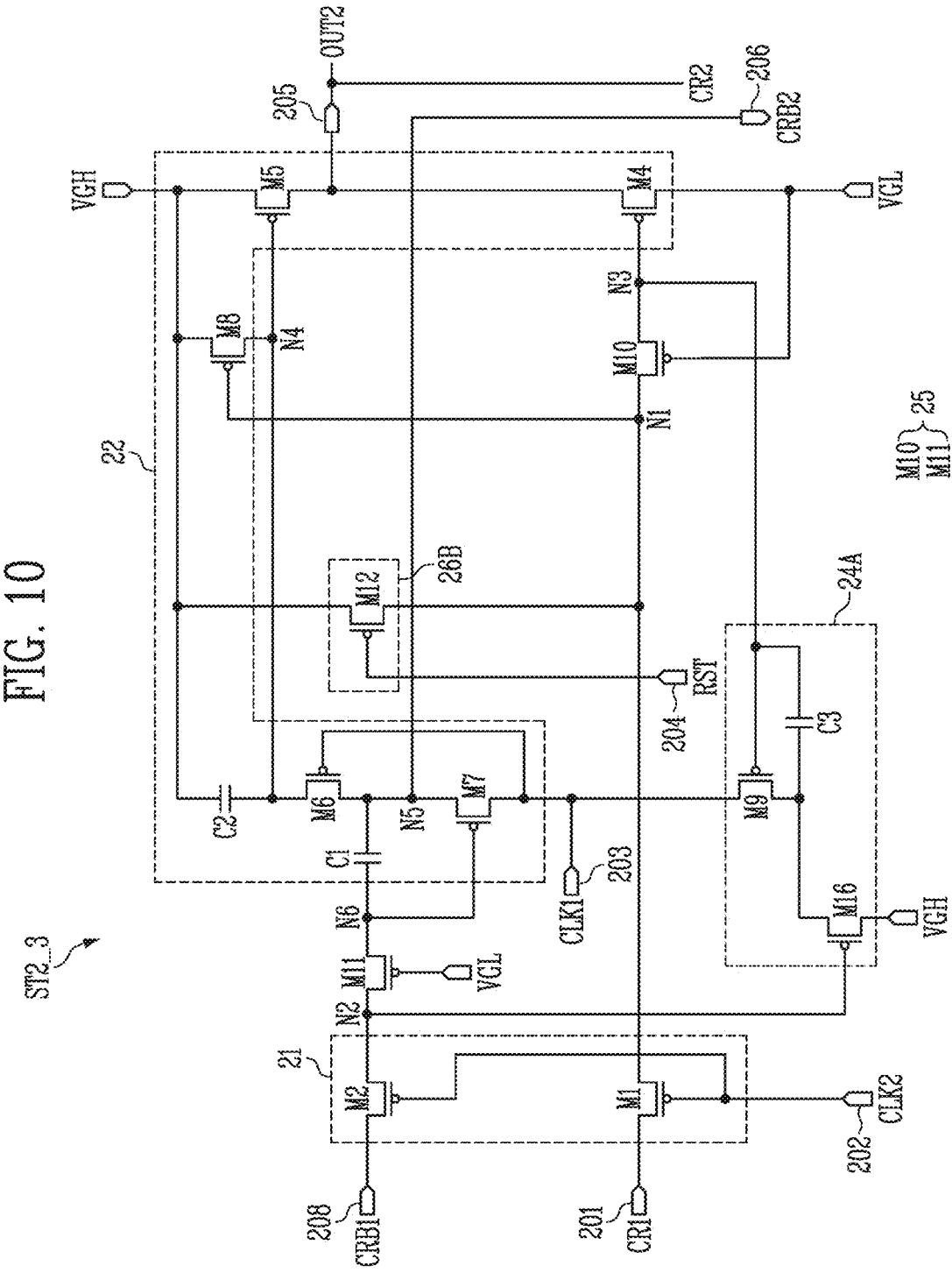
FIG. 10 is a circuit diagram illustrating still another alternative embodiment of the second stage of FIG. 3.

FIG. 10 is a circuit diagram illustrating still another embodiment of signals for the second stage of FIG. 3.

In FIG. 10, the same reference numerals are used for the same components as those described with reference to FIGS. 3 and 9, and any repetitive detailed description of such components will be omitted. In addition, the second stage ST2_3 of FIG. 10 may have a configuration substantially the same as or similar to that of the second stage ST2_2 of FIG. 9 except that the thirteenth transistor M13 is omitted.

Referring to FIGS. 6 and 10, an embodiment of the second stage ST2_3 may include the input circuit 21, the output circuit 22, the control circuit 24A, the stabilizing circuit 25, and an initialization circuit 26B.

In an embodiment, since the initialization circuit 26B basically operates to supply the voltage of the high level to the first node N1, the initialization circuit 26B may have a configuration in which the thirteenth transistor M13 of FIGS. 3 and 9 is omitted. Therefore, a manufacturing cost and a size of the scan driver (gate driver) may be reduced.

In addition, the initialization circuit 26B may also be applied to the second stage ST2 of FIG. 3 and the second stage ST2_2 of FIG. 9.

Figure 11:
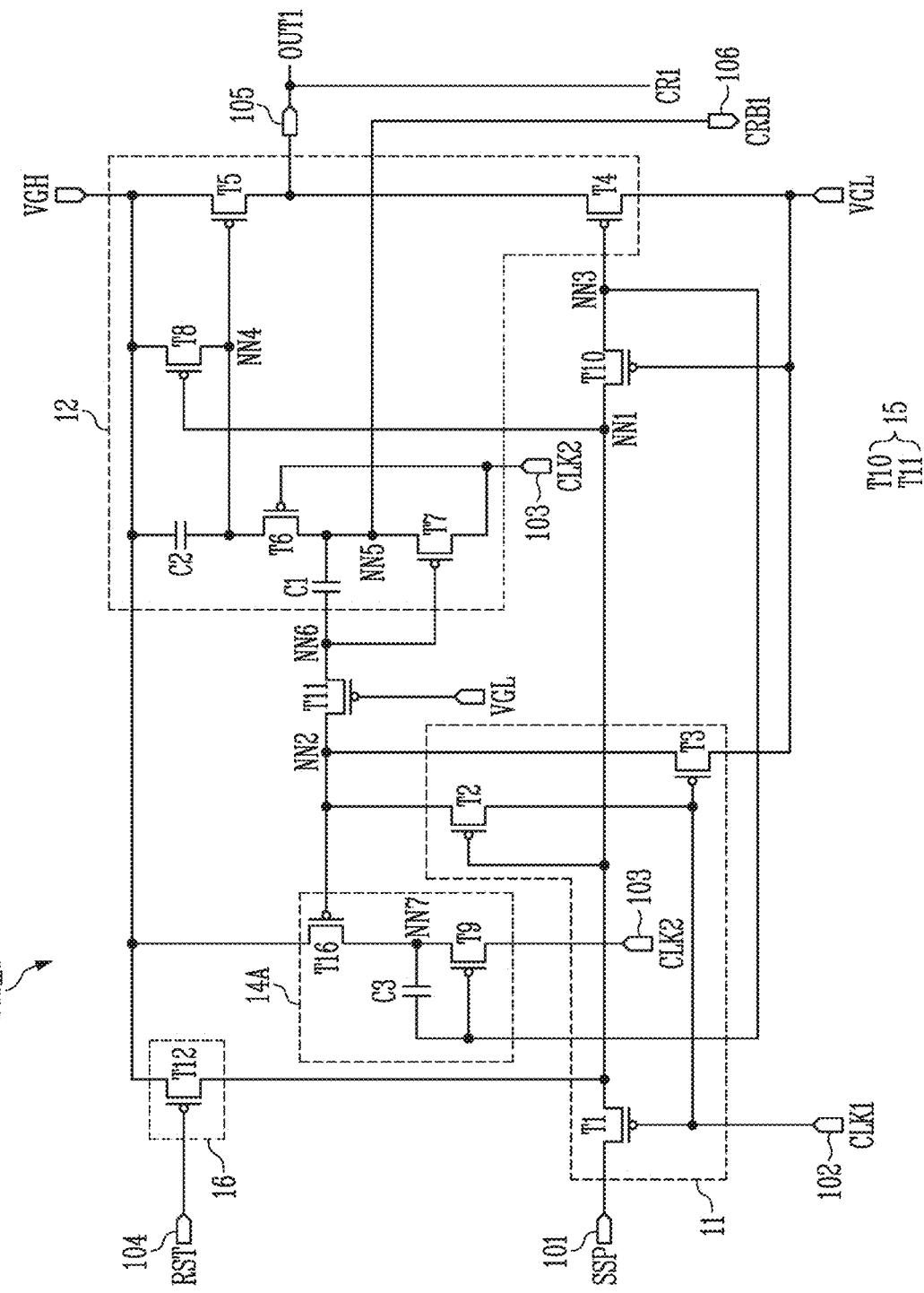
FIG. 11 is a circuit diagram illustrating an alternative embodiment of the first stage of FIG. 3.

FIG. 11 is a circuit diagram illustrating an alternative embodiment of signals for the first stage of FIG. 3.

In FIG. 11, the same reference numerals are used for the same components as those described with reference to FIG. 3, and any repetitive detailed description of such components will be omitted. In addition, the first stage ST1_1 of FIG. 11 may have a configuration substantially the same as or similar to that of the first stage ST1 of FIG. 3 except for a configuration of a sixteenth transistor T16.

Referring to FIGS. 4 and 11, an embodiment of the first stage ST1_1 may include the input circuit 11, the output circuit 12, a control circuit 14A, the stabilizing circuit 15, and the initialization circuit 16.

In an embodiment, the control circuit 14A may include the ninth transistor T9, the third capacitor C3, and the sixteenth transistor T16.

The sixteenth transistor T16 may be connected between the seventh node NN7 and the second power VGH. A gate electrode of the sixteenth transistor T16 may be connected to the second node NN2.

When the sixteenth transistor T16 is turned on, the voltage of the second power VGH may be supplied to the seventh node NN7.

That is, when the first stage ST1_1 starts up (for example, the initialization period P1 of FIG. 6) and/or when the first output signal OUT1 of the high level H is output, the sixteenth transistor T16 may stably supply the voltage of the second power VGH to the seventh node NN7. Therefore, when outputting the first output signal OUT1 of the high level H, the voltage of the third node NN3 may be stably maintained at the high level H, and the fourth transistor T4 may have a complete turn-off state.

Figure 12:
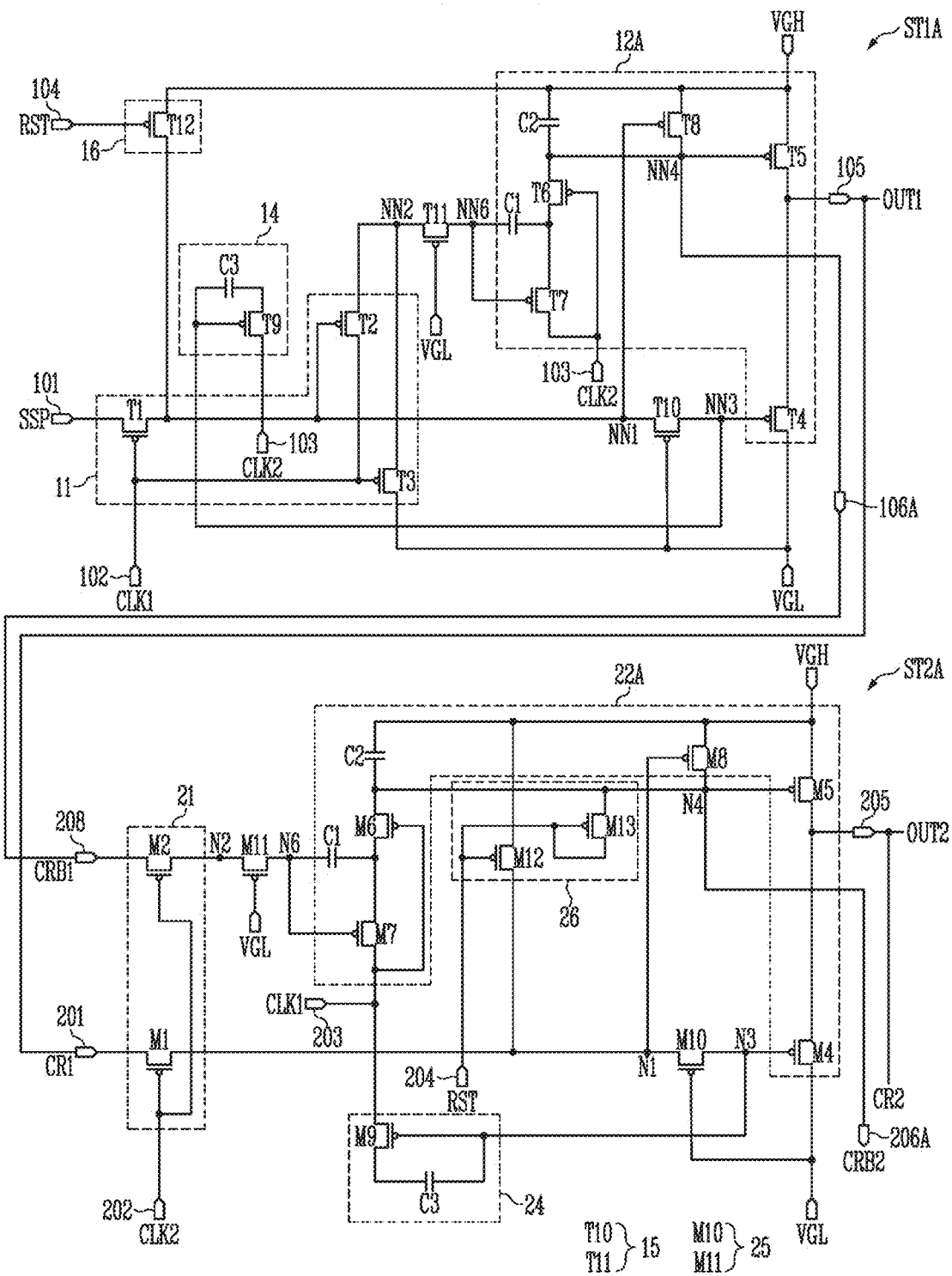
FIG. 12 is a circuit diagram illustrating an alternative embodiment of the first stage and the second stage included in the scan driver of FIG. 2A.

FIG. 12 is a circuit diagram illustrating an alternative embodiment of signals for the first stage and the second stage included in the scan driver of FIG. 2A.

In FIG. 12, the same reference numerals are used for same components as those described with reference to FIG. 3, and any repetitive detailed description of such components will be omitted. In addition, the first stage ST1A and the second stage ST2A of FIG. 12 may have a configuration substantially the same as or similar to that of the first stage ST1 and the second stage ST2 of FIG. 3 except for second output terminals 106A and 206A.

Referring to FIG. 12, an embodiment of the first stage ST1A and the second stage ST2A may include the input circuits 11 and 21, output circuits 12A and 22A, the control circuits 14 and 24, the stabilizing circuits 15 and 25, and the initialization circuits 16 and 26, respectively.

A configuration of the second stage ST2A may also be applied to the k-th stage (where k is an integer greater than 2).

In an embodiment, the first output circuit 12A may be connected to the second output terminal 106A of the first stage ST1A. In one embodiment, for example, the second output terminal 106A may be connected to the fourth node NN4. Therefore, the voltage of the fourth node NN4 may be supplied to the fifth input terminal 208 of the second stage ST2A as the first inverted carry signal CRB1.

In such an embodiment, the second output circuit 22A may be connected to the second output terminal 206A of the second stage ST2A. In one embodiment, for example, the second output terminal 206A may be connected to the fourth node N4. Therefore, the voltage of the fourth node N4 may be output as the second inverted carry signal CRB2.

Figure 13:
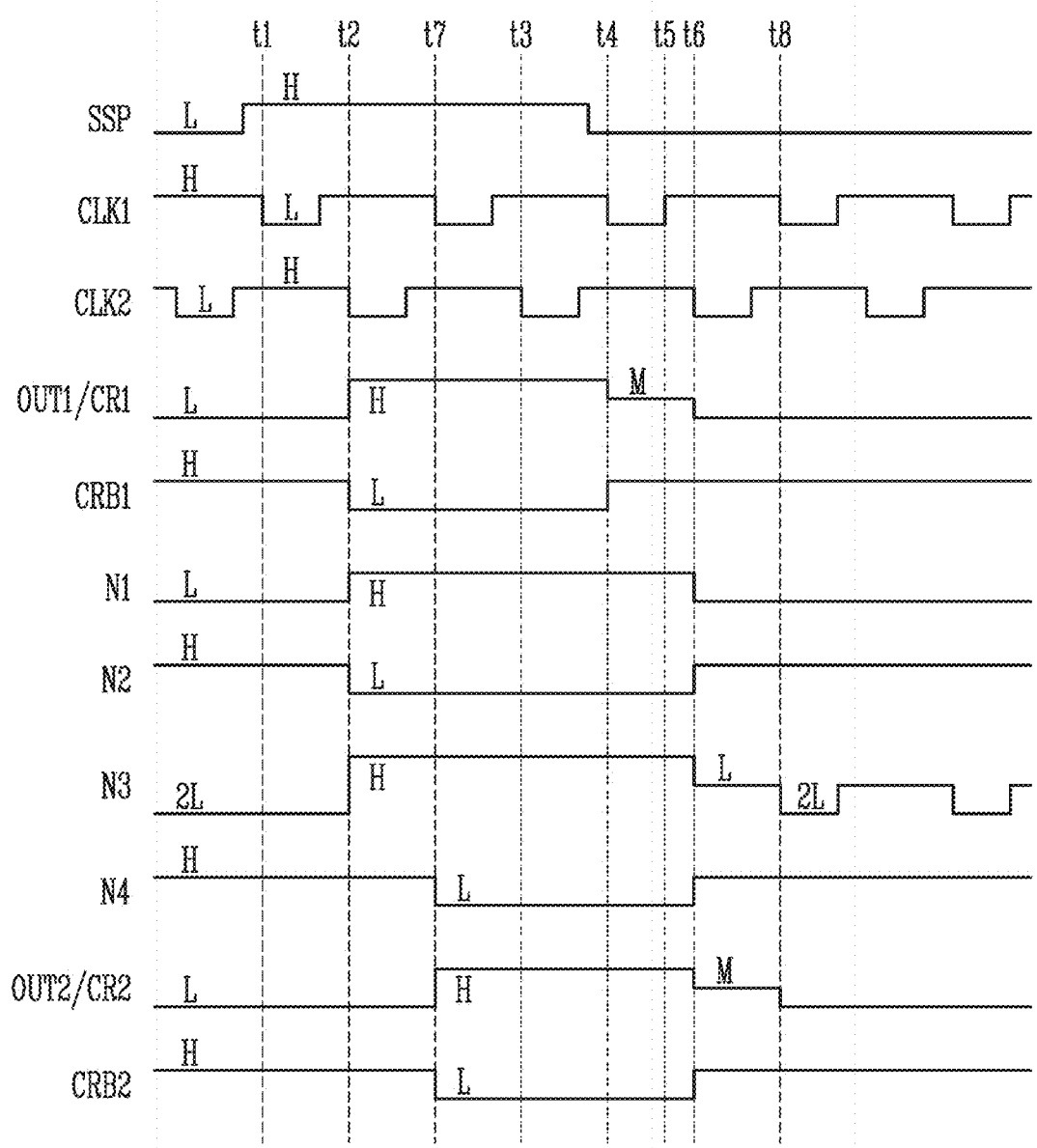
FIG. 13 is a signal timing diagram illustrating an embodiment of signals for driving the second stage of FIG. 12.

FIG. 13 is a signal timing diagram illustrating an embodiment of signals for driving the second stage of FIG. 12.

Referring to FIGS. 12 and 13, the first stage ST1A may output the first output signal OUT1, the first carry signal CR1, and the first inverted carry signal CRB1, and the second stage ST2A may output the second output signal OUT2, the second carry signal CR2, and the second inverted carry signal CRB2.

The first inverted carry signal CRB1 may correspond to the voltage of the fourth node NN4 of the first stage ST1A. Similarly, the second inverted carry signal CRB2 may correspond to the voltage of the fourth node N4 of the second stage ST2A. In such an embodiment, a pulse toggling (swing) of the first inverted carry signal CRB1 and the second inverted carry signal CRB2 in the period between the second time point t2 and the sixth time point t6 shown in FIG. 5 may be removed.

Therefore, the stages ST1A and ST2A of FIG. 12 may have more reduced power consumption than the stages ST1 and ST2 of FIG. 3.

Figure 14:
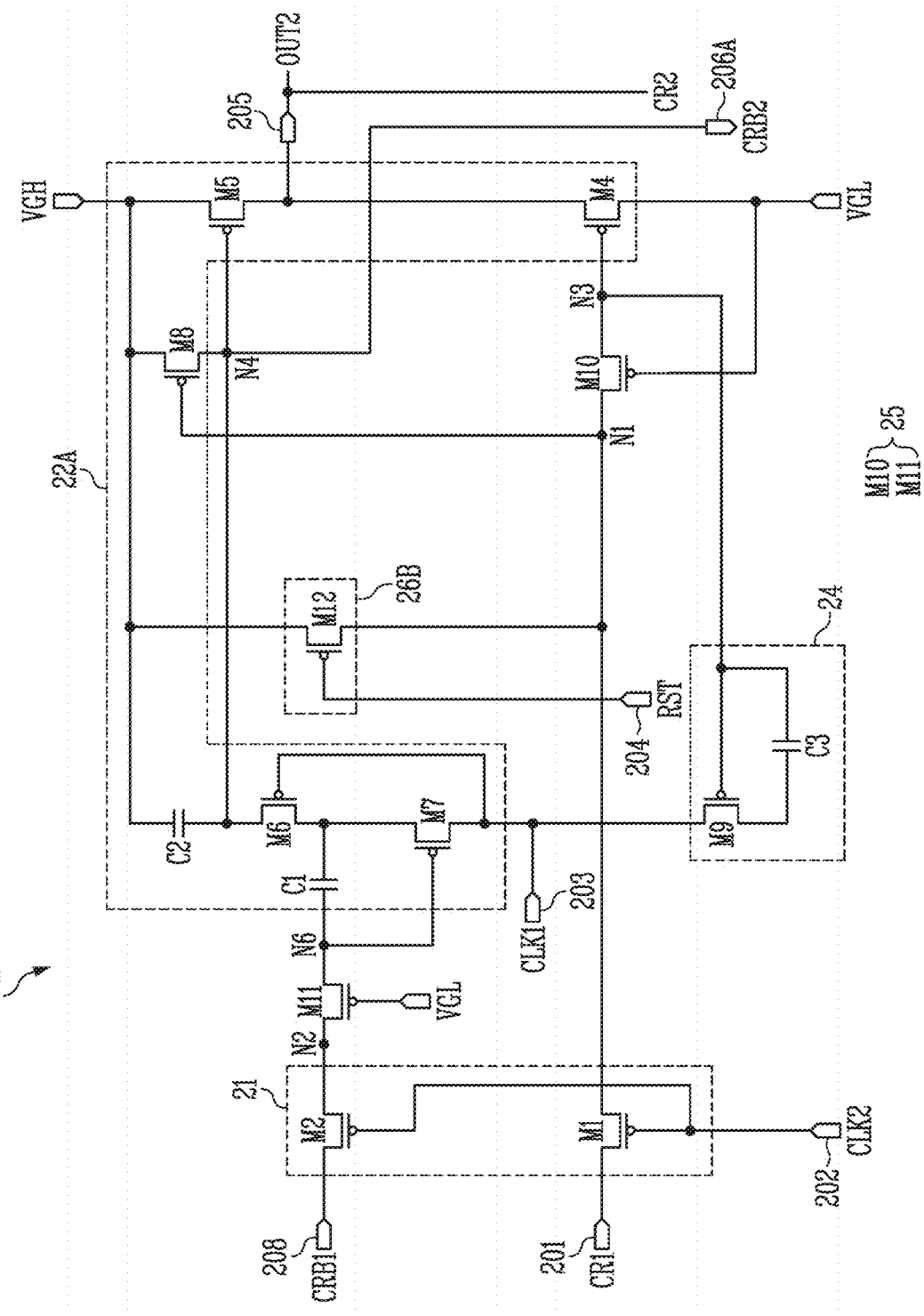
FIG. 14 is a circuit diagram illustrating an alternative embodiment of the second stage of FIG. 12.

FIG. 14 is a circuit diagram illustrating an alternative embodiment of signals for the second stage of FIG. 12.

In FIG. 14, the same reference numerals are used for the same components as those described with reference to FIGS. 3, 10, and 12, and any repetitive detailed description of such components will be omitted. In addition, the second stage ST2A_1 of FIG. 14 may have a configuration substantially the same as or similar to that of the second stage ST2A of FIG. 12 except for a configuration in which the thirteenth transistor M13 is omitted.

Referring to FIGS. 6 and 14, an embodiment of the second stage ST2A_1 may include the input circuit 21, the output circuit 22A, the control circuit 24, the stabilizing circuit 25, and an initialization circuit 26B.

In an embodiment, the initialization circuit 26B may have a configuration in which the thirteenth transistor M13 of FIGS. 3 and 9 is omitted. Therefore, a manufacturing cost of the scan driver (gate driver) may be reduced.

Figure 15:
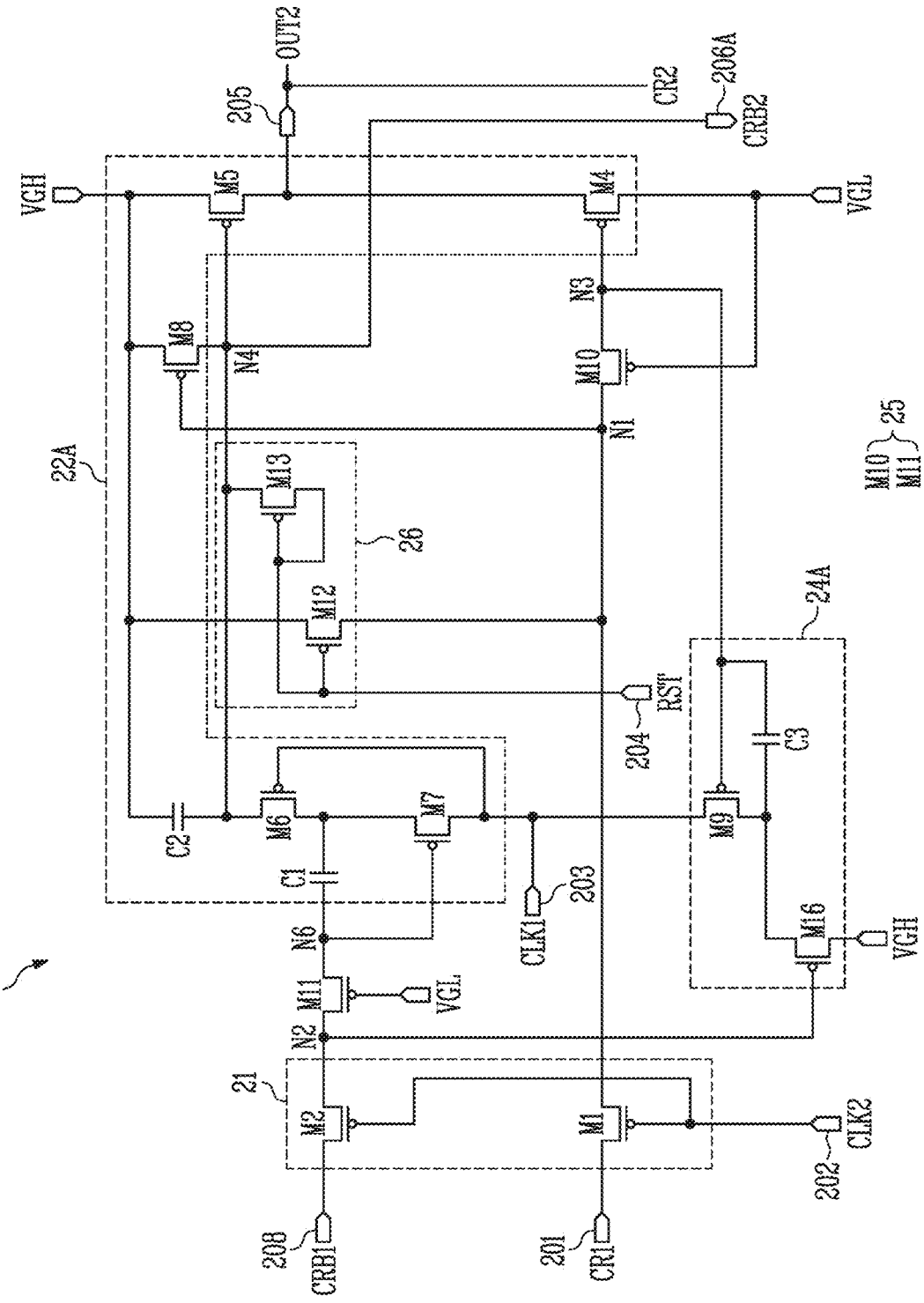
FIG. 15 is a circuit diagram illustrating another alternative embodiment of the second stage of FIG. 12.

In addition, the initialization circuit 26B may also be applied to the second stage ST2A_2 of FIG. 15. In another alternative embodiment, the initialization circuit 26A of FIG. 8 may also be applied to the second stage ST2A_1 in place of the initialization circuit 26B.

FIG. 15 is a circuit diagram illustrating another alternative embodiment of the second stage of FIG. 12.

In FIG. 15, the same reference numerals are used for the same components as those described with reference to FIGS. 3, 9, and 12, and any repetitive detailed description of such components will be omitted. In addition, the second stage ST2A_2 of FIG. 15 may have a configuration substantially the same as or similar to that of the second stage ST2A of FIG. 12 except for a configuration of the sixteenth transistor M16.

Referring to FIGS. 5 and 15, an embodiment of the second stage ST2A_2 may include the input circuit 21, the output circuit 22A, the control circuit 24A, the stabilizing circuit 25, and the initialization circuit 26.

In an embodiment, the control circuit 24A may include the ninth transistor M9, the third capacitor C3, and the sixteenth transistor M16. The sixteenth transistor M16 may be connected between the second electrode of the ninth transistor M9 and the second power VGH. The gate electrode of the sixteenth transistor M16 may be connected to the second node N2.

Therefore, when outputting the second output signal OUT of the high level H, the voltage of the third node N3 may be stably maintained at the high level H, and the fourth transistor M4 may have a complete turn-off state.

The control circuit 24A may also be applied to the second stage ST2A_1 of FIG. 14.

Figure 16:
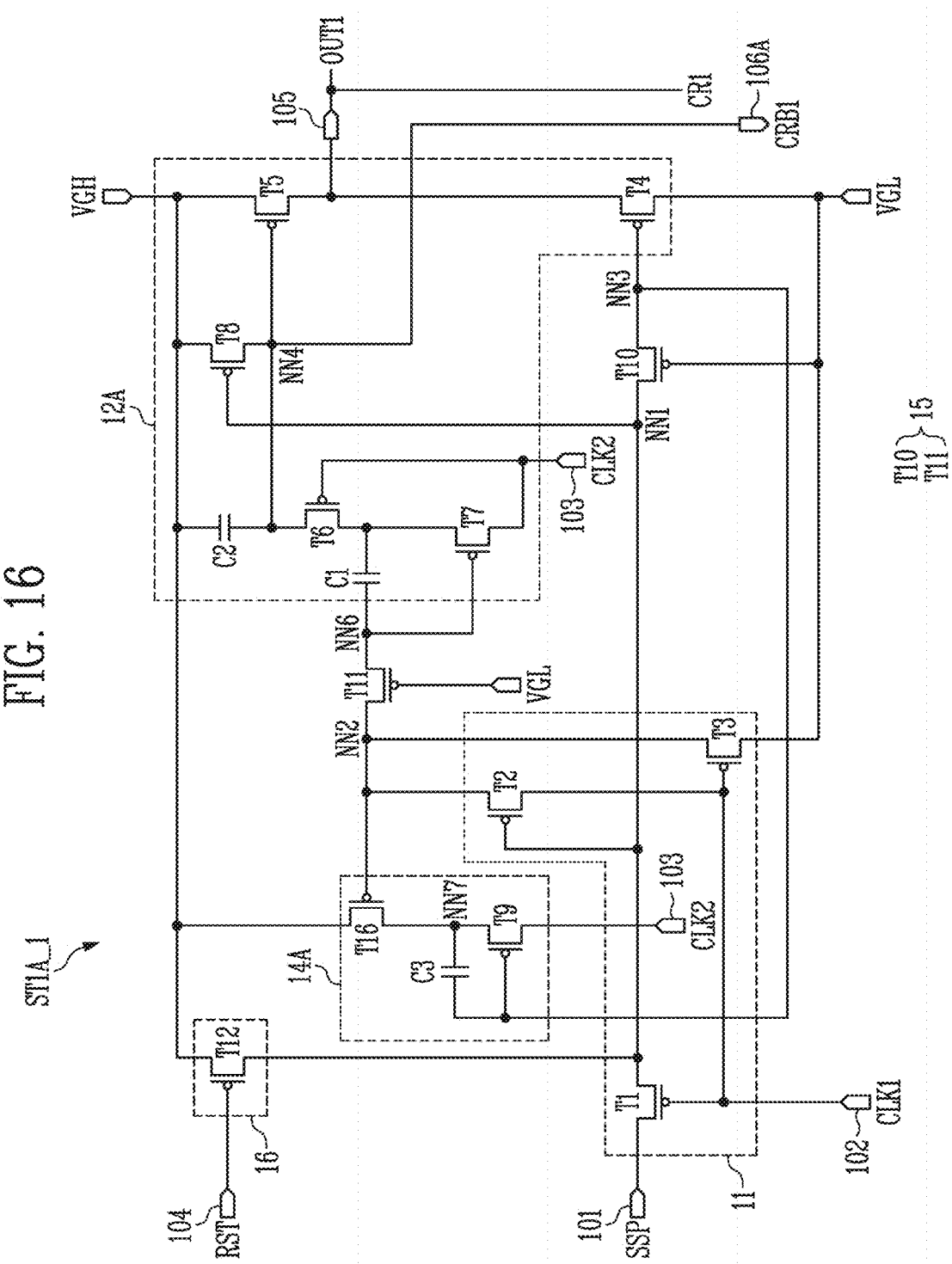
FIG. 16 is a circuit diagram illustrating an alternative embodiment of the first stage of FIG. 12.

FIG. 16 is a circuit diagram illustrating an alternative embodiment of signals for the first stage of FIG. 12.

In FIG. 16, the same reference numerals are used for the same components as those described with reference to FIGS. 3, 11, and 12, and any repetitive detailed description of such components will be omitted. In addition, the first stage ST1A_1 of FIG. 16 may have a configuration substantially the same as or similar to that of the first stage ST1A of FIG. 12 except for the configuration of the sixteenth transistor T16.

Referring to FIGS. 4 and 16, an embodiment of the first stage ST1A_1 may include the input circuit 11, the output circuit 12A, the control circuit 14A, the stabilizing circuit 15, and the initialization circuit 16.

In an embodiment, the control circuit 14A may include the ninth transistor T9, the third capacitor C3, and the sixteenth transistor T16.

The sixteenth transistor T16 may be connected between the seventh node NN7 and the second power VGH. The gate electrode of the sixteenth transistor T16 may be connected to the second node NN2. Therefore, when outputting the first output signal OUT1 of the high level H, the voltage of the third node NN3 may be stably maintained at the high level H, and the fourth transistor T4 may have a complete turn-off state.

Figure 17:
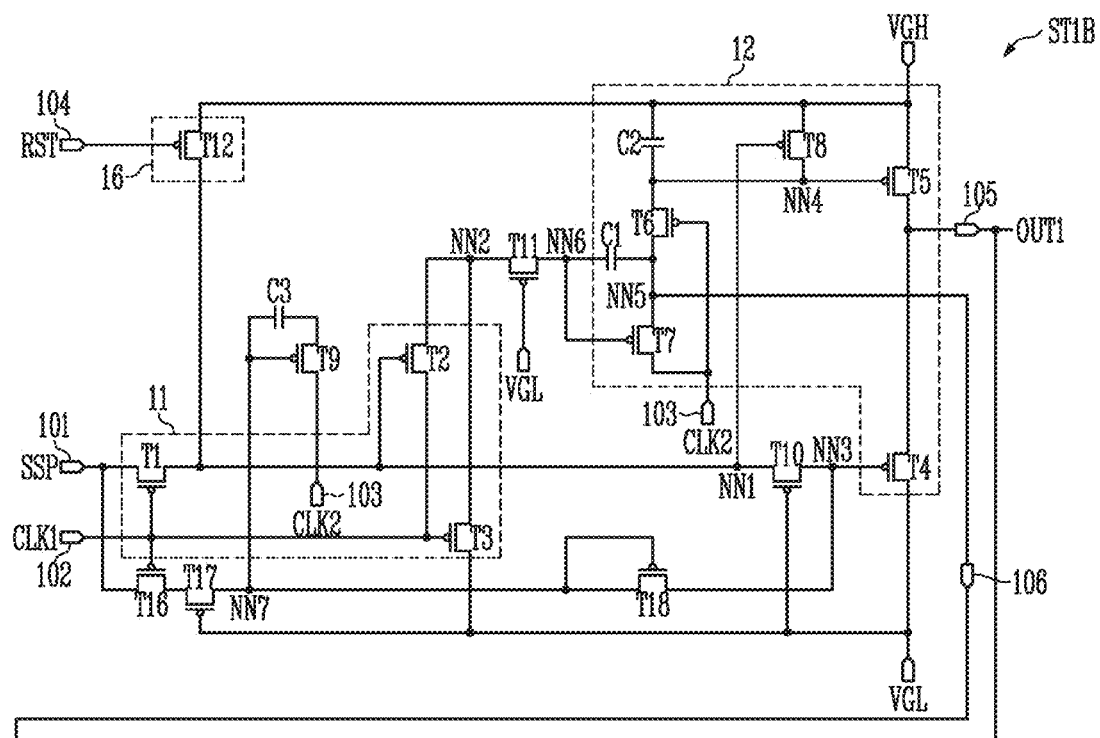
FIG. 17 is a circuit diagram illustrating another alternative embodiment of the first stage and the second stage included in the scan driver of FIG. 2A.
Figure 17:
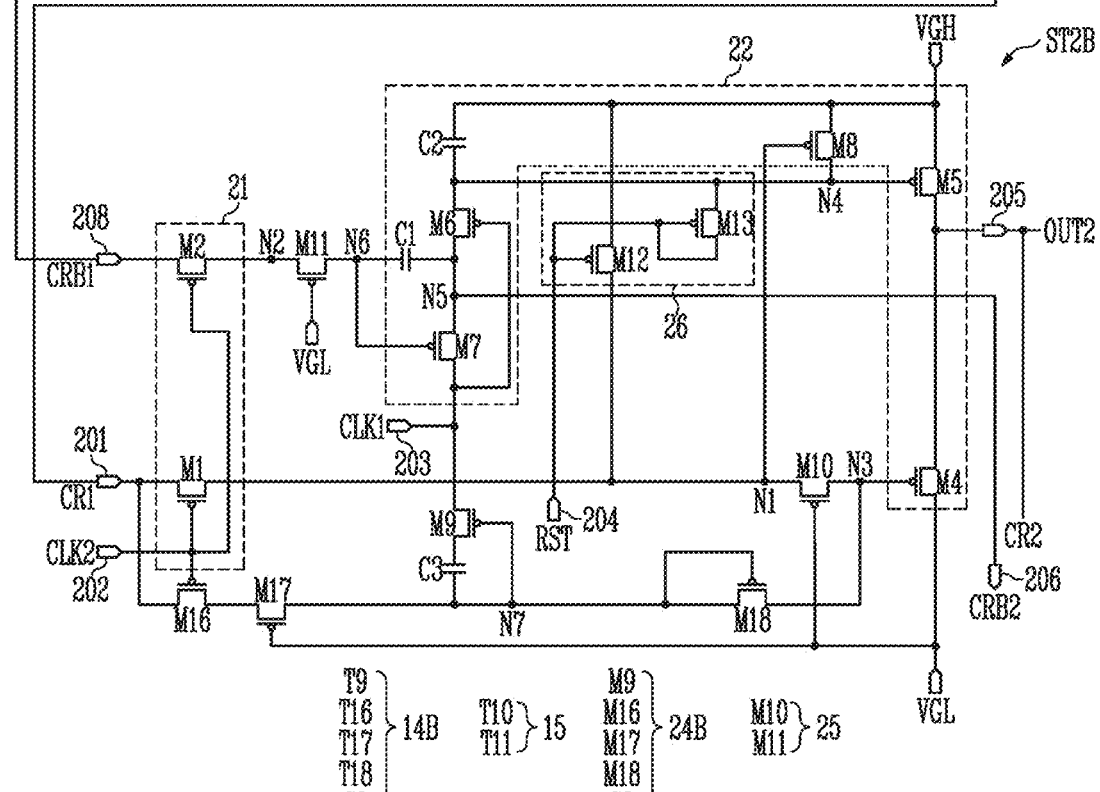

FIG. 17 is a circuit diagram illustrating another alternative embodiment of signals for the first stage and the second stage included in the scan driver of FIG. 2A.

In FIG. 17, the same reference numerals are used for same components as those described with reference to FIG. 3, and any repetitive detailed description of such components will be omitted or simplified. In addition, the first stage ST1B and the second stage ST2B of FIG. 17 may have a configuration substantially the same as or similar to that of the first stage ST1 and the second stage ST2 of FIG. 3 except for control circuits 14B and 24B.

Referring to FIG. 17, an embodiment of the first stage ST1B and the second stage ST2B may include the input circuits 11 and 21, the output circuits 12 and 22, the control circuits 14B and 24B, the stabilizing circuits 15 and 25, and the initialization circuits 16 and 26, respectively.

A configuration of the second stage ST26 may also be applied to the k-th stage (where k is an integer greater than 2).

Hereinafter, the first stage ST1B will be described in detail.

The first control circuit 14B may include the ninth transistor T9, the third capacitor C3, the sixteenth transistor T16, a seventeenth transistor T17, and an eighteenth transistor T18.

The sixteenth transistor T16 and the seventeenth transistor T17 may be connected between the first input terminal 101 and the seventh node NN7. The gate electrode of the sixteenth transistor T16 may be connected to the second input terminal 102, and a gate electrode of the seventeenth transistor T17 may be connected to the second power VGL.

The sixteenth transistor T16 may be turned on in response to the first clock signal CLK1 and may supply the start pulse SSP to the seventh node NN7.

The seventeenth transistor T17 may perform substantially the same function as the tenth transistor T10 of the stabilizing circuit 15. That is, the seventeenth transistor T17 may have a turn-on state, and may reduce a bias stress of the sixteenth transistor T16 due to a voltage change of the seventh node NN7. According to an embodiment, the seventeenth transistor T17 may be omitted.

The eighteenth transistor T18 may be connected between the seventh node NN7 and the third node NN3. A gate electrode of the eighteenth transistor T18 may be connected to the seventh node NN7.

In one embodiment, for example, the eighteenth transistor T18 may have a diode shape connected from the third node NN3 to the seventh node NN7. Therefore, a current does not flow from the seventh node NN7 to the third node NN3. Accordingly, in a reverse diode connection state of the eighteenth transistor T18, in which the voltage of the seventh node NN7 is higher than the voltage of the third node NN3, the voltage of the third node NN3 may be maintained relatively constant.

When a signal of the high level is supplied to the first input terminal 101, since the eighteenth transistor T18 serves as a reverse diode, the voltage of the seventh node NN7 does not affect the third node NN3.

The eighteenth transistor T18 may operate as a charge pump. In one embodiment, for example, the voltage of the seventh node NN7 having a form similar to an alternating current ("AC") voltage due to the coupling (charging/discharging) of the third capacitor C3 may be converted into a form such as a DC voltage in the third node NN3 through the eighteenth transistor T18.

Therefore, despite a voltage change of the seventh node NN7, the voltage of the third node NN3 may be maintained at a constant level (for example, 2-low level) by the charge pump operation of the eighteenth transistor T18.

The second stage ST2B may include the second input circuit 21, the second output circuit 22, a second control circuit 24B, the second stabilizing circuit 25, and the second initialization circuit 26.

The second control circuit 24B may include the ninth transistor M9, the third capacitor C3, the sixteenth transistor M16, a seventeenth transistor M17, and an eighteenth transistor M18. Since a configuration and an operation of the ninth transistor M9, the third capacitor C3, the sixteenth transistor M16, the seventeenth transistor M17, and the eighteenth transistor M18 are substantially the same as the ninth transistor T9, the third capacitor C3, the sixteenth transistor T16, the seventeenth transistor T17, and the eighteenth transistor T18 of the first control circuit 14B, any repetitive detailed description thereof will be omitted.

The sixteenth transistor M16 and the seventeenth transistor M17 may be connected between the first input terminal 201 and the seventh node N7. The gate electrode of the sixteenth transistor M16 may be connected to the second input terminal 202, and a gate electrode of the seventeenth transistor M17 may be connected to the second power VGL.

The eighteenth transistor M18 may be connected between the seventh node N7 and the third node N3. A gate electrode of the eighteenth transistor M18 may be connected to the seventh node N7.

Therefore, despite the voltage change of the seventh node N7, the voltage of the third node N3 may be maintained at a constant level (for example, 2-low level) by the charge pump operation of the eighteenth transistor M18.

Figure 18:
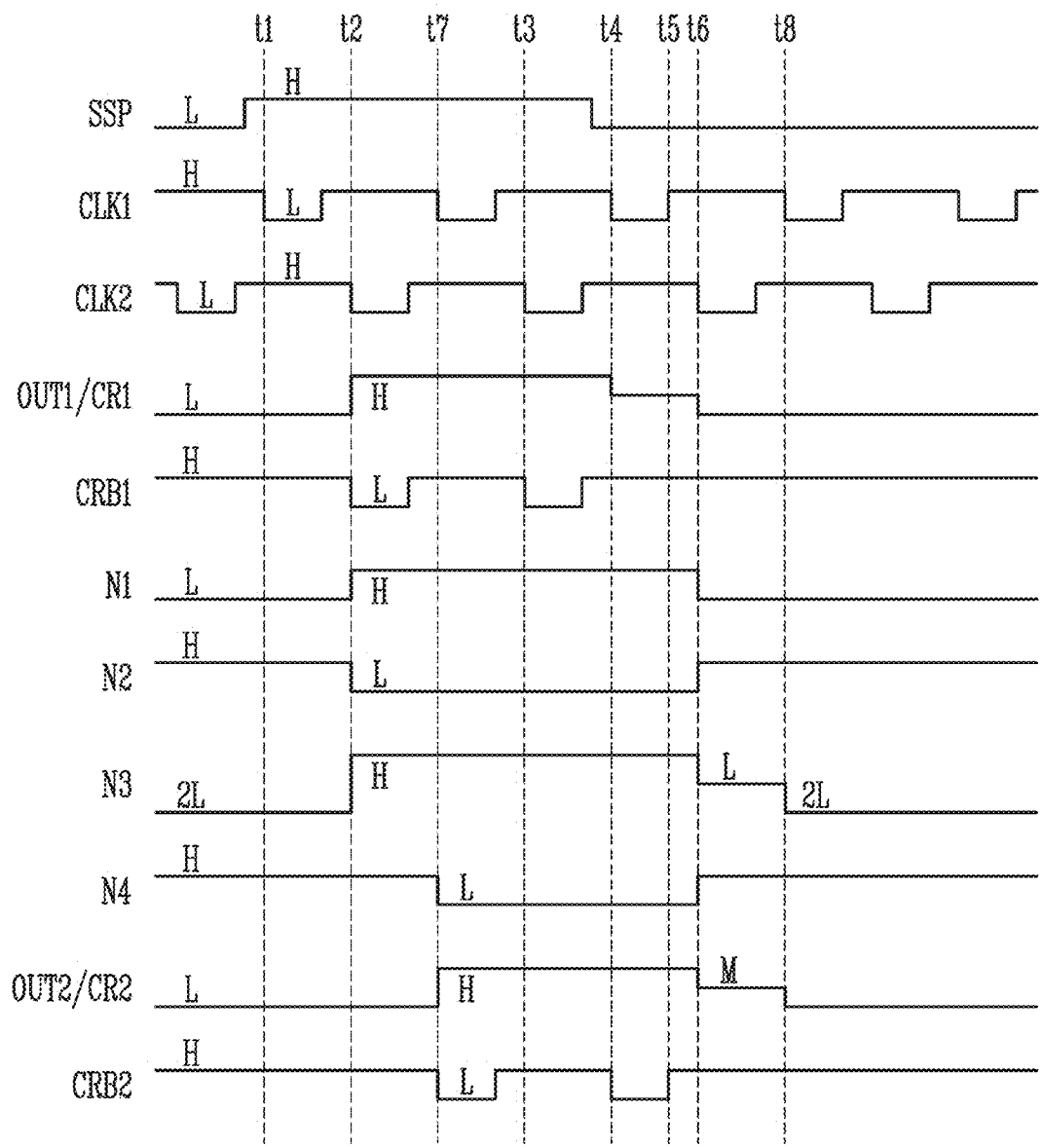
FIG. 18 is a signal timing diagram illustrating an embodiment of signals for driving the second stage of FIG. 17.

FIG. 18 is a signal timing diagram illustrating an embodiment of signals for driving the second stage of FIG. 17.

In FIG. 18, the same reference numerals are used for the same components as those described with reference to FIG. 5, and any repetitive detailed description of such components will be omitted. In addition, the driving of FIG. 18 may be substantially the same as or similar to the timing diagram of FIG. 5 except for the voltage of the third node N3 after the eighth time point t8.

Referring to FIGS. 17 and 18, the first stage ST1B may output the first output signal OUT1, the first carry signal CR1, and the first inverted carry signal CRB1, and the second stage ST2B may output the second output signal OUT2, the second carry signal CR2, and the second inverted carry signal CRB2.

Hereinafter, an embodiment of the driving of the second stage ST2B will be described. In such an embodiment, the driving from the first time point t1 to the sixth time point t6 may be substantially the same as the driving described with reference to FIG. 5.

As described above, the second control circuit 24B may control the voltage of the third node N3 after the eighth time point t8.

As described with reference to FIG. 5, the charge/discharge of the third capacitor C3 may be repeated by a voltage change of the first clock signal CLK1 supplied to the third input terminal 203 after the eighth time point t8, and a voltage waveform of the seventh node N7 may change in correspondence with the first clock signal CLK1.

In such an embodiment, when the voltage of the seventh node N7 is higher than the voltage of the third node N3, since the eighteenth transistor M18 becomes a reverse diode connection state, the third node N3 may not be affected by a voltage change of the seventh node N7. Therefore, after the eighth time point t8, the voltage of the third node N3 may maintain the 2-low level 2L due to a parasitic capacitance of the fourth transistor M4.

In such an embodiment, toggling (swing) of the voltage of the third node N3 of the second stage ST2B in a period after the eighth time point t8 shown in FIG. 5 may be removed. The same driving may be performed in the first stage ST1B having the same first control circuit 24A as the second control circuit 24B.

Therefore, the stages ST1B and ST2B of FIG. 17 may have more reduced power consumption than the stages ST1 and ST2 of FIG. 3. In addition, the low level L of the output signals OUT1 and OUT2 may be stably output, and thus image quality may be improved.

Figure 19:
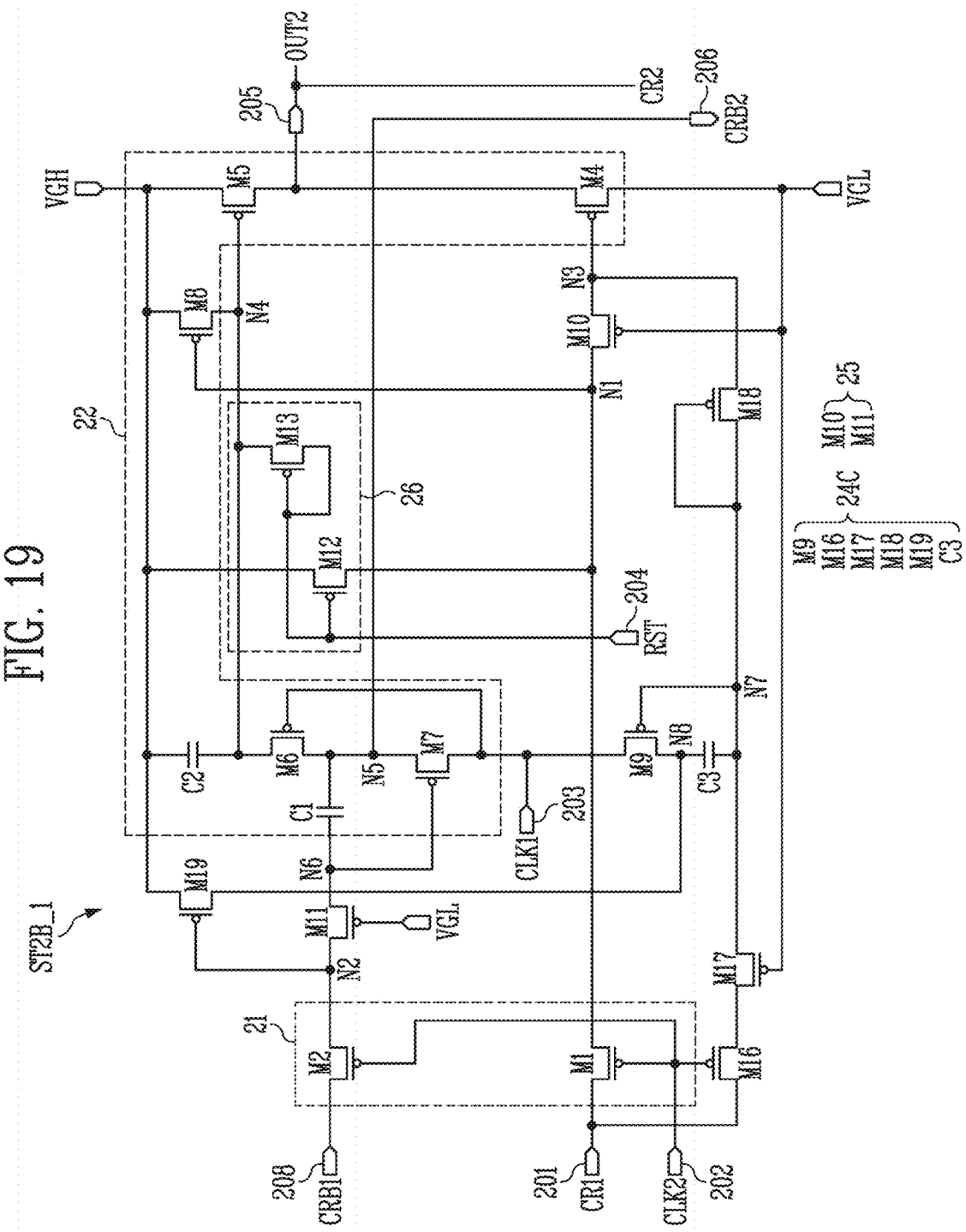
FIG. 19 is a circuit diagram illustrating an alternative embodiment of the second stage of FIG. 17.

FIG. 19 is a circuit diagram illustrating an alternative embodiment of signals for the second stage of FIG. 17.

In FIG. 19, the same reference numerals are used for the same components as those described with reference to FIGS. 3 and 17, and any repetitive detailed description of such components will be omitted. In addition, the second stage ST2B_1 of FIG. 19 may have a configuration substantially the same as or similar to that of the second stage ST2B of FIG. 17 except for a nineteenth transistor M19.

Referring to FIGS. 18 and 19, an embodiment of the second stage ST2B_1 may include the input circuit 21, the output circuit 22, a control circuit 24C, the stabilizing circuit 25, and the initialization circuit 26.

In an embodiment, the control circuit 24C may include the ninth transistor M9, the third capacitor C3, the sixteenth transistor M16, the seventeenth transistor M17, the eighteenth transistor M18, and a nineteenth transistor M19.

The nineteenth transistor M19 may be connected between the second power VGH and the eighth node N8. One electrode of the ninth transistor M9 and one electrode of the third capacitor C3 may be connected to the eighth node N8. A gate electrode of the nineteenth transistor M19 may be connected to the second node N2. When the nineteenth transistor M19 is turned on, the voltage of the second power VGH may be supplied to the eighth node N8.

When the stage ST2B_1 starts up and/or when the second output signal OUT2 of the high level is output, the nineteenth transistor M19 may stably supply the voltage of the second power VGH to the eighth node N8. In one embodiment, for example, the voltage of the eighth node N8 may be initialized to the voltage of the second power VGH before an operation for image display.

According to an embodiment, the initialization circuit 26 may be replaced by the initialization circuit 26A of FIG. 8 or the initialization circuit 26B of FIG. 10.

Figure 20:
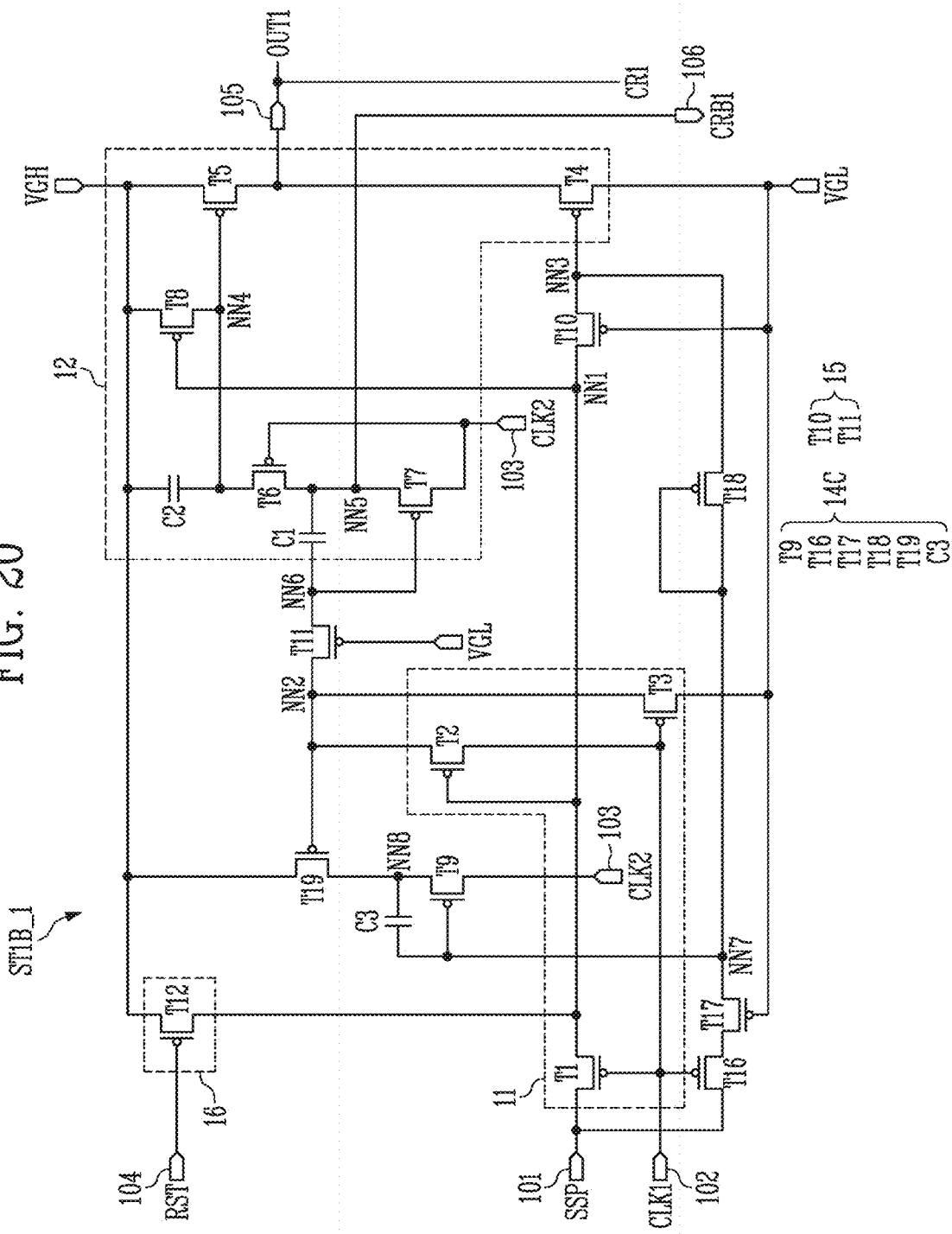
FIG. 20 is a circuit diagram illustrating an alternative embodiment of the first stage of FIG. 17.

FIG. 20 is a circuit diagram illustrating an alternative embodiment of signals for the first stage of FIG. 17.

In FIG. 20, the same reference numerals are used for the same components as those described with reference to FIGS. 3 and 17, and any repetitive detailed description of such components will be omitted. In addition, the first stage ST1B_1 of FIG. 20 may have a configuration substantially the same as or similar to that of the first stage ST1B of FIG. 17 except for a nineteenth transistor T19.

Referring to FIG. 20, an embodiment of the first stage ST1B_1 may include the input circuit 11, the output circuit 12, a control circuit 14C, the stabilizing circuit 15, and the initialization circuit 16.

In an embodiment, the control circuit 14C may include the ninth transistor T9, the third capacitor C3, the sixteenth transistor T16, the seventeenth transistor T17, the eighteenth transistor T18, and the nineteenth transistor T19.

The nineteenth transistor T19 may be connected between the second power VGH and the eighth node NH8. One electrode of the ninth transistor T9 and one electrode of the third capacitor C3 may be connected to the eighth node NH8. A gate electrode of the nineteenth transistor T19 may be connected to the second node NN2. When the nineteenth transistor T19 is turned on, the voltage of the second power VGH may be supplied to the eighth node NN8.

When the stage ST2B_1 starts up and/or when the first output signal OUT1 of the high level is output, the nineteenth transistor T19 may stably supply the voltage of the second power VGH to the eighth node NN8. In one embodiment, for example, the voltage of the eighth node NN8 may be initialized to the voltage of the second power VGH before the operation for the image display.

Figure 21:
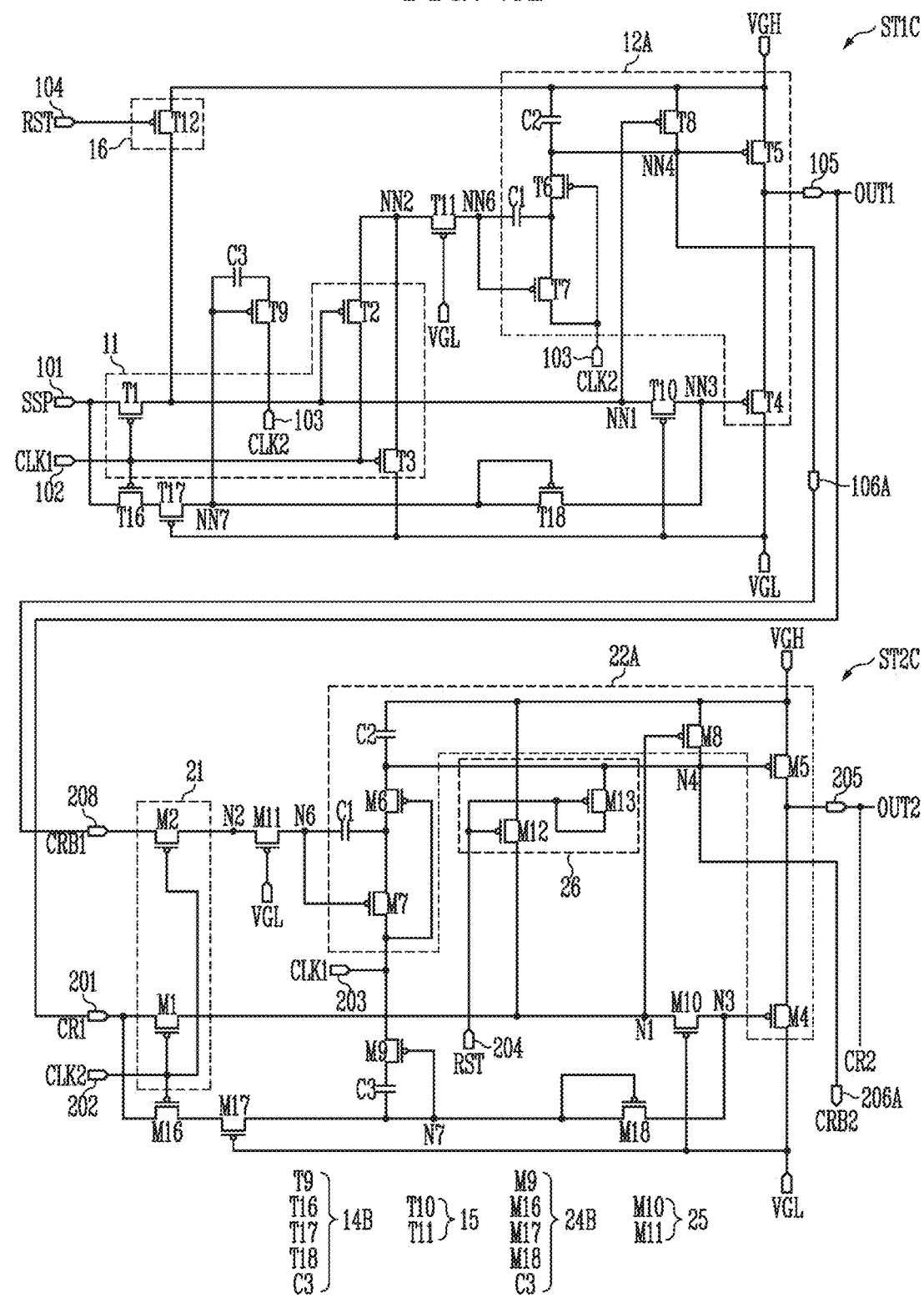
FIG. 21 is a circuit diagram illustrating another alternative embodiment of the first stage and the second stage included in the scan driver of FIG. 2A.

FIG. 21 is a circuit diagram illustrating another alternative embodiment of the first stage and the second stage included in the scan driver of FIG. 2A.

In FIG. 21, the same reference numerals are used for same components as those described with reference to FIGS. 3, 12, and 17, and any repetitive detailed description of such components will be omitted. In addition, the first stage ST1C and the second stage ST2C of FIG. 21 may have a configuration substantially the same as or similar to that of the first stage ST1B and the second stage ST2B of FIG. 17 except for the second output terminals 106A and 206A.

Referring to FIG. 21, an embodiment of the first stage ST1C and the second stage ST2C may include the input circuits 11 and 21, the output circuits 12A and 22A, the control circuits 14B and 24B, the stabilizing circuits 15 and 25, and the initialization circuits 16 and 26, respectively.

A configuration of the second stage ST2 may also be applied to the k-th stage (where k is an integer greater than 2).

In an embodiment, the second output terminal 106A of the first stage ST1C may be connected to the fourth node NN4. In such an embodiment, the second output terminal 206A of the second stage ST2C may be connected to the fourth node N4.

Figure 22:
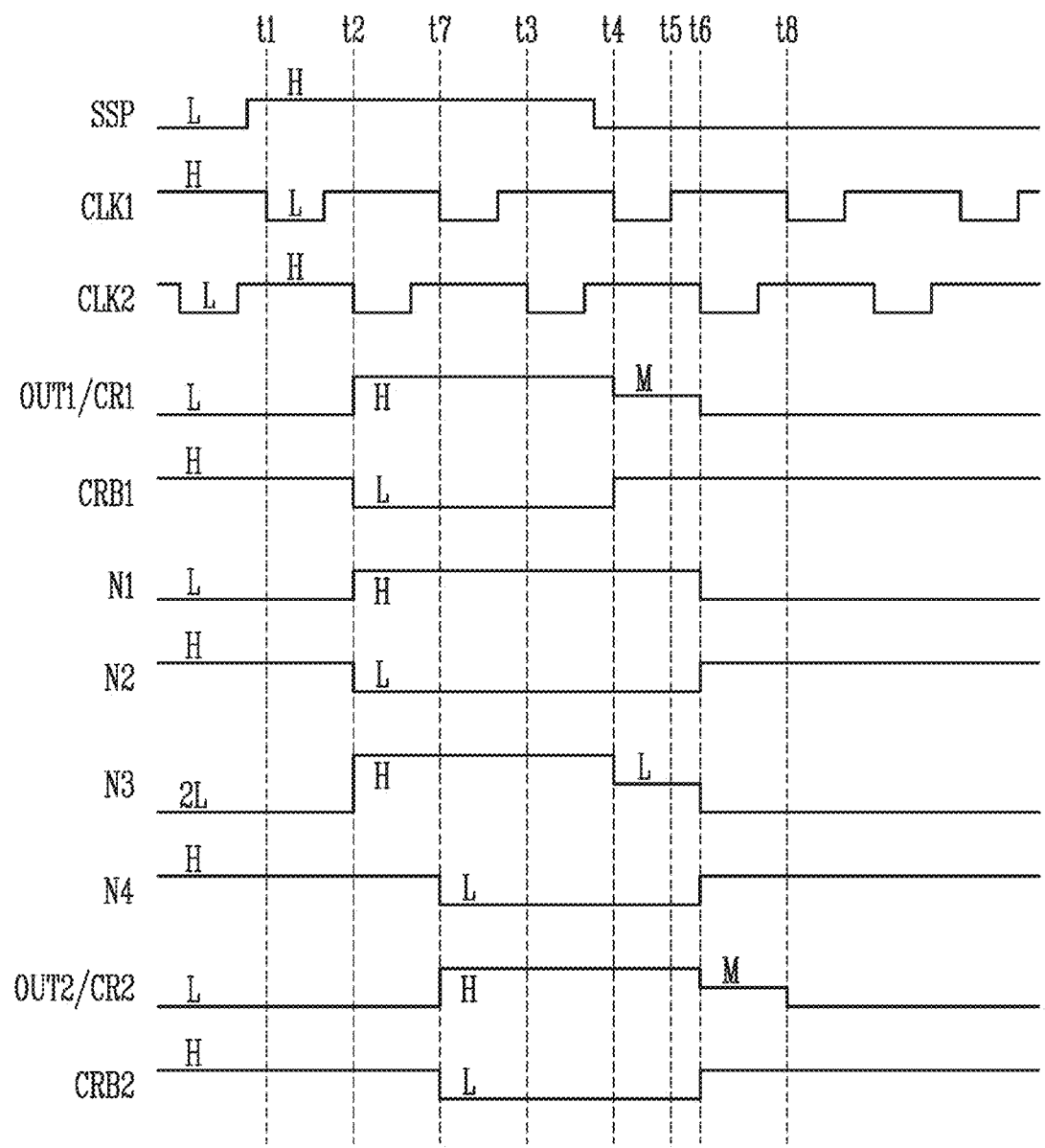
FIG. 22 is a signal timing diagram illustrating an embodiment of signals for driving the second stage of FIG. 21.

FIG. 22 is a signal timing diagram illustrating an embodiment of signals for driving the second stage of FIG. 21.

Referring to FIGS. 21 and 22, the first stage ST1C may output the first output signal OUT1, the first carry signal CR1, and the first inverted carry signal CRB1, and the second stage ST2C may output the second output signal OUT2, the second carry signal CR2, and the second inverted carry signal CRB2.

In an embodiment, the first inverted carry signal CRB1 may correspond to the voltage of the fourth node NN4 of the first stage ST1C. In such an embodiment, the second inverted carry signal CRB2 may correspond to the voltage of the fourth node N4 of the second stage ST2C. In such an embodiment, pulse toggling (swing) of the first inverted carry signal CR61 and the second inverted carry signal CRB2 in the period between the second time point t2 and the sixth time point t6 shown in FIG. 18 may be removed.

Therefore, the stages ST1C and ST2C of FIG. 21 may have more reduced power consumption than the stages ST1, ST2, ST1A, ST2A, ST1B, and ST26 of FIGS. 3, 12, and 17.

Figure 23:
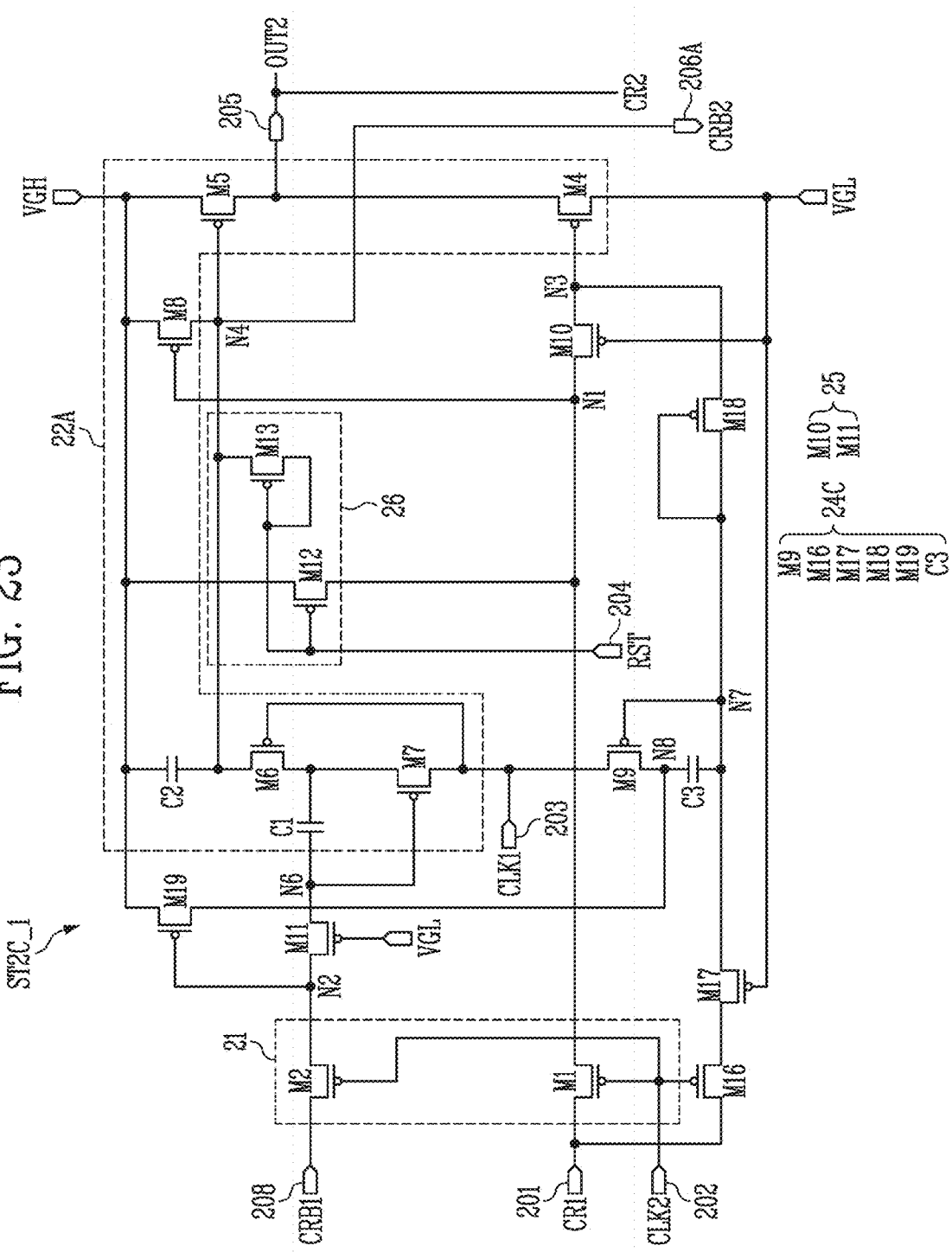
FIG. 23 is a circuit diagram illustrating an alternative embodiment of the second stage of FIG. 21.

FIG. 23 is a circuit diagram illustrating an alternative embodiment of the second stage of FIG. 21.

In FIG. 23, the same reference numerals are used for the same components as those described with reference to FIGS. 3, 17, 19, and 21, and any repetitive detailed description of such components will be omitted. In addition, the second stage ST2C_1 of FIG. 23 may have a configuration substantially the same as or similar to that of the second stage ST2C of FIG. 21 except for the nineteenth transistor M19.

Referring to FIGS. 22 and 23, an embodiment of the second stage ST2C_1 may include the input circuit 21, the output circuit 22A, a control circuit 24C, the stabilizing circuit 25, and the initialization circuit 26.

In an embodiment, the control circuit 24C may include the ninth transistor M9, the third capacitor C3, the sixteenth transistor M16, the seventeenth transistor M17, the eighteenth transistor M18, and the nineteenth transistor. M19.

When the stage ST2B_1 starts up and/or when the second output signal OUT2 of the high level is output, the nineteenth transistor M19 may stably supply the voltage of the second power VGH to the eighth node N8.

According to an embodiment, the initialization circuit 26 may be replaced by the initialization circuit 26A of FIG. 8 or the initialization circuit 26B of FIG. 10.

Figure 24:
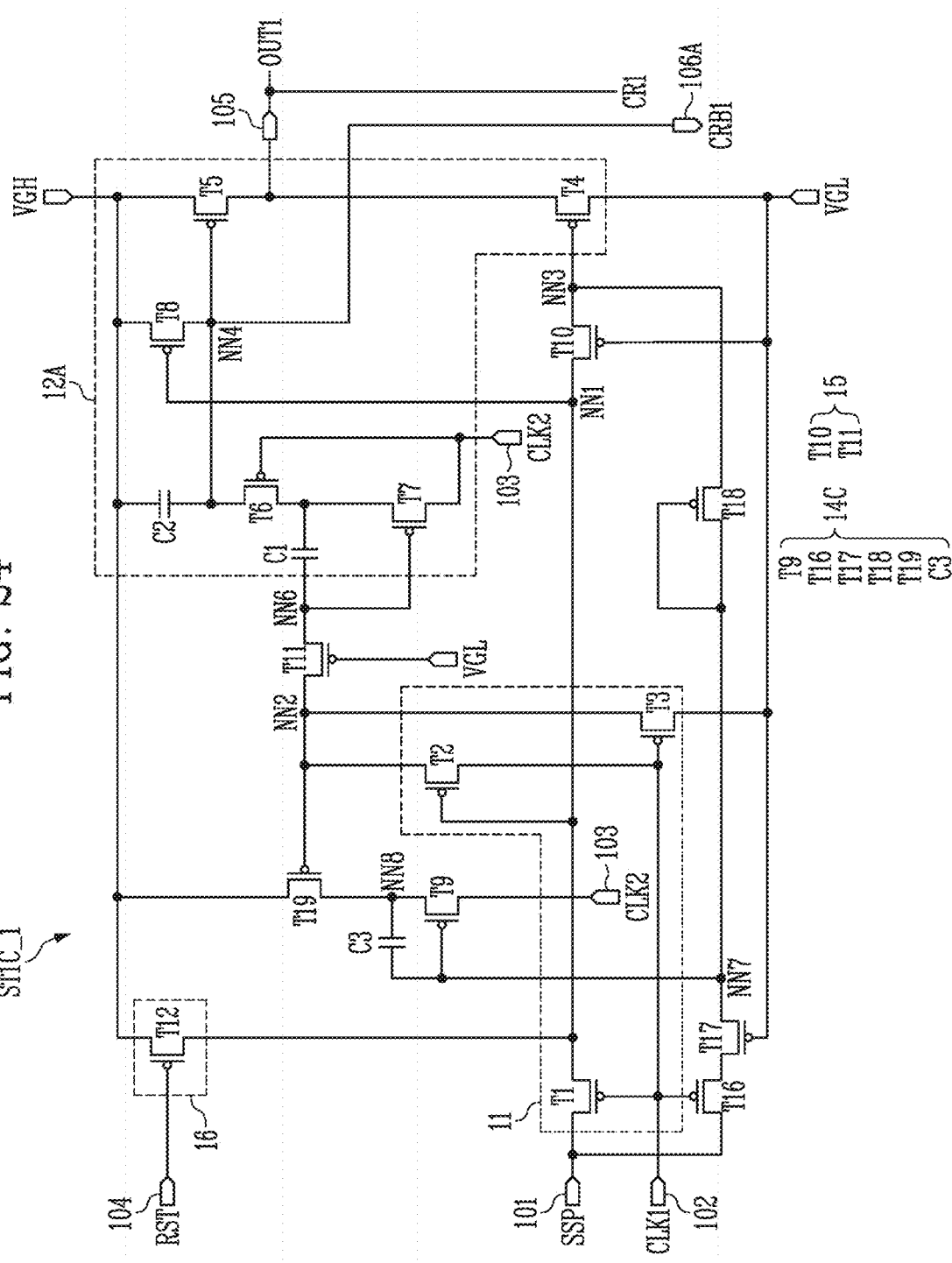
FIG. 24 is a circuit diagram illustrating an alternative embodiment of the first stage of FIG. 21.

FIG. 24 is a circuit diagram illustrating an alternative embodiment of the first stage of FIG. 21.

In FIG. 24, the same reference numerals are used for the same components as those described with reference to FIGS. 3, 17, 20, and 21, and any repetitive detailed description of such components will be omitted. In addition, the first stage ST1C_1 of FIG. 24 may have a configuration substantially the same as or similar to that of the first stage ST1C of FIG. 21 except for the nineteenth transistor T19.

Referring to FIG. 24, an embodiment of the first stage ST1C_1 may include the input circuit 11, the output circuit 12A, a control circuit 14C, the stabilizing circuit 15, and the initialization circuit 16.

In an embodiment, the control circuit 14C may include the ninth transistor T9, the third capacitor C3, the sixteenth transistor T16, the seventeenth transistor T17, the eighteenth transistor T18, and the nineteenth transistor T19.

When the stage ST2B_1 starts up and/or when the first output signal OUT1 of the high level is output, the nineteenth transistor T19 may stably supply the voltage of the second power VGH to the eighth node NN8.

Figure 25:
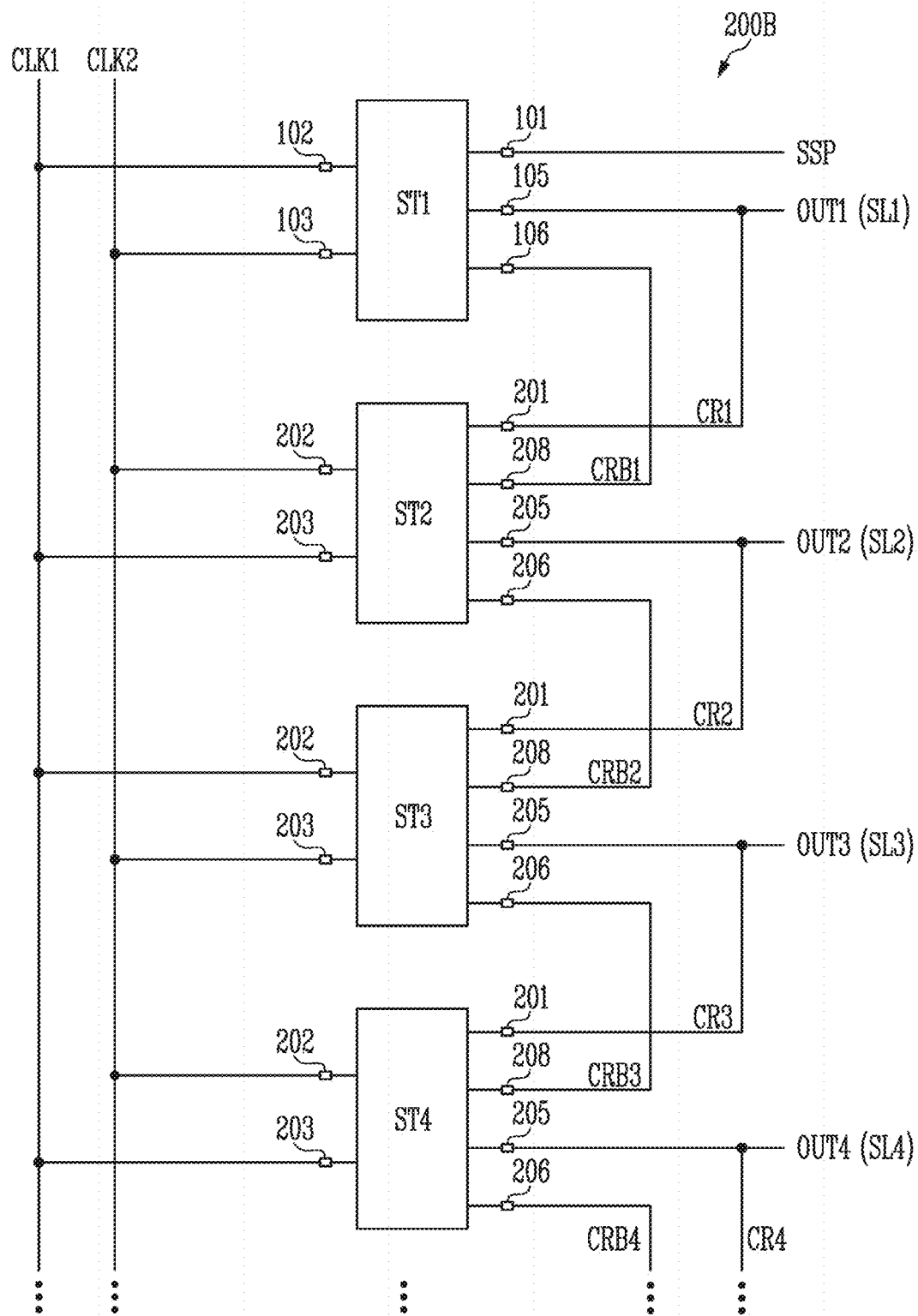
FIG. 25 is a block diagram illustrating the scan driver according to an alternative embodiment of the disclosure.

FIG. 25 is a block diagram illustrating the scan driver according to an alternative embodiment of the disclosure.

In FIG. 25, the same reference numerals are used for the same components as those described with reference to FIG. 2A, and any repetitive detailed description of such components will be omitted. In addition, the scan driver 200B of FIG. 25 may have a configuration substantially the same as or similar to that of the scan driver 200 of FIG. 2A except for a fourth input terminal receiving the reset signal RST.

Referring to FIG. 25, an embodiment of the scan driver 200B may include the plurality of stages ST1 to ST4. The stages ST1 to ST4 may be connected to predetermined scan lines SLU to SL4, respectively, and may output the scan signals in correspondence with the clock signals CLK1 and CLK2.

The first stage ST1 and the second stage ST2 may have different circuit configurations from each other.

Each of the stages ST1 to ST4 may include the first input terminals 101 and 201, the second input terminals 102 and 202, the third input terminals 103 and 203, the first output terminals 105 and 205, and the second output terminals 106 and 206. That is, compared to an embodiment described above with reference to FIG. 2A, in the stages ST1 to ST4 of FIG. 25, the fourth input terminals 104 and 204 of FIG. 2A for receiving the reset signal RST of FIG. 2A may be removed.

Therefore, a configuration for generating the reset signal is also may be omitted, and power consumption may be further reduced.

Figure 26:
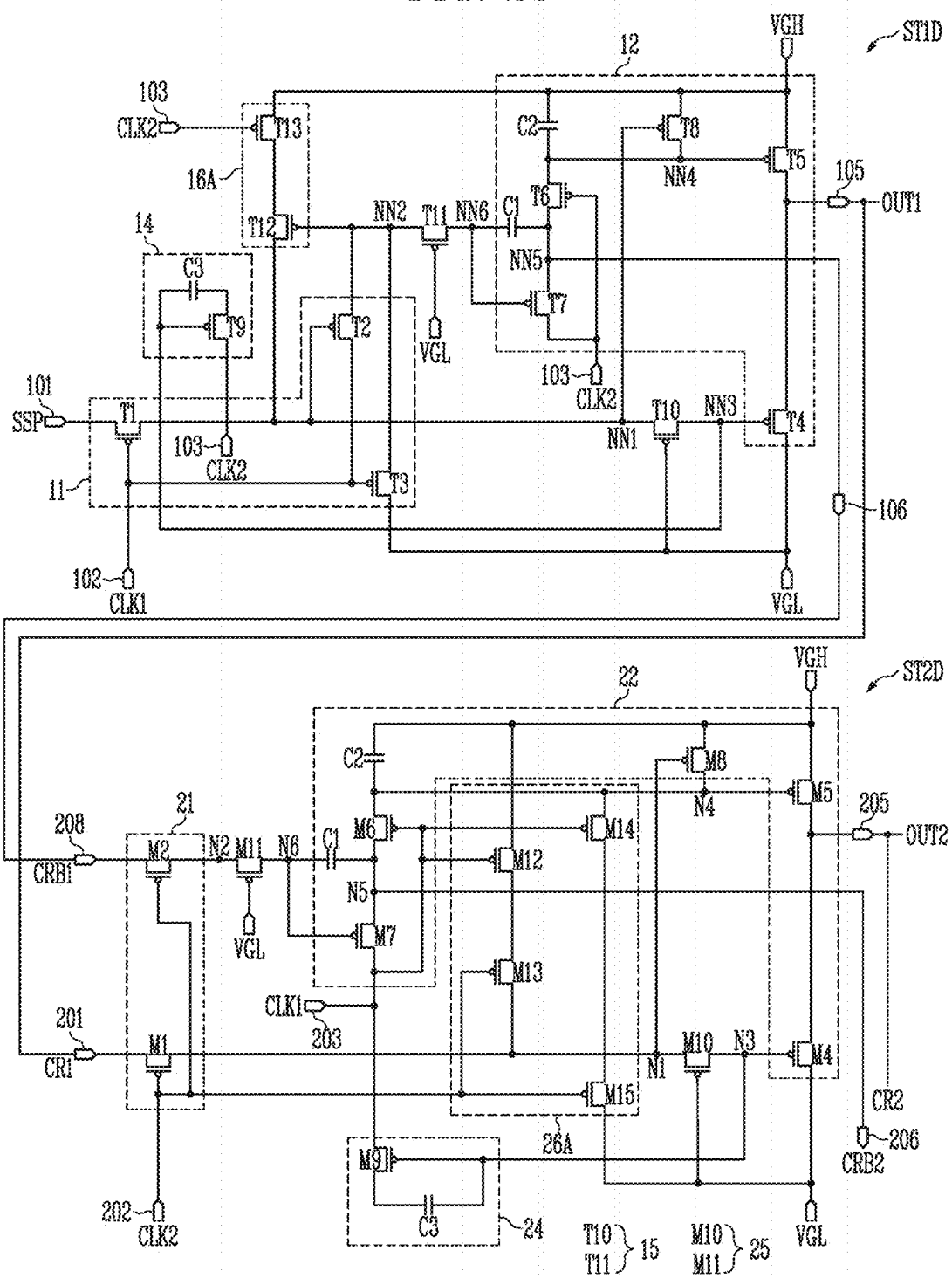
FIG. 26 is a circuit diagram illustrating an embodiment of the first stage and the second stage included in the scan driver of FIG. 25.

FIG. 26 is a circuit diagram illustrating an embodiment of the first stage and the second stage included in the scan driver of FIG. 25.

In FIG. 26, the same reference numerals are used for the same components as those described with reference to FIG. 3, and any repetitive detailed description of such components will be omitted. In addition, the first stage ST1D and the second stage ST2D of FIG. 17 may have a configuration substantially the same as or similar to that of the first stage ST1 and the second stage ST2 of FIG. 3 except for initialization circuits 16A and 26A.

Referring to FIGS. 25 and 26, an embodiment of the first stage ST1D and the second stage ST2D may include the input circuits 11 and 21, the output circuits 12 and 22, the control circuits 14 and 24, the stabilizing circuits 15 and 25, and the initialization circuits 16A and 26A, respectively.

A configuration of the second stage ST2D may also be applied to the k-th stage (where k is an integer greater than 2).

First, the first stage ST1D will be described.

In an embodiment, the first initialization circuit 16A may include the twelfth transistor T12 and the thirteenth transistor T13. The twelfth transistor T12 and the thirteenth transistor T13 may be connected in series between the second power VGH and the first node NN1. The gate electrode of the twelfth transistor T12 may be connected to the second node NN2, and the gate electrode of the thirteenth transistor T13 may be connected to the third input terminal 103.

During normal driving in which the phases of the first clock signal CLK1 and the second clock signal CLK2 do not overlap, the first initialization circuit 16A does not electrically connect the second power VGH and the first node NN1. The first initialization circuit 16A may supply the voltage of the second power VGH to the first node NN1 during the initialization period.

Hereinafter, the second stage ST2D will be described.

In an embodiment, the second initialization circuit 26A may include twelfth to fifteenth transistors M12 to M15.

The twelfth transistor M12 and the thirteenth transistor M13 may be connected in series between the second power VGH and the first node N1. Gate electrodes of the twelfth and thirteenth transistors M12 and M13 may be connected to different ones of the second input terminal 202 and the third input terminal, respectively. In one embodiment, for example, the gate electrode of the twelfth transistor M12 may be connected to the third input terminal 203, and the gate electrode of the thirteenth transistor M13 may be connected to the second input terminal 202. Therefore, during the normal driving in which the phases of the first clock signal CLK1 and the second clock signal CLK2 do not overlap, a turn-on period of the twelfth transistor M12 and a turn-on period of the thirteenth transistor M13 do not overlap.

The fourteenth transistor M14 and the fifteenth transistor M15 may be connected between the fourth node N4 and the first power VGL. Gate electrodes of the fourteenth and fifteenth transistors M14 and M15 may be connected to different ones of the second input terminal 202 and the third input terminal 203, respectively. In one embodiment, for example, the gate electrode of the fourteenth transistor M14 may be connected to the third input terminal 203, and the gate electrode of the fifteenth transistor M15 may be connected to the second input terminal 202. Therefore, during the normal driving in which the phases of the first clock signal CLK1 and the second clock signal CLK2 do not overlap, a turn-on period of the fourteenth transistor M14 and a turn-on period of the fifteenth transistor M15 do not overlap.

As described above, the scan driver 200B may include the initialization circuits 16A and 26A driven in the initialization period without a reset signal.

Figure 27:
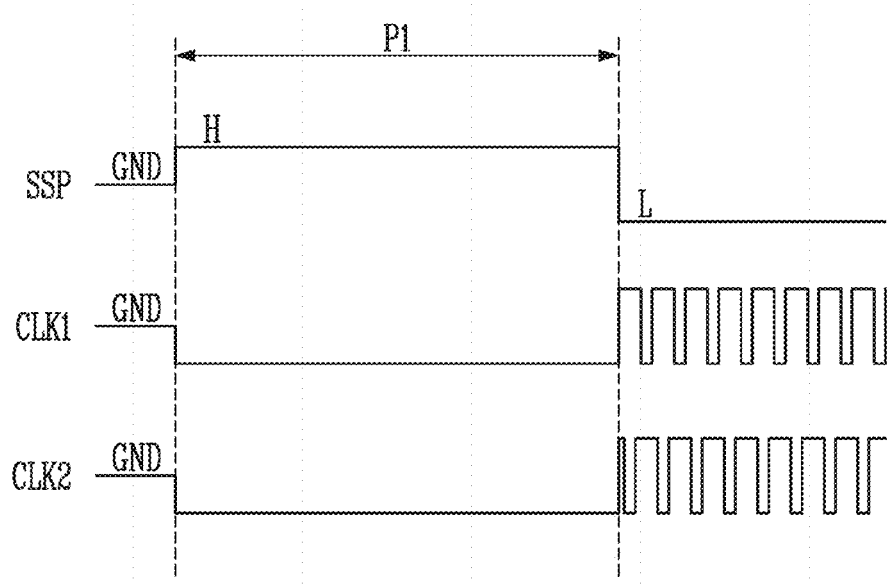
FIG. 27 is a signal timing diagram illustrating an embodiment of signals for driving the scan driver of FIG. 25 in the initialization period.

FIG. 27 is a signal timing diagram illustrating an embodiment of signals for driving the scan driver of FIG. 25 in the initialization period.

Referring to FIGS. 25 to 27, the first and second clock signals CLK1 and CLK2 of the low level L may be supplied during the initialization period P1.

In an embodiment, the initialization circuits 16A and 26A may supply the voltage of the second power VGH to the first nodes NN1 and N1 during the initialization period P1.

The twelfth transistor T12 and the thirteenth transistor T13 of the first initialization circuit 16A may be simultaneously turned on during the initialization period P1, and the voltage of the second power VGH may be supplied to the first node NN1.

The twelfth transistor M12 and the thirteenth transistor M13 of the second initialization circuit 26A may also be simultaneously turned on during the initialization period P1, and the voltage of the second power VGH may be supplied to the first node N1. The fourteenth transistor M14 and the fifteenth transistor M15 may also be simultaneously turned on during the initialization period P1, and the voltage of the first power VGL may be supplied to the fourth node N4.

In such an embodiment, as described above, the voltage of the first node N1 may be initialized to the high level H during the initialization period P1 without a reset signal.

Figure 28A:
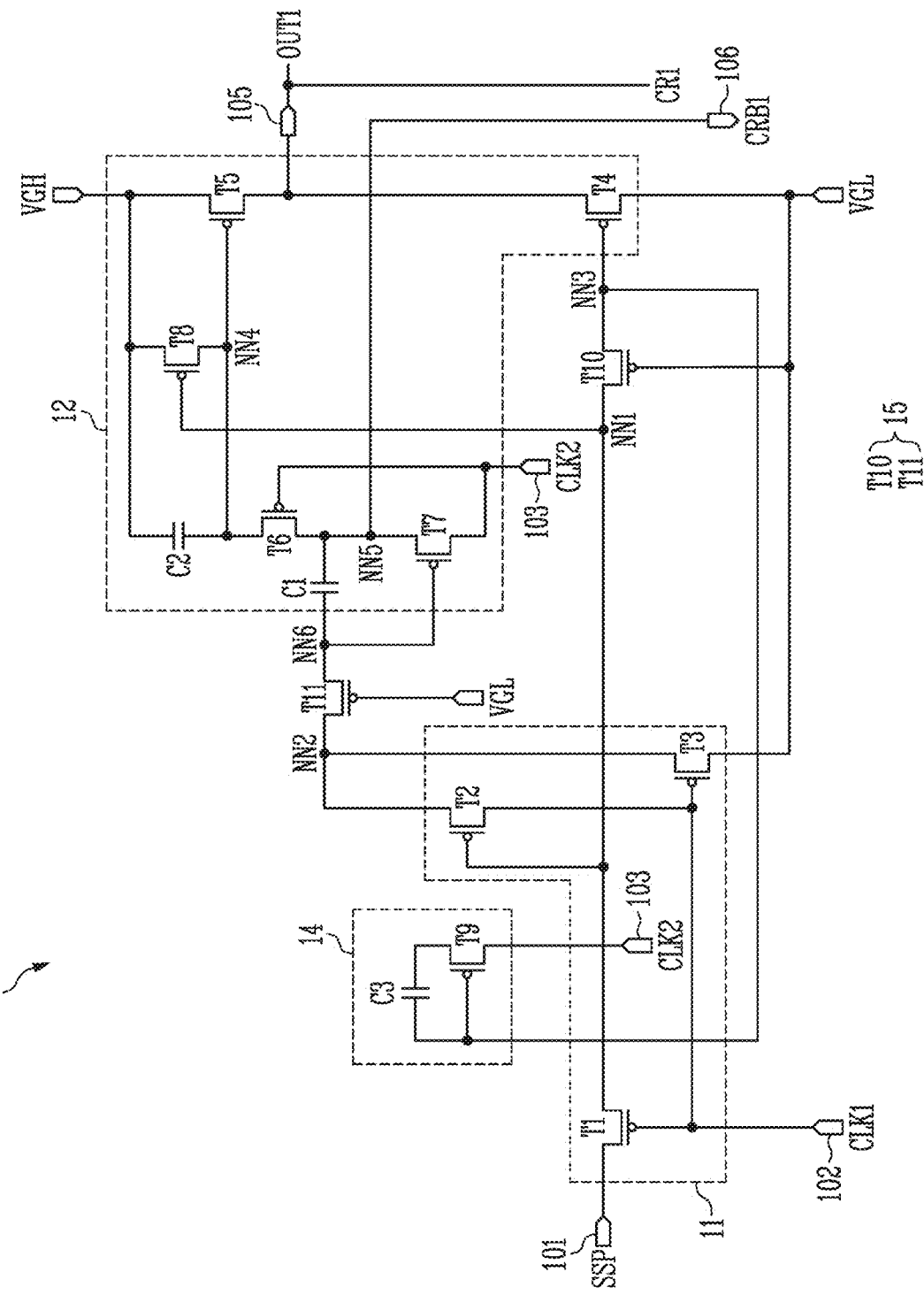
FIGS. 28A and 28B are circuit diagrams illustrating alternative embodiments of the first stage of FIG. 26.
Figure 28B:
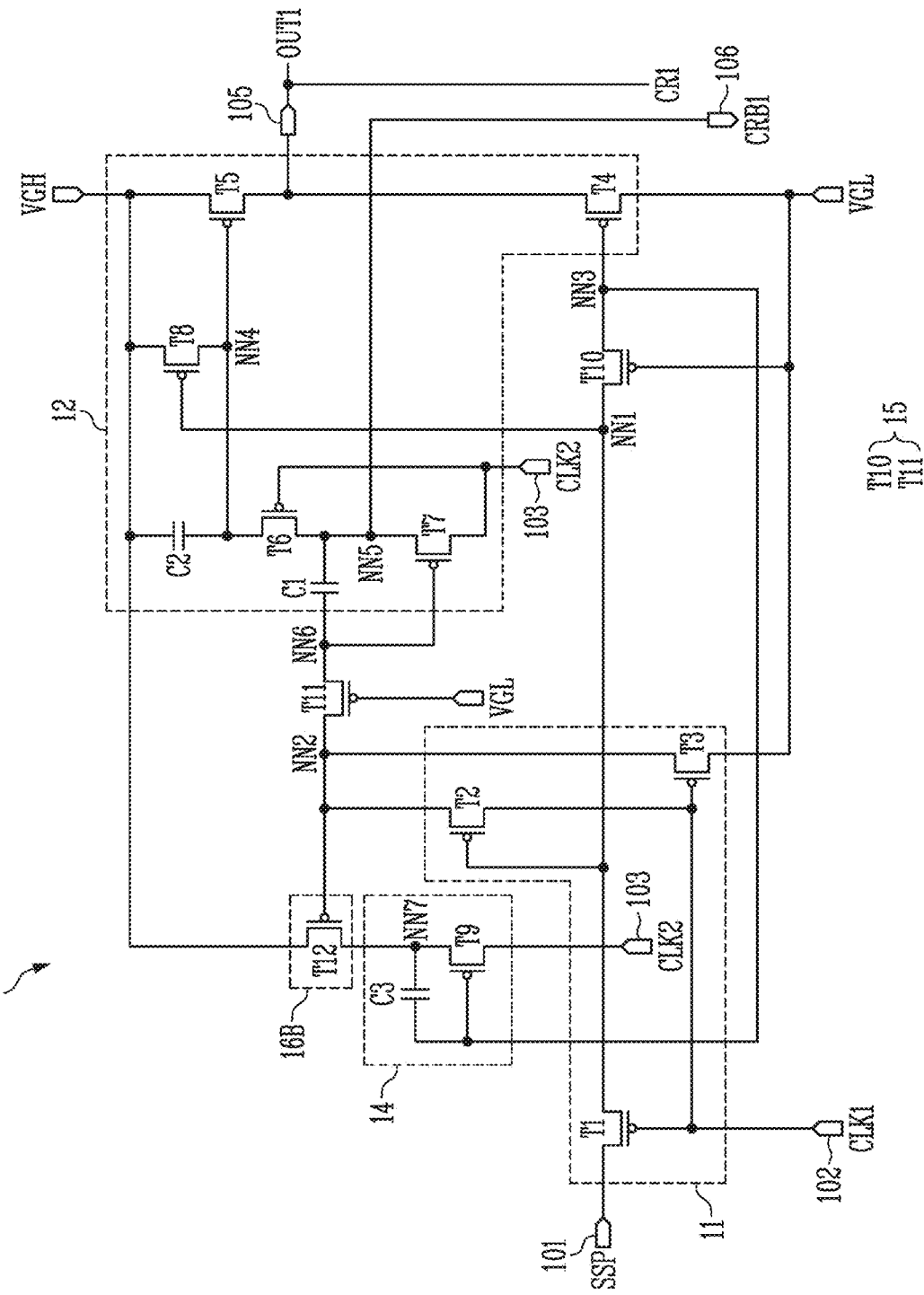

FIGS. 28A and 28B are circuit diagrams illustrating alternative embodiments of the first stage of FIG. 26.

The first stages ST1D_1 and ST1D_2 of FIGS. 28A and 28B may have a configuration substantially the same as or similar to that of the first stage ST1D of FIG. 26 except for an initialization circuit.

Referring to FIG. 28A, an embodiment of the first stage ST1D_1 may include the input circuit 11, the output circuit 12, the control circuit 14, and the stabilizing circuit 15. In such an embodiment, the first stage ST1D_2 does not include an initialization circuit, and an operation of an initialization period of the first stage ST1_D1 may be omitted.

Referring to FIG. 28B, an alternative embodiment of the first stage ST1D_2 may include the input circuit 11, the output circuit 12, the control circuit 14, the stabilizing circuit 15, and an initialization circuit 16B.

In such an embodiment, the initialization circuit 16B may include only the twelfth transistor T12. That is, the thirteenth transistor T13 of FIG. 26 may be removed, and the first stage ST1D_1 of a simpler structure may be implemented.

Figure 29:
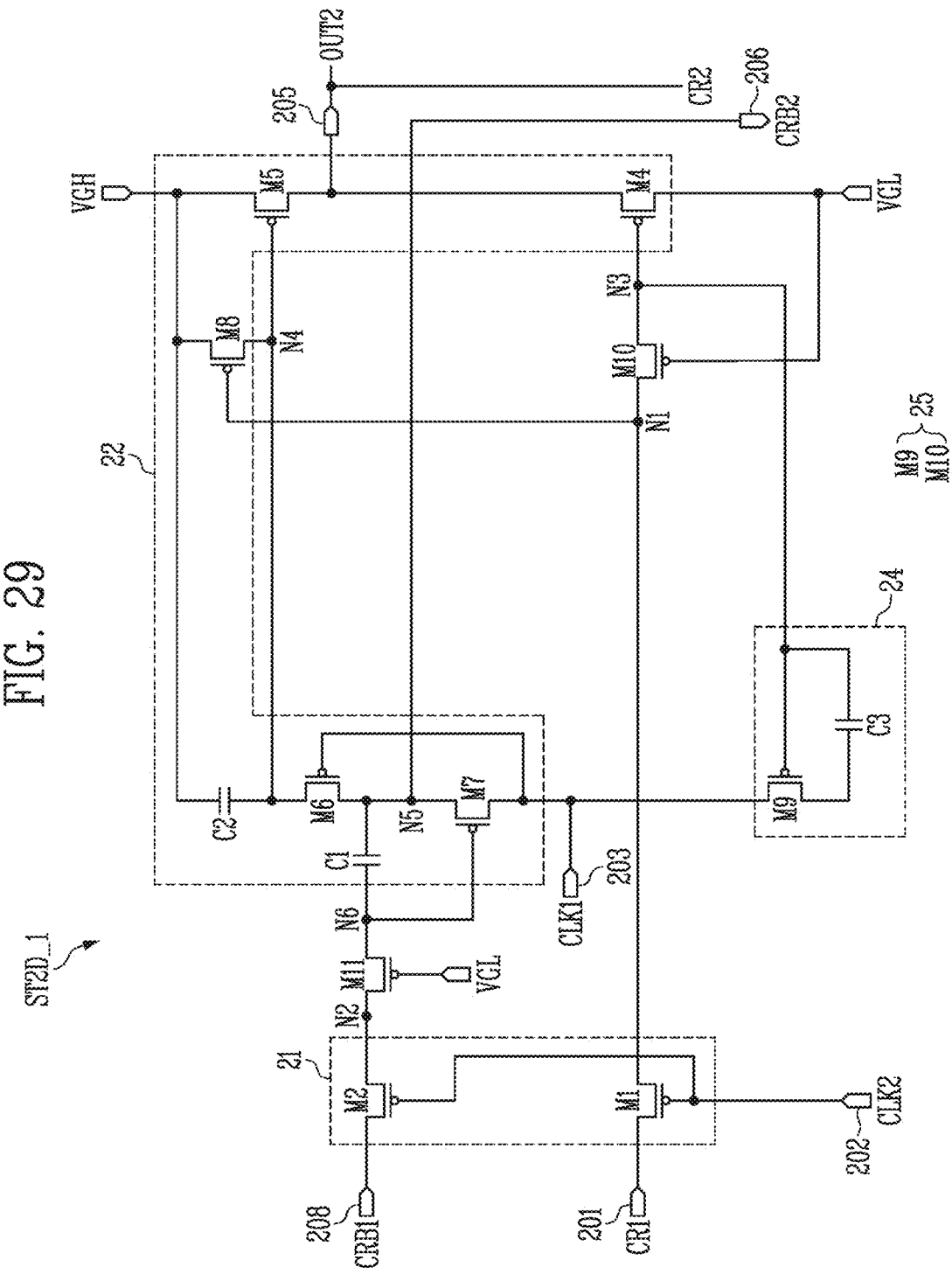
FIG. 29 is a circuit diagram illustrating an alternative embodiment of the second stage of FIG. 26.

FIG. 29 is a circuit diagram illustrating an alternative embodiment of the second stage of FIG. 26.

Referring to FIG. 29, an embodiment of the second stage ST2D_1 may include the input circuit 21, the output circuit 22, the control circuit 24, and the stabilizing circuit 25.

In such an embodiment, an initialization circuit may be omitted in the second stage ST2D_1.

In an embodiment, the output circuit 22 in the second stage ST2D_1 may be replaced with the output circuit 22A of FIG. 12. In addition, the control circuit 24 may be replaced with the control circuit 24A of FIG. 15, the control circuit 24B of FIG. 17, or the control circuit 24C of FIG. 19.

Figure 30:
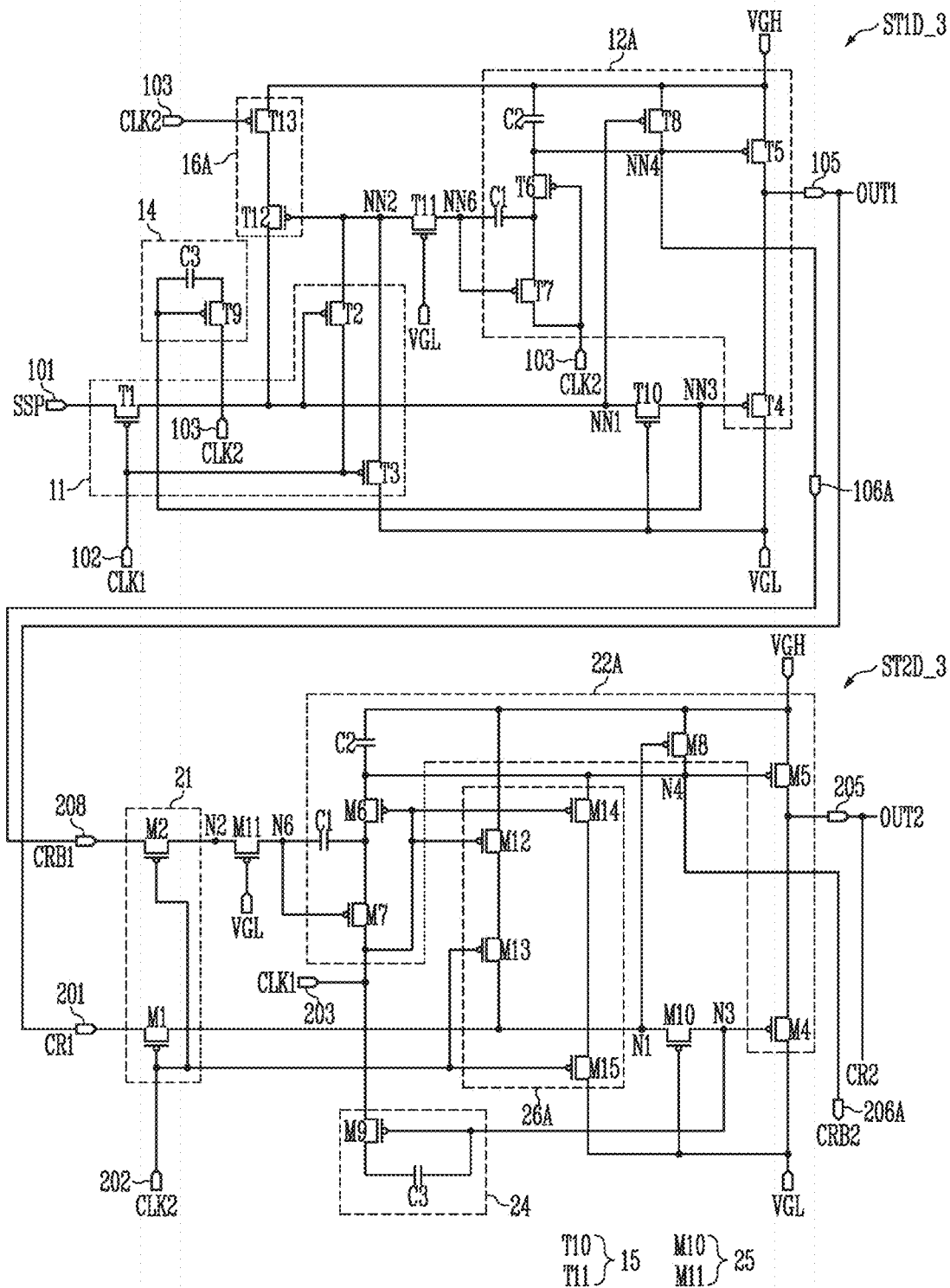
FIG. 30 is a circuit diagram illustrating another alternative embodiment of the first stage and the second stage included in the scan driver of FIG. 25.

FIG. 30 is a circuit diagram illustrating another alternative embodiment of the first stage and the second stage included in the scan driver of FIG. 25.

In FIG. 30, the same reference numerals are used for the same components as those described with reference to FIGS. 3, 12, and 26, and any repetitive detailed description of such components will be omitted. In addition, the first stage ST1D_3 and the second stage ST2D_3 of FIG. 30 may have a configuration substantially the same as or similar to that of the first stage STD and the second stage ST2D of FIG. 26 except for the second output terminals 106A and 206A.

Referring to FIG. 30, in an embodiment, the second output terminal 106A of the first stage ST1D_3 may be connected to the fourth node NN4. In such an embodiment, the second output terminal 206A of the second stage ST2D_3 may be connected to the fourth node N4. Accordingly, driving similar to that of the timing diagram of FIG. 13 may be performed.

Figure 31:
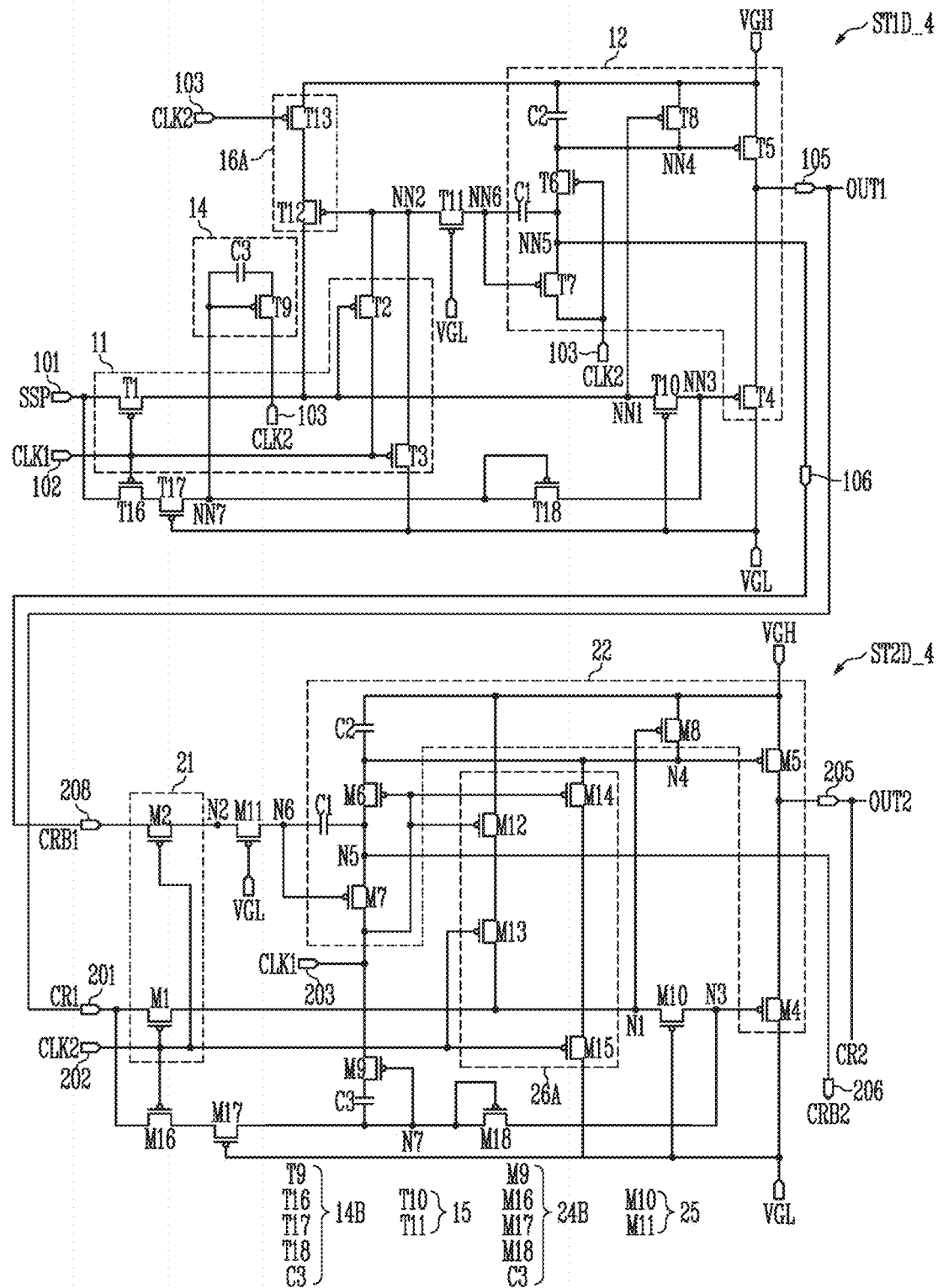
FIG. 31 is a circuit diagram illustrating another alternative embodiment of the first stage and the second stage included in the scan driver of FIG. 25.

FIG. 31 is a circuit diagram illustrating another alternative embodiment of the first stage and the second stage included in the scan driver of FIG. 25.

In FIG. 31, the same reference numerals are used for the same components as those described with reference to FIGS. 3, 17, and 26, and any repetitive detailed description of such components will be omitted. In addition, the first stage ST1D_4 and the second stage ST2D_4 of FIG. 31 may have a configuration substantially the same as or similar to that of the first stage STD and the second stage ST2D of FIG. 26 except for control circuits 14B and 24B.

Referring to FIG. 31, an embodiment of the first stage ST1D_4 may include the first control circuit 14B, and an embodiment of the second stage ST2D_4 may include the second control circuit 24B. Therefore, driving similar to that of the timing diagram of FIG. 18 may be performed.

Figure 32:
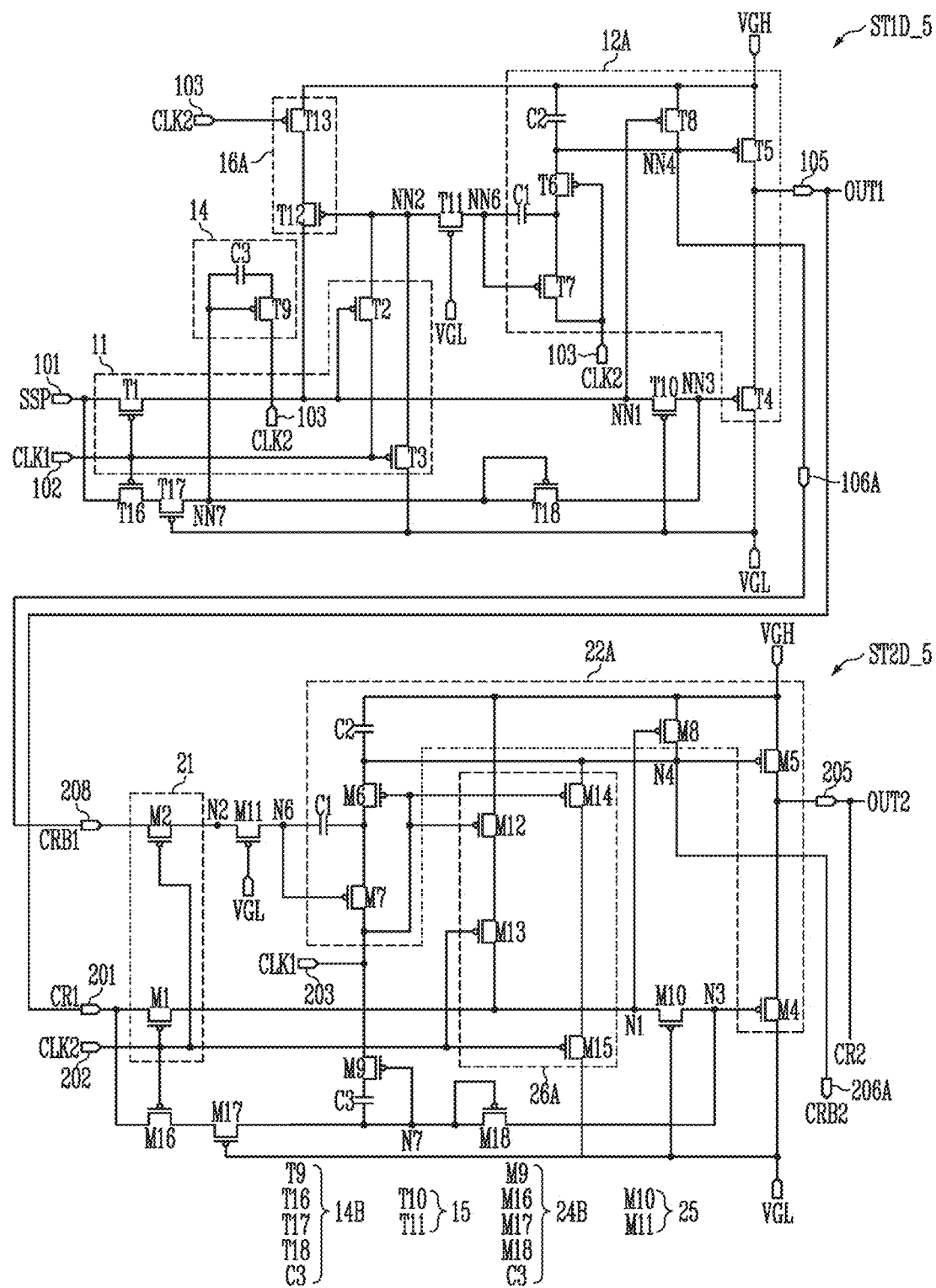
FIG. 32 is a circuit diagram illustrating another alternative embodiment of the first stage and the second stage included in the scan driver of FIG. 25.

FIG. 32 is a circuit diagram illustrating another alternative embodiment of the first stage and the second stage included in the scan driver of FIG. 25.

In FIG. 32, the same reference numerals are used for the same components as those described with reference to FIGS. 3, 17, 21, and 26, and any repetitive detailed description of such components will be omitted. In addition, the first stage ST1D_5 and the second stage ST2D_5 of FIG. 31 may have a configuration substantially the same as or similar to that of the first stage ST1D_4 and the second stage ST2D_4 of FIG. 30 except for the second output terminals 106A and 206A.

Referring to FIG. 32, in an embodiment, the second output terminal 106A of the first stage ST1D_5 may be connected to the fourth node NN4. In such an embodiment, the second output terminal 206A of the second stage ST2D_5 may be connected to the fourth node N4. Accordingly, driving similar to that of the timing diagram of FIG. 22 may be performed.

As described above, the gate driver and the display device including the gate driver according to embodiments of the disclosure may include the first stage that outputs the carry signal and the inverted carry signal based on the start pulse, and the second stage that outputs the scan signal (and/or the emission control signal) based on the carry signal and the inverted carry signal. In such embodiments, the remaining stages that are dependently connected from the second stage and sequentially output the scan signals (and/or the emission control signals) may have the same structure as the second stage.

Therefore, in such embodiments, when outputting the low level of the corresponding output signal (the carry signal, and the scan signal) of each of the second to n-th (where n is an integer greater than 2) stages, the voltage of the second node may be stably maintained at the high level.

Therefore, in such embodiments, undesired charge/discharge operations of the first capacitor may be effectively prevented during a period in which the output signal is output at the low level, and thus power consumption for cancelling the charge/discharge operations may be reduced. In such embodiments, by preventing or minimizing the change of the equivalent impedance due to the charge/discharge of the capacitor, the rising/falling speeds of the first clock signal, the second clock signal, and the output signal may be improved, and the voltage ripple may be reduced.

Accordingly, in such embodiments, the gate driver (the scan driver and/or the emission driver) may be stably applied to the high speed driving, and image quality of the display device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A gate driver comprising:
a first stage and a second stage,
wherein each of the first stage and the second stage comprises an output circuit which outputs a scan signal, a carry signal and an inverted carry signal based on a voltage of a first node and a voltage of a second node, a first input terminal, a second input terminal, a third input terminal, a first output terminal from which the scan signal and the carry signal are output, and a second output terminal from which the inverted carry signal is output, wherein the second input terminal of the first stage and the third input terminal of the second stage receive a first clock signal, and the third input terminal of the first stage and the second input terminal of the second stage receive a second clock signal,
wherein the first stage further comprises:
a first input circuit which controls the voltage of the first node thereof and the voltage of the second node thereof based on a start pulse and a signal supplied to the second input terminal of the first stage,
wherein the second stage further comprises:
a second input circuit which controls the voltage of the first node thereof and the voltage of the second node thereof based on a first carry signal and a first inverted carry signal supplied from the output circuit of the first stage, and a signal supplied to the second input terminal of the second stage, and
wherein the second stage is dependently connected to the first stage.

2. The gate driver according to claim 1, wherein the first input circuit comprises:
a first input transistor connected between the first input terminal of the first stage, to which the start pulse is supplied, and the first node of the first stage, and including a gate electrode connected to the second input terminal of the first stage;
a second input transistor connected between the second input terminal of the first stage and the second node of the first stage, and including a gate electrode connected to the first node of the first stage; and
a third input transistor connected between a first power and the second node of the first stage, and including a gate electrode connected to the second input terminal of the first stage.

3. The gate driver according to claim 2, wherein the second input circuit comprises:
a first transistor connected between the first input terminal of the second stage, to which the first carry signal is supplied, and the first node of the second stage, and including a gate electrode connected to the second input terminal of the second stage; and
a second transistor connected between an additional input terminal of the second stage to which the first inverted carry signal is supplied and the second node of the second stage, and including a gate electrode connected to the second input terminal of the second stage.

4. The gate driver according to claim 1, wherein each of the first stage and the second stage further comprises:
a control circuit which controls a low level voltage of a third node based on a signal supplied to the third input terminal; and
a stabilizing circuit electrically connected between the first or second input circuit and the output circuit including the third node and a fourth node, wherein the stabilizing circuit limits a voltage drop amount of the first node and a voltage drop amount of the second node.

5. The gate driver according to claim 4, wherein each output circuit comprises:
a fourth transistor connected between a first power and the first output terminal, and including a gate electrode connected to the third node;
a fifth transistor connected between a second power and the first output terminal, and including a gate electrode connected to the fourth node;
a sixth transistor connected between the fourth node and a fifth node, and including a gate electrode connected to the third input terminal;
a seventh transistor connected to the fifth node and the third input terminal, and including a gate electrode connected to a sixth node;
an eighth transistor connected between the second power and the fourth node, and including a gate electrode connected to the first node;
a first capacitor connected between the fifth node and the sixth node; and
a second capacitor connected between the second power and the fourth node.

6. The gate driver according to claim 5, wherein the second output terminal is connected to the fifth node.

7. The gate driver according to claim 5, wherein the second output terminal is connected to the fourth node.

8. The gate driver according to claim 5, wherein the stabilizing circuit comprises:
a tenth transistor connected between the first node and the third node, and including a gate electrode which receives a voltage of the first power; and
an eleventh transistor connected between the second node and the sixth node, and including a gate electrode which receives the voltage of the first power.

9. The gate driver according to claim 4, wherein the control circuit comprises:
a ninth transistor including a first electrode connected to the third input terminal, and a gate electrode connected to the third node; and
a third capacitor connected between a second electrode of the ninth transistor and the gate electrode of the ninth transistor.

10. The gate driver according to claim 4, wherein each of the first stage and the second stage further comprises:
an initialization circuit which supplies a voltage of a second power to the first node during an initialization period.

11. The gate driver according to claim 10, wherein the initialization circuit comprises:
a twelfth transistor connected between the second power and the first node, and including a gate electrode which receives a reset signal.

12. The gate driver according to claim 11, wherein the initialization circuit of the second stage further comprises:
a thirteenth transistor connected between the fourth node and a fourth input terminal, to which the reset signal is supplied, and including a gate electrode connected to the fourth input terminal or a first power.

13. The gate driver according to claim 10, wherein the initialization circuit of the first stage further comprises:
a twelfth transistor connected between the second power and the first node, and including a gate electrode which receives a reset signal.

14. The gate driver according to claim 13, wherein the initialization circuit of the first stage further comprises:
a thirteenth transistor connected between the twelfth transistor and the second power, and including a gate electrode connected to the third input terminal.

15. The gate driver according to claim 10, wherein the initialization circuit of the second stage comprises:
a twelfth transistor and a thirteenth transistor connected in series between the second power and the first node; and
a fourteenth transistor and a fifteenth transistor connected in series between a first power and the fourth node,
wherein a gate electrode of the twelfth transistor is connected to one of the second input terminal and the third input terminal, and a gate electrode of the thirteenth transistor is connected to the other of the second input terminal and the third input terminal, and
wherein a gate electrode of the fourteenth transistor is connected to one of ones of the second input terminal and the third input terminal, and a gate electrode of the fifteenth transistor is connected to the other of the second input terminal and the third input terminal.

16. The gate driver according to claim 10, wherein the first stage and the second stage simultaneously output the scan signal having a high level during the initialization period.

17. The gate driver according to claim 9, wherein the control circuit further comprises:
a sixteenth transistor connected between second power and the second electrode of the ninth transistor, and including a gate electrode connected to the second node.

18. The gate driver according to claim 9, wherein the control circuit further comprises:
a sixteenth transistor and a seventeenth transistor connected in series between the first input terminal and the gate electrode of the ninth transistor; and
an eighteenth transistor connected between the gate electrode of the ninth transistor and the third node, and including a gate electrode connected to the gate electrode of the ninth transistor.

19. The gate driver according to claim 18, wherein the control circuit further comprises:
a nineteenth transistor connected between second power and the second electrode of the ninth transistor, and including a gate electrode connected to the second node.

20. A display device comprising:
pixels;
a gate driver comprising a first stage and a second stage; and
a data driver which supplies data signals to the pixels through data lines,
wherein each of the first stage and the second stage comprises an output circuit which outputs a scan signal, a carry signal and an inverted carry signal based on a voltage of a first node and a voltage of a second node, a first input terminal, a second input terminal, a third input terminal, a first output terminal, from which the scan signal and the carry signal are output, and a second output terminal, from which the inverted carry signal is output, wherein the second input terminal of the first stage and the third input terminal of the second stage receive a first clock signal, and the third input terminal of the first stage and the second input terminal of the second stage receive a second clock signal,
wherein the first stage further comprises:
a first input circuit which controls the voltage of the first node thereof and the voltage of the second node thereof based on a start pulse and a signal supplied to the second input terminal of the first stage,
wherein the second stage further comprises:
a second input circuit which control the voltage of the first node thereof and the voltage of the second node thereof based on a first carry signal and a first inverted carry signal supplied from the output circuit of the first stage, and a signal supplied to the second input terminal of the second stage, and
wherein the second stage is dependently connected to the first stage.

* * * * *